(12) United States Patent
Kijima et al.

(10) Patent No.: US 7,205,256 B2
(45) Date of Patent: Apr. 17, 2007

(54) OXIDE MATERIAL, METHOD FOR PREPARING OXIDE THIN FILM AND ELEMENT USING SAID MATERIAL

(75) Inventors: Takeshi Kijima, Saitama (JP); Hiroshi Ishiwara, Tokyo (JP)

(73) Assignees: Sharp Kabushiki Kaisha, Osaka (JP); Japan represented by President of Tokyo Institute of Technology, Tokyo (JP)

( * ) Notice: Subject to any disclaimer, the term of this patent is extended or adjusted under 35 U.S.C. 154(b) by 372 days.

(21) Appl. No.: 10/399,576

(22) PCT Filed: Sep. 3, 2001

(86) PCT No.: PCT/JP01/07619

§ 371 (c)(1),
(2), (4) Date: Aug. 11, 2003

(87) PCT Pub. No.: WO02/32809

PCT Pub. Date: Apr. 25, 2002

(65) Prior Publication Data

US 2004/0136891 A1 Jul. 15, 2004

(30) Foreign Application Priority Data

Oct. 17, 2000 (JP) .............................. 2000-316910
Feb. 6, 2001 (JP) .............................. 2001-030170

(51) Int. Cl.
*B01J 21/06* (2006.01)
*B01J 32/00* (2006.01)
*B32B 18/00* (2006.01)
*H01L 29/00* (2006.01)

(52) U.S. Cl. .................... 502/232; 502/240; 502/241; 502/242; 502/243; 502/246; 502/250; 502/254; 502/258; 502/263; 502/525; 502/514; 502/439; 252/518.1; 252/521.3; 428/697; 428/702; 438/3; 257/295; 257/310

(58) Field of Classification Search ................ 502/300, 502/302, 303, 305, 324, 325, 340, 344, 349, 502/353, 355, 525, 514, 439, 232, 240, 241, 502/242, 243, 246, 250, 254, 258, 263; 252/518.1, 252/521.3; 428/697, 702; 438/3; 257/295, 257/310; 501/137, 138, 139
See application file for complete search history.

(56) References Cited

U.S. PATENT DOCUMENTS 3,615,876 A * 10/1971 Cowley et al. ............... 438/3

| 3,997,479 | A | * | 12/1976 | Shimojo et al. | ....... 252/519.12 |
|---|---|---|---|---|---|
| 4,384,989 | A | * | 5/1983 | Kamigaito et al. | ......... 252/516 |
| 4,863,883 | A | * | 9/1989 | Menashi et al. | ............. 501/138 |
| 5,571,495 | A | | 11/1996 | Iijima et al. | |
| 5,900,223 | A | | 5/1999 | Matijevic et al. | |
| 6,495,878 | B1 | * | 12/2002 | Hayashi et al. | ............. 257/310 |
| 6,756,621 | B2 | * | 6/2004 | Nasu et al. | .................. 257/295 |
| 2002/0035035 | A1 | * | 3/2002 | Kirchnerova et al. | ....... 502/324 |
| 2005/0151177 | A1 | * | 7/2005 | Miyazawa et al. | .......... 257/295 |

FOREIGN PATENT DOCUMENTS

| DE | 33 19 979 A1 * | 12/1983 |
|---|---|---|
| DE | 32 34 224 A1 * | 3/1984 |
| EP | 0 641 740 A1 * | 3/1995 |
| GB | 1 331 551 A | 9/1973 |
| JP | 09-148538 | 6/1997 |
| JP | 09-208305 | 8/1997 |

OTHER PUBLICATIONS

N.M. Olekjnovich, et al., "Structural and Dielectric Properties of PbGeO$_3$ Metastable Solid Solutions with Pervskite Structure," Inorgunle Materials, vol. 32, No. 3, 1998, pp. 331-335.
Armstrong et al., "Bismuth Titanate Solid Solutions," Mat. Res. Bull. 7:1025-1034 (1972).

* cited by examiner

*Primary Examiner*—Timothy C. Vanoy
(74) *Attorney, Agent, or Firm*—Edwards Angell Palmer & Dodge LLP; David G. Conlin; Mark D. Russett

(57) ABSTRACT

An oxide material characterized by that it has a perovskite structure comprising an oxide represented by $ABO_3$, $(Bi_2O_2)^{2+} (A_{m-1}B_mO_{3m+1})^{2-}$ wherein A represents one kind or two or more kinds of ions selected from the group consisting of $Li^+$, $Na^+$, $K^+$, $Pb^{2+}$, $Ca^{2+}$, $Sr^{2+}$, $Ba^{2+}$, $Bi^{3+}$, $Y^{3+}$, $Mn^{3+}$ and $La^{3+}$, B represents one kind or two or more kinds of ions selected from the group consisting of $Ru^{3+}$, $Fe^{3+}$, $Ti^{4+}$, $Zr^{4+}$, $Cu^{4+}$, $Nb^{5+}$, $Ta^{5+}$, $V^{5+}$, $W^{6+}$ and $Mo^{6+}$, and m represents a natural number of 1 or more, $LnBa_2Cu_3O_7$, $Z_2Ba_2Ca_{n-1}Cu_nO_{2n+4}$ or $ZBa_2Ca_{n-1}Cu_nO_{2n+3}$, wherein Ln represents one kind or two or more kinds of ions selected from the group consisting of Y, La, Ce, Pr, Nd, Pm, Sm, Eu, Gd, Tb, Dy, Ho, Er, Tm, Yb and Lu, Z represents one kind or two or more kinds of ions selected from the group consisting of Bi, Tl and Hg, and n represents a natural number of from 1 to 5; and a catalytic substance containing one or more kinds of elements selected from the group consisting of Si, Ge and Sn.

10 Claims, 43 Drawing Sheets

Fig. 3
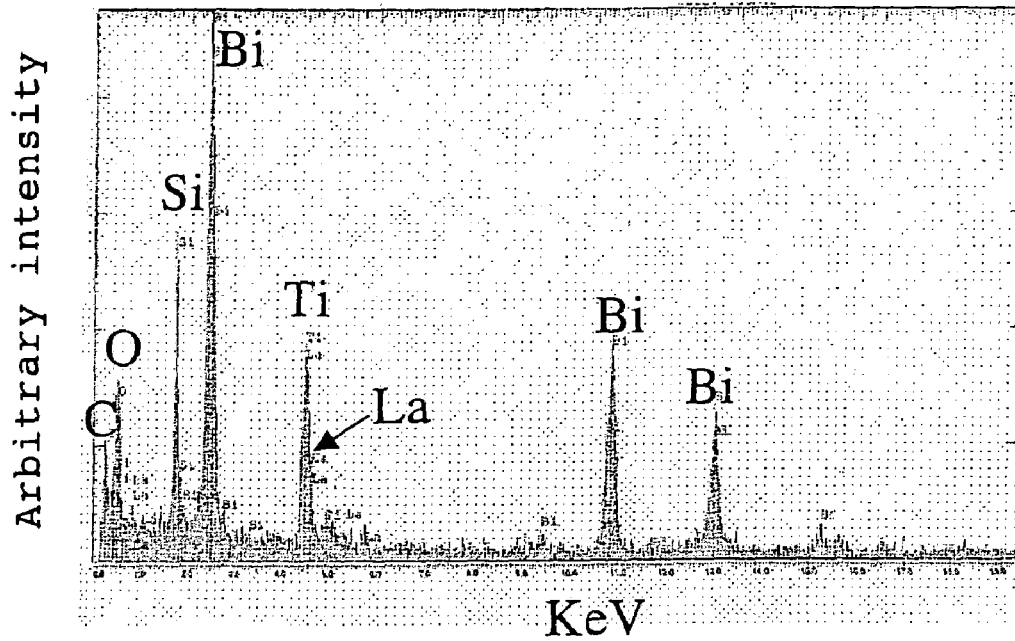
(a) BIT-BSO
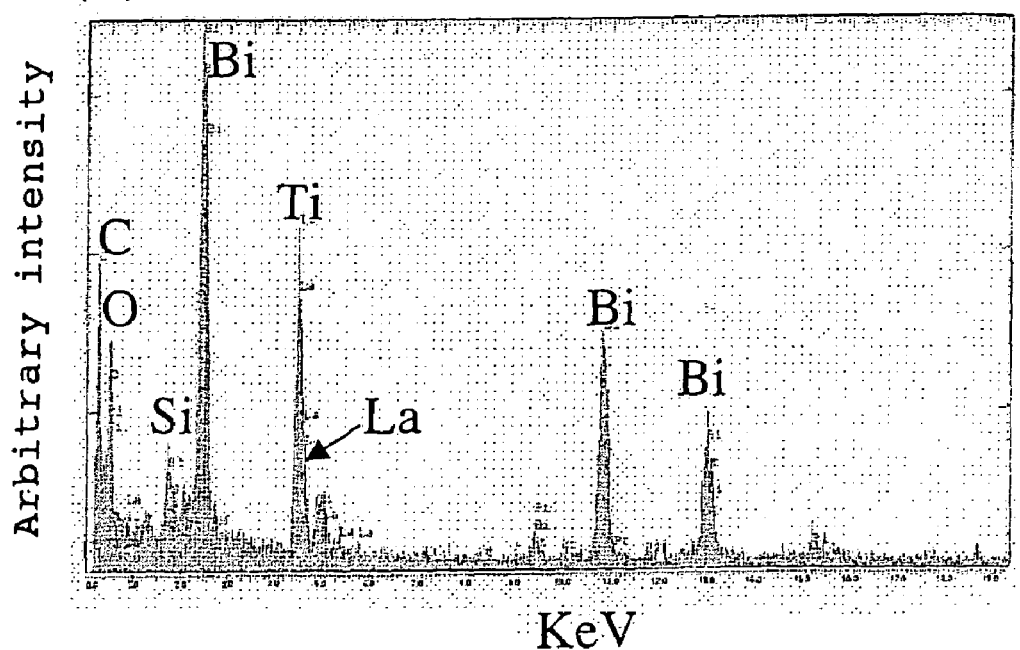
(b) BIT

A: −O−M1−O−M1−O− (M1 represents a cation constituting catalytic substance)

B: −O−M2−O−M2−O− (M2 represents a cation constituting catalytically active substance)

Fig. 6
(a)
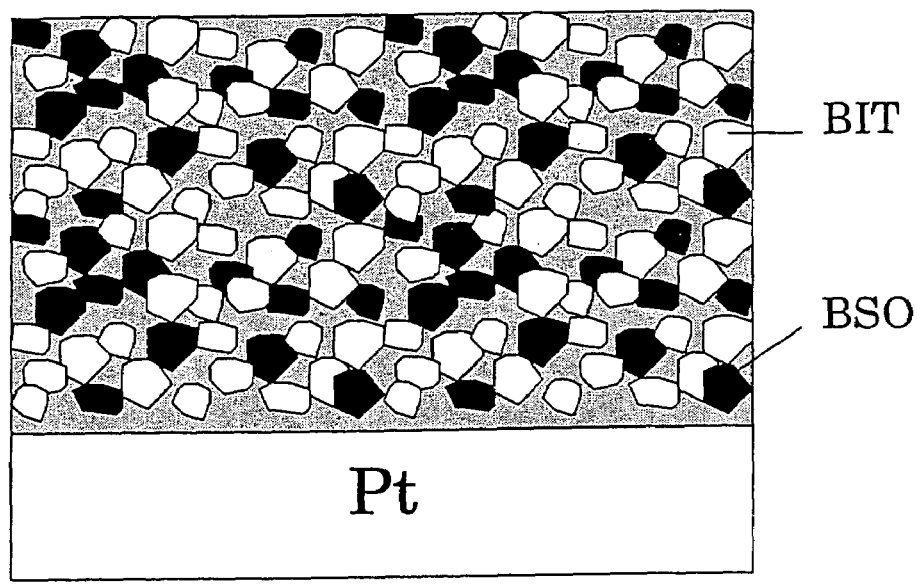
(b)
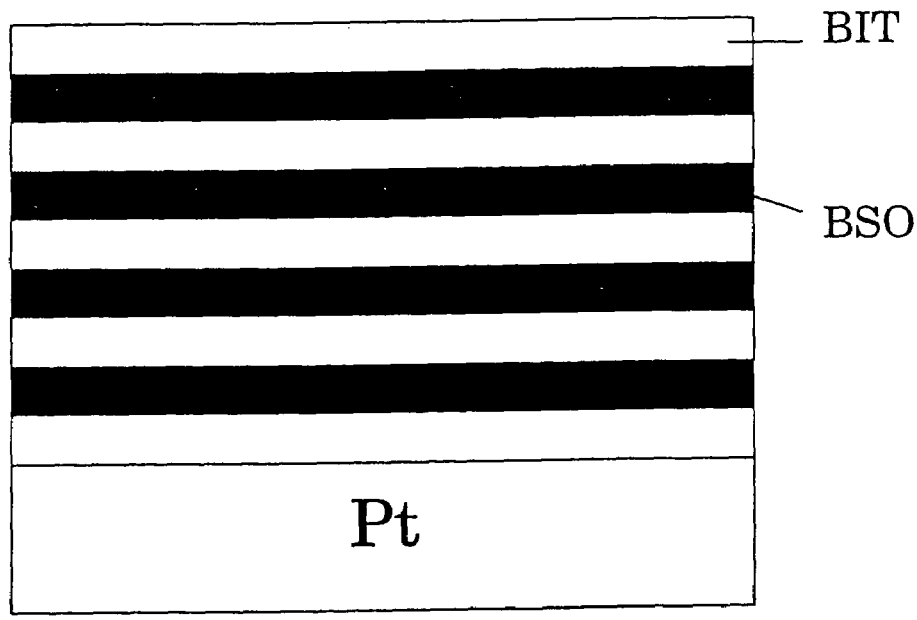

Fig. 15
(a)
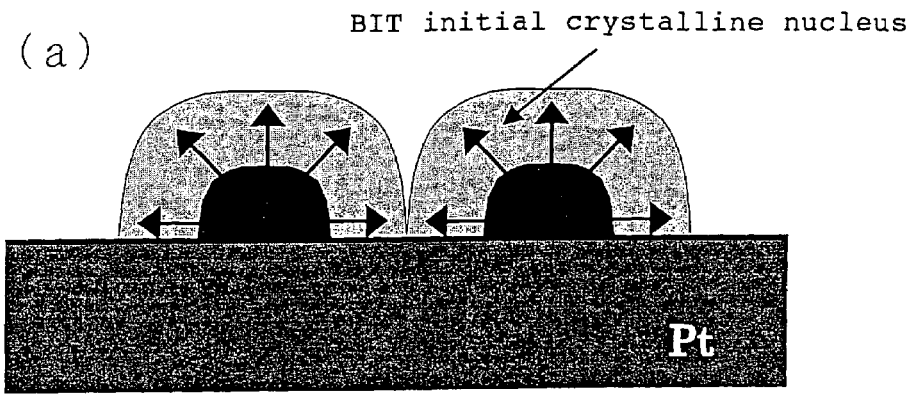
(b)
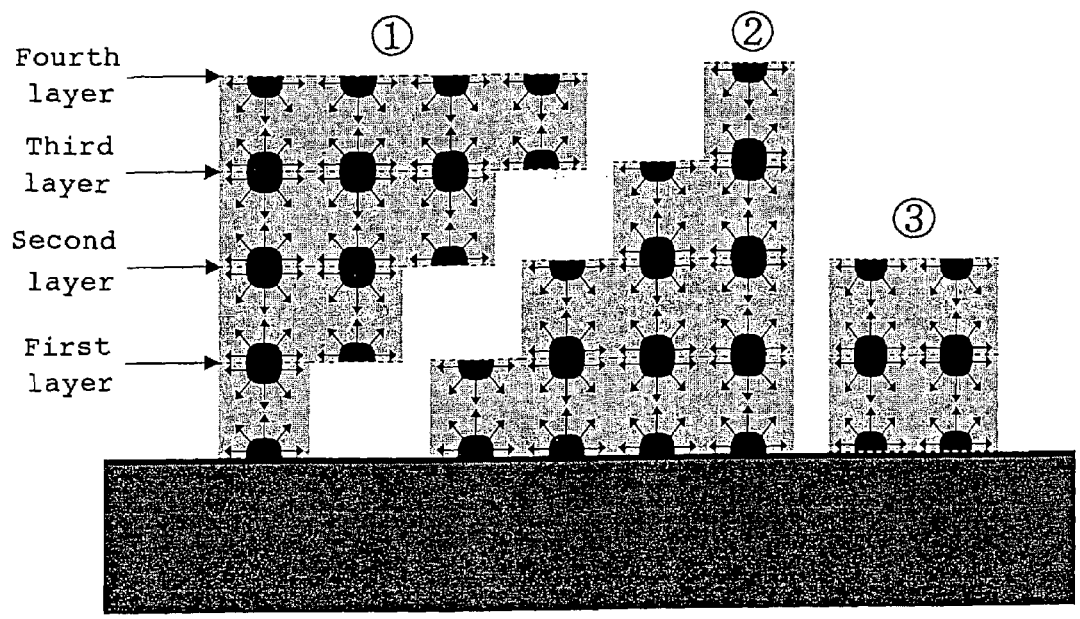

Transition
temperature : 675°C
Lattice constant :
  a=5.411
  b=5.448
  c=32.83

Spontaneous
polarization :
  a axis direction
    Ps=50 $\mu C/cm^2$
    Ec=50kV/cm c axis direction
    Ps=4 $\mu C/cm^2$
    Ec=4kV/cm ○ :Bi  ● :Ti  ◉ :O SiO₂ layer Bi₂O₃ layer ○ :Bi ⊙ :Si ● :O Lattice
constant : a=5.4680, b=5.3148, c=15.195

BIT

BSO

BIT

○ :Bi  ● :Ti or Si  ⊙ :Si  ◍ :O

Fig. 26
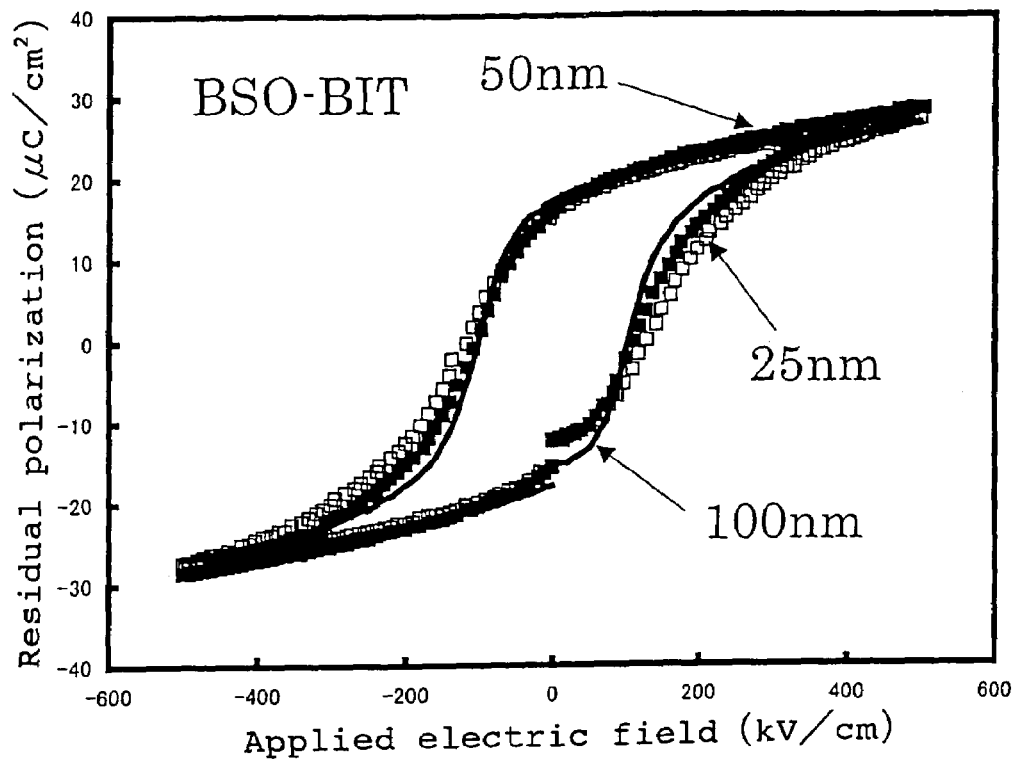
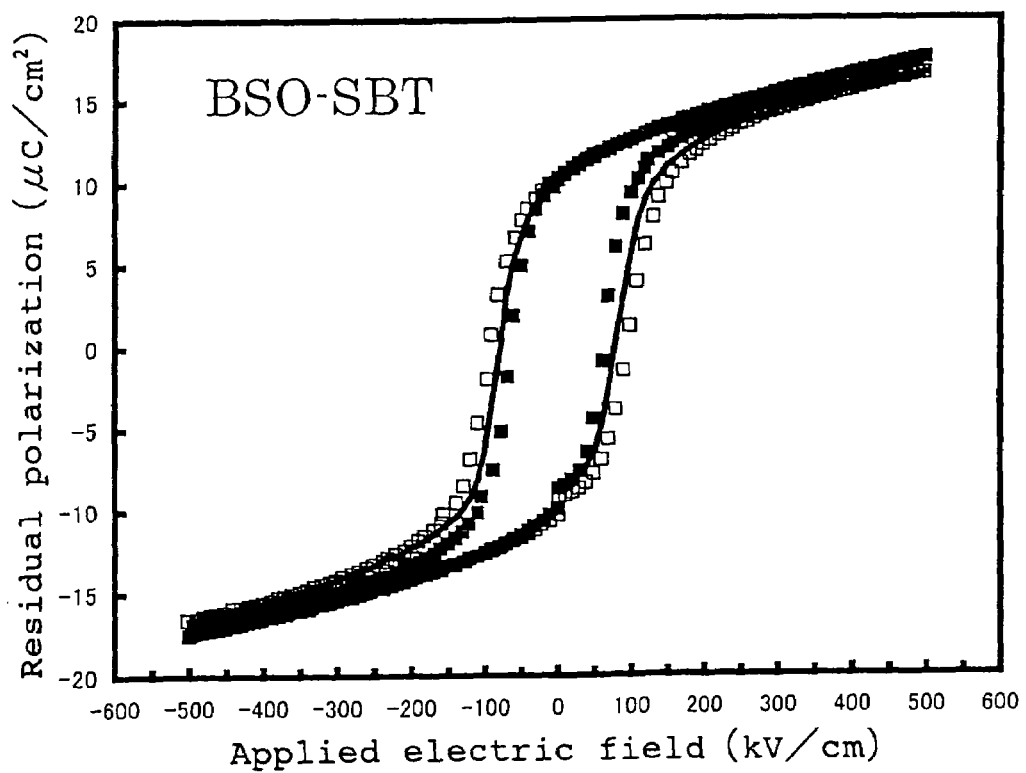

Fig. 27
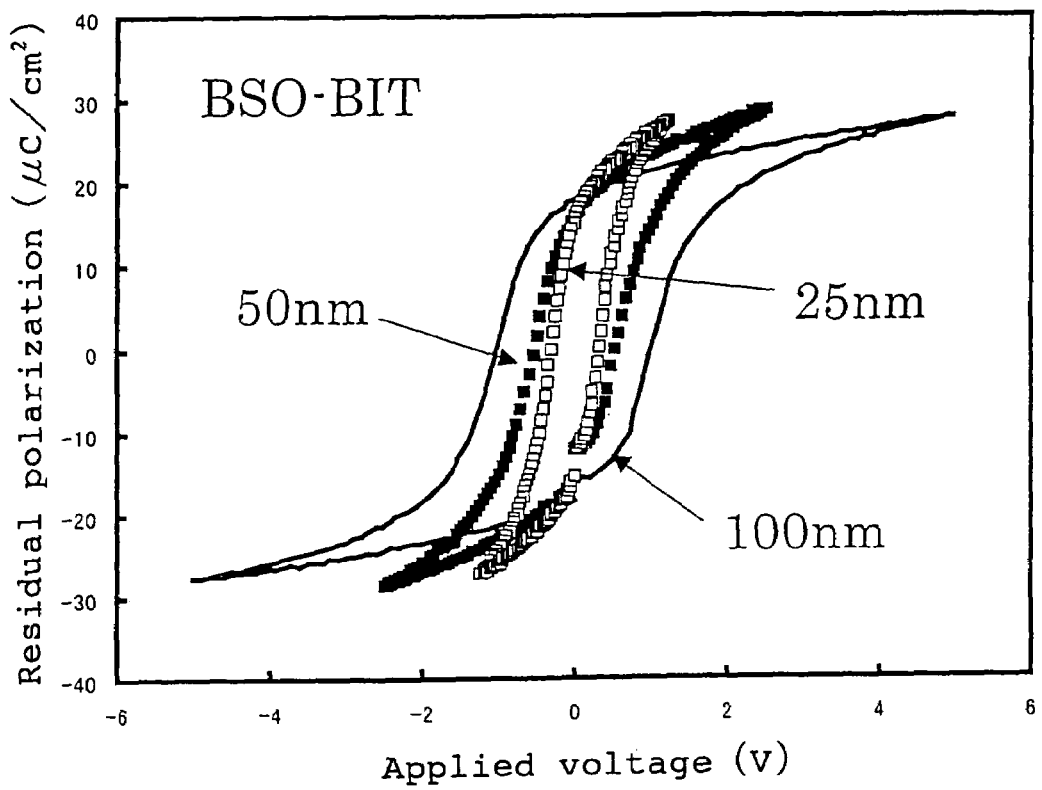
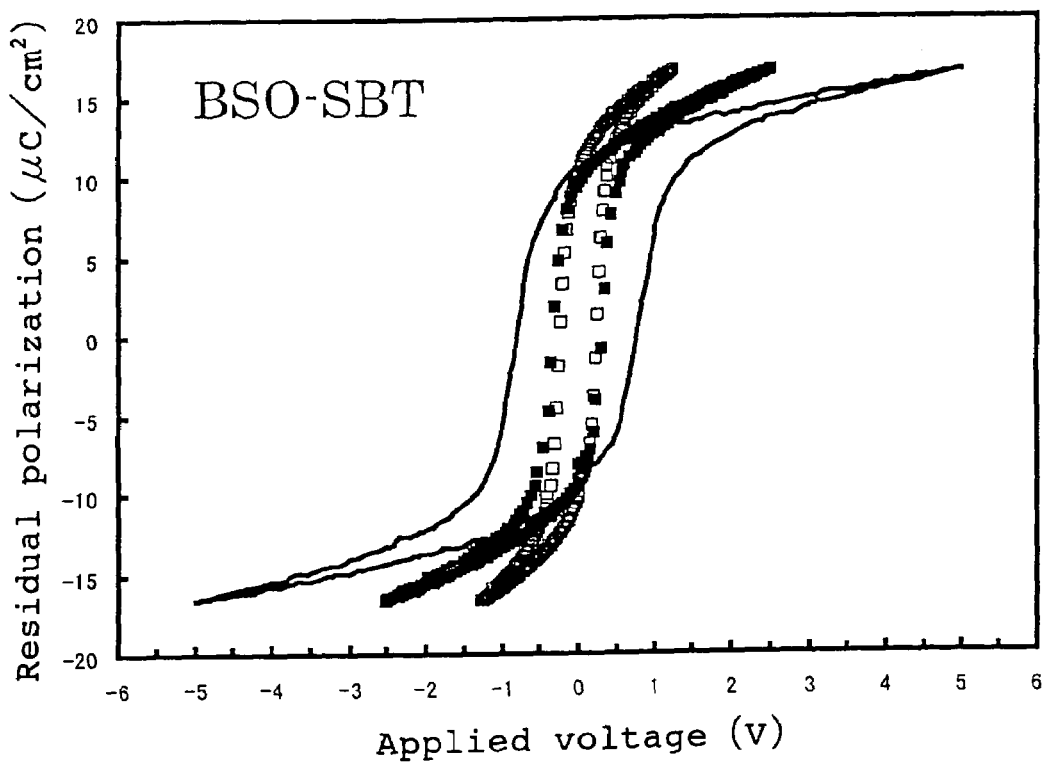

Fig. 33  Ferroelectric characteristics of solid solution thin film with $Bi_4Ti_3O_{12}$ Ferroelectric characteristics of solid solution thin film with SrBi$_2$Ta$_2$O$_9$ Fig. 35 — Ferroelectric characteristics of solid solution thin film with $PbZr_{0.6}Ti_{0.4}O_3$ Fig. 38
(a)
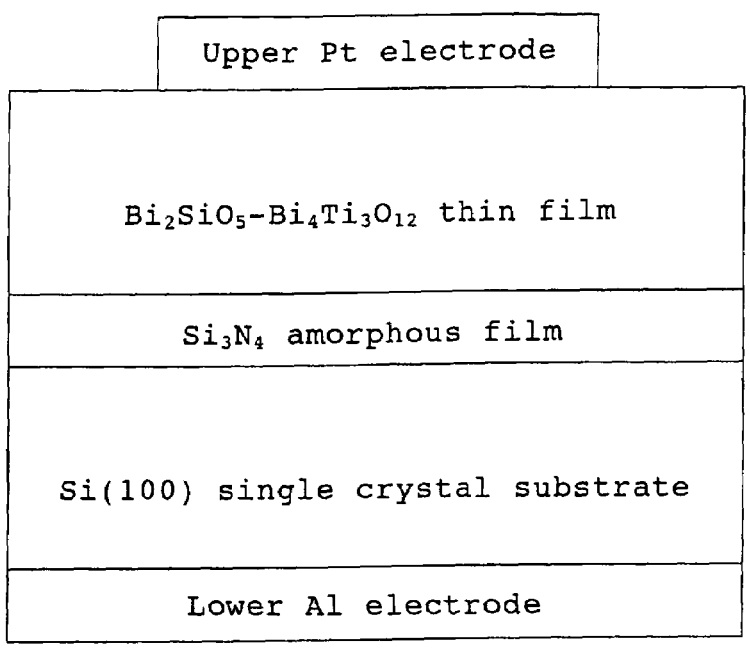
(b)
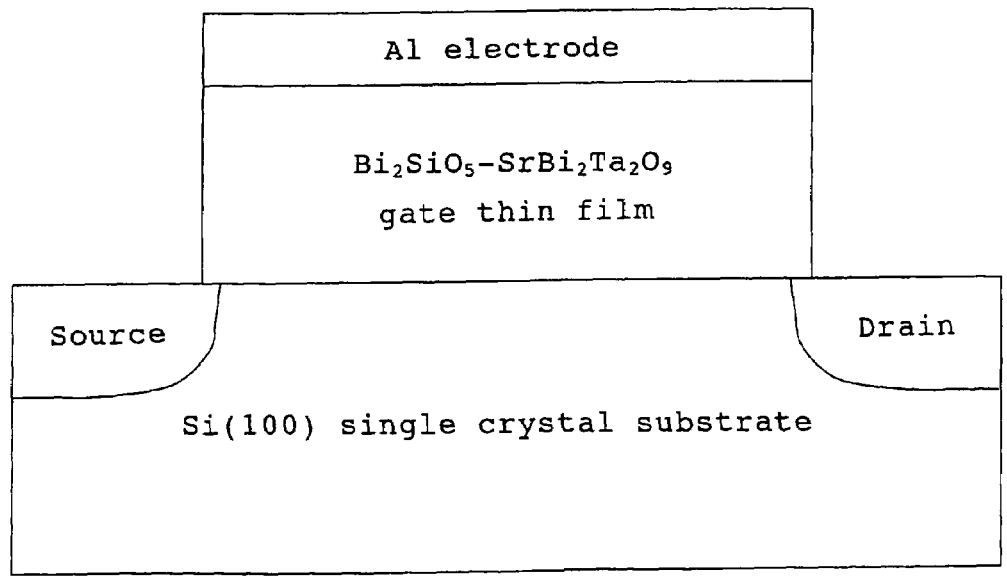

OXIDE MATERIAL, METHOD FOR PREPARING OXIDE THIN FILM AND ELEMENT USING SAID MATERIAL

TECHNICAL FIELD

The present invention relates to an oxide material, a process for producing an oxide thin film, and an element using the material, and more specifically, it relates to an oxide material that can be preferably used for a ferroelectric memory, which is a nonvolatile memory, a process for producing an oxide thin film, and an element using the material.

BACKGROUND ART

A ferroelectric memory is receiving attention associated with progress of portable terminals in recent years, such as a portable telephone, a notebook computer, a personal digital assistant (PDA) and the like. This is because a ferroelectric memory is advantageous particularly for a multimedia equipment owing to a high writing speed and realization of a large capacity, and no electric power is necessary for maintaining data to realize low electric power consumption.

A ferroelectric memory utilizes polarization characteristics of a ferroelectric material. The direction of polarization is arbitrarily controlled with an external electric field to maintain binary data, i.e., "0" and "1", and the data can be maintained even upon turning off power.

However, only products having a small capacity of from 4 to 256 kbit are commercialized. It is the current situation that application of a ferroelectric memory to a large capacity product in Mbit level is hindered by the problem of the ferroelectric material itself.

The lamellar structure ferroelectric material ($BiA_{m-1}B_mO_{3m+3}$) such as plumbum zirconate titanate (PZT; $PbZr_xTi_{1-x}O_3$) perovskite ferroelectric material ($ABO_3$), strontium bismuth tantalate (SBT; $SrBi_2Ta_2O_9$) and bismuth titanate (BIT; $Bi_4Ti_3O_{12}$) highlighted under donation of La, which are currently used, are necessarily baked at a high temperature of about from 600 to 800° C. for a long period of time (T. Nakamura, Technical Research Report of Institute of Electronics, Information and Communication Engineers, ED97-208 (1998), p. 25–32; T. Eshita, et al., Technical Research Report of Institute of Electronics, Information and Communication Engineers, ED98-242 (1999), p. 21–26; and M. Yamaguchi, "Studies on Formation and Evaluation of Bismuth Titanate Thin Film on Silicon Substrate", Academic Dissertation of Shibaura Institute of Technology (1998), p. 39–47). Such crystallization at a high temperature for a long period of time is necessary not only for derives sufficient characteristics of the ferroelectric material itself, but also for compensating, as much as possible, deterioration in ferroelectric characteristics during the production process in the case where the ferroelectric material is used as an element, for example, $SiO_2$ passivation, capacitor processing and the like, which will be described later.

Therefore, in order to form a ferroelectric memory by combining a ferroelectric capacitor using the ferroelectric material with a semiconductor element, such an artifice or the like is necessary that the ferroelectric capacitor and the transistor are formed separately due to the high crystallization temperature for forming the ferroelectric material. Accordingly, high integration of a ferroelectric memory is difficult because of the complication of the production process, restriction in electrode material used in combination, and the like.

In general, a ferroelectric material thin film is used in a ferroelectric memory, and the formation thereof is attained by using a sol-gel process owing to the simplicity and excellent mass-productivity except for step covering property.

In the sol-gel process, a sol-gel raw material solution having a highly volatile component added in an excess amount of about 10% is used in order to improve the crystallinity and to suppress at minimum deviation of the film composition after the film formation.

However, the excess addition of lead and bismuth components sometimes brings about scattering in film composition distribution caused in the ferroelectric thin film finally formed. Furthermore, the compositional deviation in the film accelerates formation of a hetero-phase (such as BIT and a pyrochlore phase and a fluorite phase of SBT, and the like), and makes difficult to obtain the objective ferroelectric single layer.

In the production of a ferroelectric memory, an electrode material that has sufficient durability against the high temperature baking step because of the high backing temperature for the crystallization of the ferroelectric material described in the foregoing.

For example, it has been said that PZT, which is a solid solution of a $PbZrO_3$ antiferroelectric material and a $PbTiO_3$ ferroelectric material, provides a small load on an electrode material. However, it is said that a baking temperature of from 600 to 750° C. is necessary to ensure a residual polarization value that is practically necessary (T. Nakamura, Technical Research Report of Institute of Electronics, Information and Communication Engineers, ED97-208 (1998), p. 25–32), and thus the load on the electrode material or the like is not small. That is, in the case where a PZT thin film is formed on a standard Pt electrode, so-called film fatigue, i.e., precipitous deterioration of the polarization value, occurs due to repeated inversion.

Therefore, it is necessary to use a complicated complex electrode with an oxide series electrode that is excellent in controllability of fatigue of an expensive ferroelectric material, such as Ir, $IrO_2$ and the like, which is difficult to be processed, or an oxide electrode, such as $Pt/IrO_2$ and the like.

On the other hand, SBT ($SrBi_2Ta_2O_9$: m=2) which is a bismuth lamellar structure ferroelectric material is receiving attention as a material that is free of fatigue upon inversion repeated $10^{12}$ times on a Pt electrode and is being earnestly studied for practical application.

However, upon forming SBT into a thin film, coarse grains are aggregated at a low density to obtain only a deteriorated surface morphology (K. Aizawa, et al., Jpn. J. Appl. Phys., vol. 39, p. 1191–1193 (2000)), and high integration (thin film formation) has not yet been realized at the current situation.

SBT is considerably good in P-E hysteresis form but has a low residual polarization value of from 7 to 10 $\mu C/cm^2$, and thus, when it is tried to be used in a memory of reading a capacitance of a ferroelectric capacitor having been currently commercialized, there is no margin for polarization characteristics, and sufficient characteristics for practical application have not yet been obtained.

Furthermore, SBT is difficult to lower the temperature for crystallization. Specifically, in order to form SBT into a thin film, such methods have been attempted as high temperature baking at 800° C., a long time baking of as much as 5 hours at a relatively low temperature of about 650° C. (Y. Sawada, et la., Technical Research Report of Institute of Electronics, Information and Communication Engineers, ED98-240 (1999), p. 9–14), and two-step baking combining them (S. Hayashi, et al., Technical Research Report of Institute of Electronics, Information and Communication Engineers, ED98-241 (1999), p. 15–19). However, the load on the electrode material due to thermal history is large beyond comparison to PZT, and there is a considerably large problem upon application of the material to practical use.

In recent years, such a method is proposed that the crystallization (baking) temperature is lowered by doping with La, and BIT ($Bi_4Ti_3O_{12}$: m=3) is receiving attention as a material used for the method. The material contains a bismuth lamellar structure, has good fatigue characteristics, has a high transition temperature (Tc) of 675° C., and exhibits considerably stable material characteristics at an ordinary temperature, as similar to SBT.

However, the material requires thermal history at 650° C. for 1 hour. Therefore, the load on the electrode material is still large (B. H. Park, B. S. Kang, S. D. Bu, T. W. Noh, J. Lee and W. Jo, Nature, vol. 401, p. 682 (1999)).

The largest problem of the ferroelectric material is that giant particles are liable to be formed (T. Nakamura, "Studies on Ferroelectric Memory having Floating Gate Structure", Academic Dissertation of Kyoto University (1998), p. 118–140) and it is significantly difficult to form into a thin film, as similar to SBT.

In order to attain high integration and low voltage driving of a ferroelectric thin film element, it is necessary to form the ferroelectric material itself into an extremely thin film.

However, a thin film of 100 nm or less cannot be formed with good reproducibility due to the surface c of the ferroelectric material. Further, even though it can be formed to have a thickness of 100 nm or less, the ferroelectric characteristics are quickly deteriorated (K. Aoki, et al., Technical Research Report of Institute of Electronics, Information and Communication Engineers, ED98-245 (1999), p. 43–49).

It is considered that the surface morphology deterioration of the ferroelectric thin film is caused because the crystallization occurs from a lower electrode (for example, a platinum electrode), i.e., from the lowermost surface of the ferroelectric thin film, irrespective to the film forming method, such as the sol-gel process and the MOCVD process, so as to provide a form having grains convex upward aggregated. Furthermore, although the compatibility between the lower electrode material and the ferroelectric material is poor, the crystallization of the ferroelectric material depends only on the catalytic feature of the platinum electrode, and therefore, the density of initial crystallization nucleus formation of the ferroelectric material is low. Therefore, when the ferroelectric material is formed into a thin film of 100 nm or less, the ferroelectric thin film grows in an island form but not covering the entire lower electrode. As a result, considerably coarse surface morphology is obtained, and the resulting ferroelectric thin film increases the leakage electric current density. It has been known that a ferroelectric thin film derived from an organic metallic material as a starting material has a large amount of carbon remaining, and it is also one factor of increase in leakage electric current density.

Moreover, the ferroelectric material is deteriorated in ferroelectric characteristics in a reducing atmosphere (Y. Shimamoto, et al., Appl. Phys. Lett., vol. 70, p. 1–2 (1997)).

For example, in the case where the ferroelectric material is used as a capacitor, $SiO_2$ passivation using ozone TEOS or the like is generally carried out as a protective film of the ferroelectric capacitor. At this time, the ferroelectric capacitor having a platinum upper electrode formed is exposed to a hydrogen atmosphere. Therefore, hydrogen activated by the catalytic function of the platinum upper electrode reduces the ferroelectric material to cause structural breakage of the ferroelectric material, and as a result, the ferroelectric characteristics are greatly deteriorated.

It is considered that the reasons therefor are that the ferroelectric material is a material having a strong ionic bonding property (while it is said that an ionic bond is a strong bond, it is considerably weak against attack by ions), and the effective area receiving attack by the deteriorated surface morphology is large.

Accordingly, in order to restore the characteristics of the ferroelectric material suffering the structural breakage, re-oxidation of the ferroelectric material is carried out, for example, it is again baked in an oxygen atmosphere, after the $SiO_2$ passivation.

However, the oxidation applies unnecessary thermal history to the element, and moreover, the ferroelectric characteristics once deteriorated cannot be completely restored by the re-oxidation.

Under the current circumstances, accordingly, there are various problems, such as (1) the excess addition of a highly volatile component, such as lead, bismuth and the like, (2) the difficulty in obtaining a ferroelectric single phase, (3) the high crystallizing temperature, (4) the presence of a large amount of carbon residue in the film, (5) the difficulty in forming a thin film of 100 nm, (6) the decomposition under a reducing atmosphere, such as hydrogen or the like, and the like problems, although various kinds of ferroelectric materials have been studies, and thus high integration of ferroelectric thin film elements has not yet been realized.

PZT, a representative perovskite ferroelectric material ($ABO_3$), causes polarization inversion fatigue on a conventional platinum electrode, and SBT and BIT, a bismuth lamellar structure ferroelectric material ($BiA_{m-1}B_mO_{3m+3}$), are difficult to be formed into a thin film due to the deteriorated surface morphology. That is, the ferroelectric materials that are expected to be applied to a memory element under current situation involve respective problems.

The problems are the case not only in the ferroelectric material, but also in a $SrRuO_3$ perovskite electrode material and a perovskite oxide material, such as $(Ba, Sr)TiO_3$, $SiTiO_3$ and the like, which is expected as a high dielectric constant gate oxide film for a next-generation DRAM.

DISCLOSURE OF THE INVENTION

The invention provides an oxide material which is a solid solution of a perovskite or perovskite lamellar structure oxide having dissolved therein a catalytic substance containing one or more kinds of IV group elements selected from the group consisting of Si, Ge and Sn.

Also, the invention provides a method for produing an oxide material which comprises: mixing a gel solution for forming a perovskite or lamellar perovskite structure oxide formed by mixing alkoxides or organic acid salts of two or more kinds of metals selected from the group consisting of Li, Na, K, Pb, Ca, Sr, Ba, Bi, La, Ru, Fe, Ti, Zr, Cu, Nb, Ta, V, W and Mo, with a gel solution for forming a catalytic substance formed by mixing alkoxides or organic acide salts of one or more kinds of metals selected from the group consisting of Ca, Ba, Pb, Zn, Sr, Mg, Fe, Fe, B, Al, In, Y, Sc, Sb, Cr, Bi, Ga, Cu, Mn, Zr, Ti, Mo, W, V, La, Ce, Pr, Nd, Pm, Sm, Eu, Gd, Tb, Dy, Ho, Er, Tm, Yb and Lu, and one or more kinds of IV group metals selected from the group consisting of Si, Ge and Sn, in an anhydrous state; and coating and calcinating the resulting mixture on a substrate.

Further, according to the invention, it provides a mixed anhydrous solution for forming a complex oxide material comprising a polycondensation product for forming a perovskite or perovskite lamellar structure oxide material represented by $ABO_3$, $(Bi_2O_2)^{2+}(A_{m-1}B_mO_{3m+1})^{2-}$, wherein A represents one kind or two or more kinds of ions selected from the group consisting of $Li^+$, $Na^+$, $K^+$, $Pb^{2+}$, $Ca^{2+}$, $Sr^{2+}$, $Ba^{2+}$, $Bi^{3+}$, $Y^{3+}$, $Mn^{3+}$ and $La^{3+}$, B represents one kind or two or more kinds of ions selected from the group consisting of $Ru^{3+}$, $Fe^{3+}$, $Ti^{4+}$, $Zr^{4+}$, $Cu^{4+}$, $Nb^{5+}$, $Ta^{5+}$, $V^{5+}$, $W^{6+}$ and $Mo^{6+}$, and m represents a natural number of 1 or more, $LnBa_2Cu_3O_7$, $Z_2Ba_2Ca_{n-1}Cu_nO_{2n+4}$ or $ZBa_2Ca_{n-1}Cu_nO_{2n+3}$, wherein Ln represents one kind or two or more kinds of ions selected from the group consisting of Y, La, Ce, Pr, Nd, Pm, Sm, Eu, Gd, Tb, Dy, Ho, Er, Tm, Yb and Lu, Z represents one kind or two or more kinds of ions selected from the group consisting of Bi, Tl and Hg, and n represents a natural number of from 1 to 5, one or more kinds of oxides selected from the group consisting of CaO, BaO, PbO, ZnO, SrO, MgO, FeO, $Fe_2O_3$, $B_2O_3$, $Al_2O_3$, $In_2O_3$, $Y_2O_3$, $Sc_2O_3$, $Sb_2O_3$, $Cr_2O_3$, $Bi_2O_3$, $Ga_2O_3$, CuO, $MnO_2$, $ZrO_2$, $TiO_2$, $MoO_3$, $WO_3$, $V_2O_5$ and a lantanoid oxide; and one or more kinds of IV group metallic oxides selected from the group consisting of $SiO_2$, $GeO_2$ and $SnO_2$.

Also, the invention provides a substrate on which an electroconductive material film and the preceding oxide material thereon are formed, and an element in which an upper electrode is formed on the preceding substrate, or a semiconductor element in which the preceding oxide material film and an electroconductive material film are formed on a semiconductor substrate and further a pair of impurity diffusion layers are located on both sides of the preceding electroconductive material film and on the preceding semiconductor substrate surface.

BRIEF DESCRIPTION OF THE DRAWINGS

FIG. 3 is a diagram showing the EDX patterns of the BIT—BSO mixed solution and the BIT solution.

FIG. 6 is (a) a diagram showing the state in the case where the BIT—BSO mixed solution is coated on a platinum electrode, and (b) a diagram showing the state in the case where the BSO solution and the BIT solution are alternately coated.

FIG. 15 is a diagram showing the crystallization process of $Bi_4Ti_3O_{12}$ and $Bi_2SiO_5$-added $Bi_4Ti_3O_{12}$ (R=0.4) according to the invention.

FIG. 26 is a diagram showing the P-E hysteresis characteristics of BSO-added BIT and BSO-added SBT having a film thickness of from 25 to 100 nm according to the invention, and showing an applied electric field at an axis of abscissa.

FIG. 27 is a diagram showing the P-E hysteresis characteristics of LSO-added BIT and LSO-added SBT having a film thickness of from 25 to 100 nm according to the invention, and showing an applied voltage at an axis of abscissa.

FIG. 38 is a schematic cross sectional view showing an element using the oxide material according to the invention.

BEST MODE FOR CARRYING OUT THE INVENTION

Figure 1:
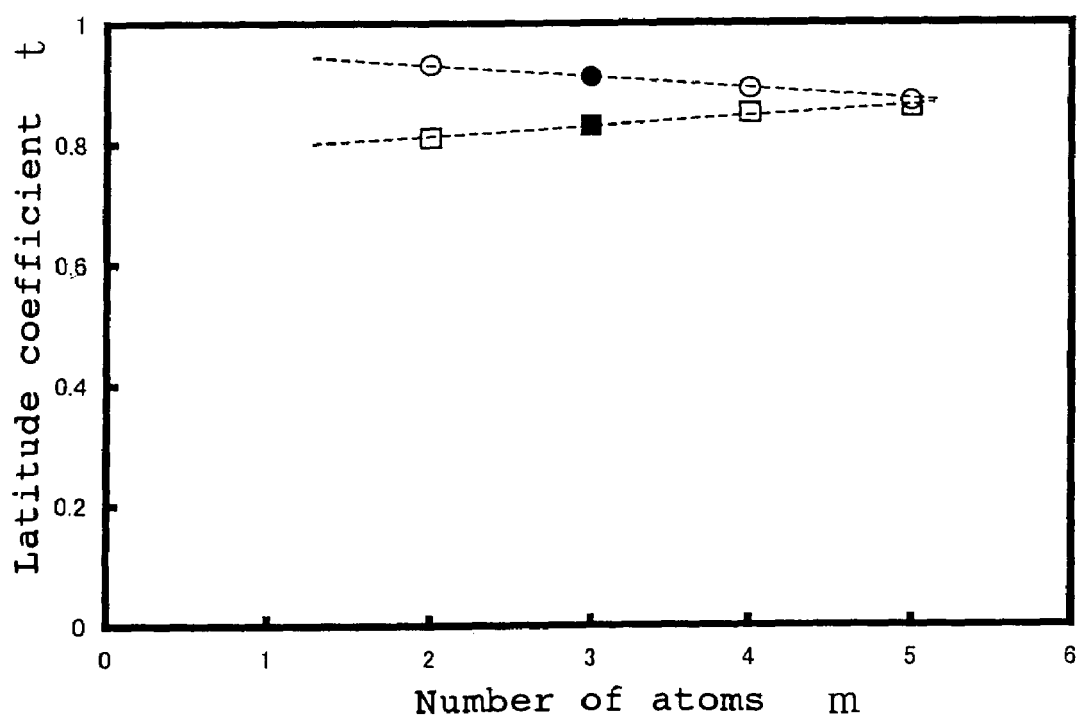
FIG. 1 is a graph showing the relationship between the latitude coefficient and the number of atoms.

The oxide material of the invention contains a solid solution of a perovskite or perovskite lamellar structure oxide having dissolved therein a catalytic substance containing at least one kind of a IV Group element selected from the group consisting of Si, Ge and Sn. According to the constitution, the characteristics inherent to the perovskite or perovskite lamellar structure oxide can be maintained or improved, and at the same time, in particular, crystallization at a low temperature can be realized.

In the invention, the perovskite or perovskite lamellar structure oxide includes compounds having various characteristics, such as ferroelectric materials, superconductive oxides and the like, which are mainly ascribed to the crystalline structure thereof. Examples thereof include compounds represented by general formulae, such as $ABO_3$, $(Bi_2O_2)^{2+}(A_{m-1}B_mO_{3m+1})^{2-}$, $LnBa_2Cu_3O_7$, $Z_2Ba_2Ca_{n-1}Cu_nO_{2n+4}$, $ZBa_2Ca_{n-1}Cu_nO_{2n+3}$ and the like. In the formulae, A represents one kind or two or more kinds of ions selected from the group consisting of $Li^+$, $Na^+$, $K^+$, $Pb^{2+}$, $Ca^{2+}$, $Sr^{2+}$, $Ba^{2+}$, $Bi^{3+}$, $Y^{3+}$, $Mn^{3+}$ and $La^{3+}$, B represents one kind or two or more kinds of ions selected from the group consisting of $Ru^{3+}$, $Fe^{3+}$, $Ti^{4+}$, $Zr^{4+}$, $Cu^{4+}$, $Nb^{5+}$, $Ta^{5+}$, $V^{5+}$, $W^{6+}$ and $Mo^{6+}$, Ln represents one kind or two or more kinds of ions selected from the group consisting of Y, La, Ce, Pr, Nd, Pm, Sm, Eu, Gd, Tb, Dy, Ho, Er, Tm, Yb and Lu, Z represents one kind or two or more kinds of ions selected from the group consisting of Bi, Tl and Hg, m represents a natural number of 1 or more, and n represents a natural number of from 1 to 5.

The catalytic substance in the invention is constituted by containing at least one kind of a IV Group element selected from the group consisting of Si, Ge and Sn. Upon heating in the crystallization process of the oxide material, the catalytic substance exerts catalytic functions, such as increasing the reaction rate for forming the perovskite or lamellar perovskite structure oxide, accelerating formation of crystalline nuclei, and decreasing the crystallization energy, and is stably present. Upon forming the crystalline nuclei on the surface thereof, the catalytic functions thereof are terminated, and thereafter, upon decreasing the temperature, it forms a coherent solid solution with a silicate or a germanate and the perovskite or lamellar perovskite structure oxide. In other words, it exerts two kinds of functions, i.e., the catalytic function for forming the perovskite or lamellar perovskite structure oxide at a low temperature and a material for forming the oxide.

Specifically, the catalytic substance suitably has a function of accelerating crystallization at a temperature lower than the perovskite or lamellar perovskite structure oxide constituting the solid solution, and it also suitably has good lattice compliance with the perovskite or lamellar perovskite structure oxide and a lamellar structure. In the case where it has a lamellar structure, in particular, it is receiving attention as a catalytic substance in recent years owing to a large surface area thereof (A. Ozaki, Catalytic Functions "Chapter 4, Production of Catalysts, 4.1 Production of Porous Materials" (1986), p. 74–78), which can be preferably used.

Specifically, examples thereof include a complex oxide containing at least one kind of oxide selected from the group consisting of CaO, BaO, PbO, ZnO, SrO, MgO, FeO, $Fe_2O_3$, $B_2O_3$, $Al_2O_3$, $In_2O_3$, $Y_2O_3$, $Sc_2O_3$, $Sb_2O_3$, $Cr_2O_3$, $Bi_2O_3$, $Ga_2O_3$, $CuO_2$, $MnO_2$, $ZrO_2$, $TiO_2$, $MoO_3$, $WO_3$, $V_2O_5$, a lantanoid oxide and the like, and at least one kind of a IV Group metallic oxide selected from the group consisting of $SiO_2$, $GeO_2$, $SnO_2$ and the like.

Specific examples of the complex oxide include materials represented by $X_2SiO_5$, $X_4Si_3O_{12}$, $X_2GeO_5$, $X_4Ge_3O_{12}$, $X_2SnO_5$ and $X_4Sn_3O_{12}$ (wherein X represents $Ca^{2+}$, $Ba^{2+}$, $Pb^{2+}$, $Zn^{2+}$, $Sr^{2+}$, $Mg^{2+}$, $Fe^{2+}$, $Fe^{3+}$, $B^{3+}$, $Al^{3+}$, $In^{3+}$, $Y^{3+}$, $Sc^{3+}$, $Sb^{3+}$, $Cr^{3+}$, $Bi^{3+}$, $Ga^{3+}$, $Cu^{4+}$, $Mn^{4+}$, $Zr^{4+}$, $Ti^{4+}$, $Mo^{6+}$, $V^{5+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$ and the like), and the like.

More specifically, examples thereof include $Bi_2SiO_5$, $La_2SiO_5$, $Y_2SiO_5$, $Bi_4Si_3O_{12}$, $La_4Si_3O_{12}$, $Y_4Si_3O_{12}$, $Bi_2GeO_5$, $La_2GeO_5$, $Y_2GeO_5$, $Bi_4Ge_3O_{12}$, $La_4Ge_3O_{12}$, $Y_4Ge_3O_{12}$, $Bi_2SnO_5$, $La_2SnO_5$, $Y_2SnO_5$, $Bi_4Sn_3O_{12}$, $La_4Sn_3O_{12}$, $Y_4Sn_3O_{12}$, mixtures of two or more kinds thereof, such as $Bi_{2-x}La_xSiO_5$ and $La_{4-x}Y_xSi_3O_{12}$, and the like.

For example, a 1/1 complex oxide of bismuth oxide and silicon oxide is $Bi_2SiO_5$, and $Bi_2SiO_5$ is such an oxide material that is crystallized at a low temperature of about 400° C. (M. Yamaguchi, et al., Proceedings of the 2000 12th IEEE International Symposium on Applications of Ferroelectrics, vol. 2, p. 629–632 (2001)). $Bi_2SiO_5$ has good lattice compliance with the most of the oxide described later, and therefore, an oxide can be selectively crystallized at a low temperature. $Bi_2SiO_5$ is also significantly stable owing to four-coordination $SiO_2$ thereof.

The oxide material of the invention is a solid solution, and in other words, it has such a structure that has a phase formed by randomly replacing atoms at lattice points with atoms of a different kind, or introducing atoms of a different kind into lattice spaces to be statistically distributed, i.e., a mixed phase formed by dissolving a substance of a different kind into a crystalline phase. The lamellar perovskite structure oxide has such a crystalline structure formed by introducing atoms of a different kind into a crystalline phase, but it has been known that it is not a solid solution (Carlos A. Pazde Araujo, "Advanced Process for Ferroelectric Memory" Science Forum, p. 35–43 (1999)). Therefore, examples of the oxide material of the invention include an oxide material having a form of a solid solution of a catalytic substance containing a IV Group element and a perovskite or lamellar perovskite structure oxide material, and containing $Si^{4+}$, $Ge^{4+}$ or $Sn^{4+}$ at positions of cations in the crystalline lattice constituting the perovskite or lamellar perovskite structure oxide, as well as a material containing $Si^{4+}$, $Ge^{4+}$ or $Sn^{4+}$ at centers of oxygen octahedrons constituting the perovskite or lamellar perovskite structure oxide. The oxide material of the invention may not be in such a state that the catalytic substance containing a IV Group element and the perovskite or lamellar perovskite structure oxide completely form a solid solution, but may be such a material that contains $Si^{4+}$, $Ge^{4+}$ or $Sn^{4+}$ at the positions of cations in the crystalline lattice or at the centers of oxygen octahedrons.

In the case where the cations in the crystalline lattice or the ions at the centers of the oxygen octahedrons constituting the perovskite or lamellar perovskite structure oxide are replaced with $Si^{4+}$, $Ge^{4+}$ or $Sn^{4+}$, the extent of the replacement is not particularly limited. For example, in the case of $Bi_4Ti_3O_{12}$, a difference, such as decrease in crystallization temperature, appears in $Bi_4Ti_{2.9}Si_{0.1}O_{12}$, in which Ti is replaced with 0.1 of Si, and improvement in electric characteristics appears in $Bi_4Ti_{2.5}Si_{0.5}O_{12}$. Therefore, 0.1 or more, and more particularly 0.5 or more atom per one molecule can be exemplified. From another standpoint, the solid solution preferably contains the perovskite or lamellar perovskite structure oxide having the IV Group element dissolved therein at a ratio of about from 1/0.01 to 1/5, preferably about from 1/0.01 to 1/0.8, and more preferably about from 1/0.01 to 1/0.5. From still another standpoint, the cations in the crystalline lattice or the ions at the center of the oxygen octahedrons constituting the perovskite or lamellar perovskite structure oxide may be replaced with about 50% or less, preferably about 40% or less, and more preferably about 35% or less, of $Si^{4+}$, $Ge^{4+}$ or $Sn^{4+}$.

In the case of the $ABO_3$ perovskite oxide material, in general, there are restrictions in ionic radius of the crystalline lattice, for example, the respective constitutional ions of the oxygen octahedrons, as an existence condition as a crystal. This is expressed by a latitude coefficient t, and the latitude coefficient $t=(R_A+R_O)/(2(R_B+R_O))$ is necessarily in a range of $0.8<t<1.02$.

In the case of $(Bi_2O_2)^{2+}(A_{m-1}B_mO_{3m+1})^{2-}$, bismuth lamellar perovskite material, the restriction in latitude coefficient t with respect to the ions constituting the virtual perovskite lattice is $0.81<t<0.93$ for m=2 ($0.83<t<0.91$ for m=3), $0.85<t<0.89$ for m=4, and $0.86<t<0.87$ for m=5, and it has been known that when m is increased, the latitude range of t is narrowed (T. Takenaka, Report on Workshop for Applied Electronic Properties, Japan Society of Applied Physics, Workshop for Applied Electronic Properties vol. 456, p. 1–8 (1994)). Since the latitude coefficient t for m=3 is not disclosed, it can be obtained by extrapolating the proportional relationship shown in FIG. 1 from the minimum and maximum latitude coefficients for m=2, 4, and 5.

Upon applying the latitude coefficient t to PZT, SBT and BIT, in the case where the lattice, for example, the centers of the oxygen octahedrons are replaced with $Si^{4+}$, the latitude coefficient t becomes t=1.10 (Å) for PZT, t=1.09 (Å) for SBT, and t=1.04 (Å) for BIT, all of which are not applied to the latitude range. The ionic radius is designated as an average value 0.84×0.52+0.75×0.48=1.18 (Å) in the case of a solid solution, such as PZT, as Zr/Ti=0.52/0.48, by using 1.26 (Å) for $O^{2-}$, 1.33 (Å) for $Pb^{2+}$, 1.32 (Å) for $Sr^{2+}$, 1.17 (Å) for $Bi^{3+}$, 1.17 (Å) for $La^{3+}$, 0.75 (Å) for $Ti^{4+}$, 0.84 (Å) for $Zr^{4+}$, 0.78 (Å) for $Ta^{5+}$, and 0.40 (Å) for $Si^{4+}$, and the empirical ionic radii by Shannon (1976) and Prewitt (1969 and 1970).

According thereto, the replacement of the crystalline lattice of the perovskite structure or lamellar perovskite structure oxide material, for example, the centers (B sites) of the oxygen octahedrons, with $Si^{4+}$ provides a latitude coefficient t outside the latitude range, and thus it is understood that replacement of the B sites with $Si^{4+}$ is considerably difficult. This is also apparent from U.S. Pat. No. 5,519,234, which discloses that a metal, such as Ti, Ta, Hf, W, Nb or Zr, can be replaced as a B site ion in the SBT, but does not disclose that it can be replaced with $Si^{4+}$ or the like, which is a metalloid.

In order to replace at the lattice points of the perovskite or lamellar perovskite structure, $SiO_6^{8-}$, which is a six-coordinate octahedral structure, is necessary, but a IV Group element has a coordination number of 4, and has, for example, $SiO_2$ ($SiO_4^{4-}$), which is a tetrahedral structure. Furthermore, a large amount of perovskite structure materials, such as $CaSiO_3$ and MgSiO, are present under a high pressure of 20 GPa (200,000 atm) or more in the mantle of the earth at 600 km below ground (S. K. Saxena, et al., Science, "Stability of Perovskite ($MgSiO_3$) in the Earth's Mantle", vol. 274, p. 1357–1359 (1996)), and it has been known that the six-coordinate structure of the IV Group element (Si, Ge and Sn) is present only under such a high pressure environment.

In spite of the foregoing, the strongest covalency can be introduced into the crystalline structure according to the foregoing constitution in the invention, i.e., the atoms at the lattice points of the crystalline phase can be randomly replaced with a different kind of atoms, the IV Group element (Si, Ge and Sn) other than C and Pb (C has a too small ionic radius, and Pb has a too large ionic radius), or the IV Group element can be statistically distributed into lattice spaces, and the reactivity of an ionic bond, which is significantly reactive to a process concerning ions, such as active hydrogen ($H^+$) and an applied electric field ($e^-$), can be prevented in the perovskite structure oxide material. As a result, breakage of the perovskite structure can be prevented under a hydrogen reducing atmosphere.

The perovskite or lamellar perovskite structure oxide requires large thermal energy (baking temperature) for forming crystalline nuclei thereof, but only low thermal energy is required for growing (T. Kijima, S. Satoh, H. Matsunaga and M. Koba, "Ultra-Thin Fatigue-Free $Bi_4Ti_3O_{12}$ Films for Ferroelectric Memories", Jpn. J. Appl. Phys., vol. 35, p. 1246–1250 (1996)). Therefore, the reaction from a raw material containing elements constituting the oxide material to the oxide material is accelerated, and the activation energy upon forming crystalline nuclei of the oxide material is lowered, by using the catalytic substance, and as a result, the crystallization temperature can be lowered.

Specifically, the temperature upon baking for crystallizing the solid solution can be appropriately adjusted by the characteristics of the oxide material to be finally obtained, the compositions of the solutions, or the like, and in general, in the case where a thin film is formed by using a gel solution for forming the perovskite or lamellar perovskite structure oxide, such a temperature can be exemplified as about from 450 to 600° C. for $PbZr_{0.52}Ti_{0.48}O_3$ (PZT), about from 500 to 650° C. for $Bi_4Ti_3O_{12}$ (BIT) and $Bi_{4-x}La_xTi_3O_{12}$ (BLT), and about from 500 to 650° C. for $SrBi_2Ta_2O_9$ (SBT).

Furthermore, decomposition of the raw material constituting the perovskite or lamellar perovskite structure oxide can be accelerated by using the IV Group element-containing catalytic substance, and thus C in the organic metallic raw materials can be removed.

The oxide material of the invention is a solid solution of the IV Group element-containing catalytic substance and the perovskite or lamellar perovskite structure oxide, and they are preferably present as a mixture in the oxide material. In general, the perovskite or lamellar perovskite structure oxide causes a low forming density of crystalline nuclei because it is crystallized by using only the catalytic function of the electroconductive film (Pt metal is generally used) used as the lower electrode. Therefore, at the time when the crystalline nuclei continue to grow to form a film in the final phase, coarse surface morphology, which is convex upward, is obtained, and the applied electric field becomes a leakage electric current with a thickness of 100 nm or less, whereby the characteristics of the oxide material cannot be effectively utilized. However, in the case where they are present as a mixture, crystalline nuclei can be formed all over the film, and accordingly, the oxide material can be formed into a dense thin film.

The perovskite or lamellar perovskite structure oxide (such as BIT or the like) is selectively formed on the surface of the IV Group element-containing catalytic substance. As a result, they can completely form a solid solution to obtain a perovskite single phase. There are some cases where they do not completely form a solid solution with the IV Group element-containing catalytic substance remaining, but, even in these cases, the resulting oxide material exhibits good characteristics equivalent to the perovskite single phase. For example, in the case where the perovskite or lamellar perovskite structure oxide is a ferroelectric material, the catalytic material is also polarized as similar to the polarization of the ferroelectric by the displacement due to the polarization of the ferroelectric material, and it functions as a passive ferroelectric material, whereby the characteristics of the ferroelectric material are not deteriorated.

In the invention, the IV Group element-containing catalytic substance accelerates the formation of the crystalline nuclei of the perovskite or lamellar perovskite structure oxide upon heating in the crystallization process, and it is stably present at this time. For example, $SiO_2$ (or $GeO_2$ or $SnO_2$) is four-coordination and is stable. After forming the crystalline nuclei on the surface of the substance, a large compression stress occurs upon decreasing the temperature owing to the difference in thermal expansion between silicate or germanate and the perovskite or lamellar perovskite structure oxide. Silicon or the like is replaced in the crystalline lattice of the perovskite or lamellar perovskite structure oxide by the function of the compression stress. While depending on the mode of combination of the IV Group element-containing catalytic substance and the perovskite or lamellar perovskite structure oxide, for example, a solid solution of $Bi_4Ti_3O_{12}$ and $Y_2O_3$—$SiO_2$ is formed to replace the so-called A site ions and B site ions of the perovskite or lamellar perovskite structure oxide at the same time, and thus, $(Bi,Y)_4(Ti,Si)_3O_{12}$ can be finally obtained, whereby oxide materials having various characteristics, such as ferroelectric characteristics, can be formed.

The oxide material of the invention will be described in detail below with reference to the drawings.

EXAMPLE 1

Catalytic Property of $Bi_2SiO_5$ (BSO)

A BSO sol-gel solution was spin-coated on a platinum electrode formed on a substrate, and an organic component was removed on a hot-plate (400° C.) to produce a BSO thin film of 100 nm.

The substrate with platinum having the BSO thin film formed thereon was immersed in a 1% ammonia aqueous solution. At this time, $Bi_3+$ in the BSO thin film became $Bi(OH)_3$ in the ammonia aqueous solution, and as a result $H^+$ became excessive in the aqueous solution to exhibit weak acidity of pH 5.

Differential thermal analysis (TG-DTA) was carried out by using a 10% by weight $Bi_4Ti_3O_{12}$ (BIT) solution, a 10% by weight BSO solution and a BIT—BSO mixed solution (a mixed solution obtained by mixing 0.4 mole of BSO per 1 mole of BIT, R=0.4) respectively. The results are shown in FIG. 2.

Figure 2:
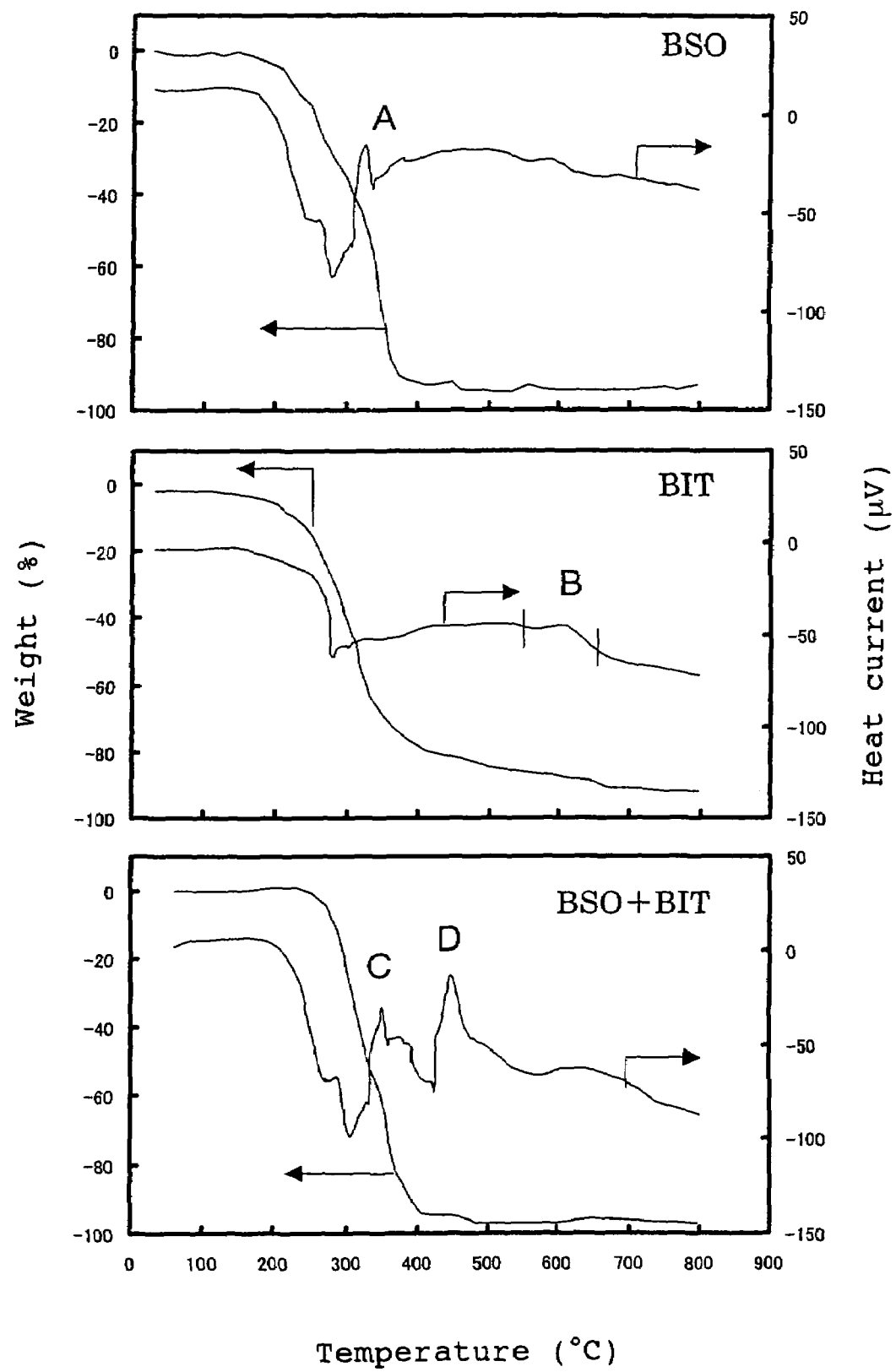
FIG. 2 is a graph showing the results of differential thermal analysis (TG-DTA) of a BSO solution, a BIT solution and a BSO—BIT mixed solution.

It is understood from FIG. 2 that the BSO solution is crystallized at a low temperature of about 350° C. It is also understood that the BIT solution is difficult to be crystallized since it exhibits a significantly broad crystallization peak in the vicinity of 600° C. The BIT—BSO mixed solution has a peak in the vicinity of 350° C., which is considered to be ascribed to BSO, and subsequently, a clear crystallization peak in the vicinity of 400° C. This is because BSO is firstly crystallized, and then BIT is crystallized on the surface of BSO at a low temperature owing to the function of BSO crystals.

Upon comparing the TG charts in FIG. 2, the weight is gradually decreased until 800° C. in the case of the BIT solution. On the other hand, the weight decrease in the case of BIT—BSO mixed solution is large until 400° C., but there is substantially no change thereafter. This is because BSO functions as an acidic catalyst in the BIT—BSO mixed solution, which converts the organic metal to a ferroelectric material through sufficient decomposition via metallic ions, and the carbon component to $CO_2$, owing to the function of BSO as an acidic catalyst.

Thin films formed by using the BIT—BSO mixed solution and the BLT solution are subjected to EDX (energy dispersive X-ray) analysis as shown in FIG. 3, and it is found that substantially no carbon remains in the material in the case where the BIT—BSO mixed solution is used.

It has been found from the foregoing that decomposition of the organic metal is accelerated, and the oxide material is crystallized at a low temperature in the lamellar perovskite structure oxide (BIT) by using the IV Group element-containing catalytic substance (BSO).

EXAMPLE 2

Film Formation by Sol-Gel Process

Figure 4:
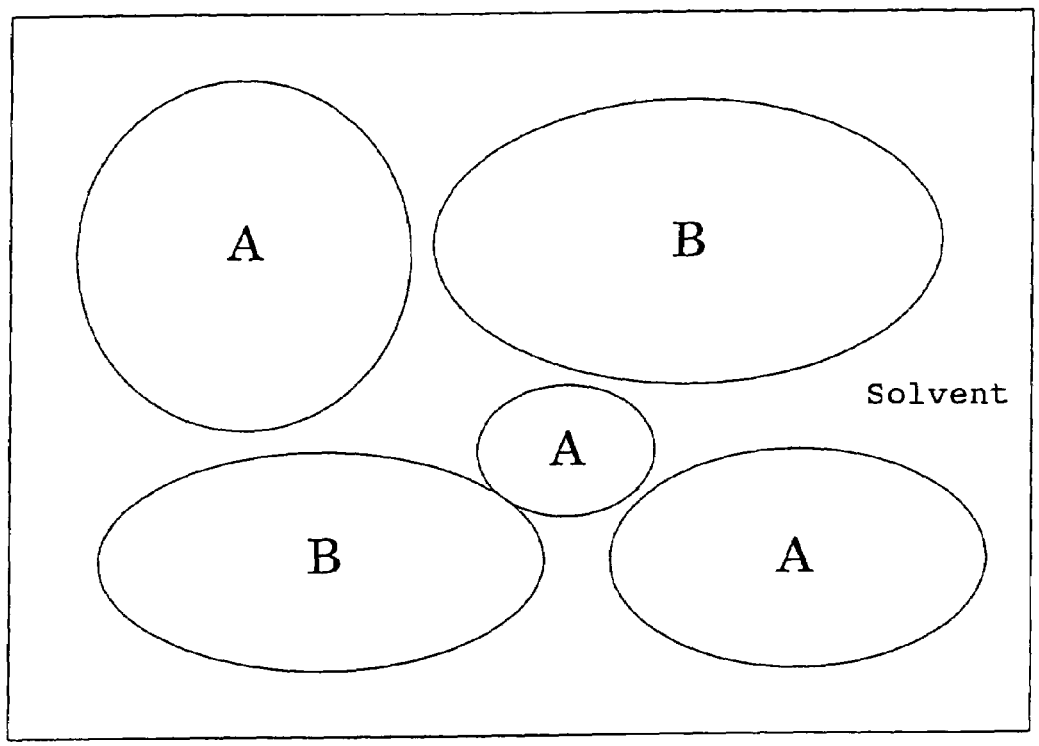
FIG. 4 is a principal diagram showing the state of a raw material solution formed by mixing a BSO sol-gel solution and a PZT sol-gel solution.

5% by weight of a BIT sol-gel solution and 1% by weight of BSO sol-gel solution were mixed to prepare a BIT—BSO mixed solution (R=0.4). The mixed solution in this case was in such a state that the respective components were present as a mixture, as shown in FIG. 4.

On a platinum electrode, the following operation was repeated four times by using the mixed solution, i.e., (1) spin coating (500 rpm for 5 seconds and 4,000 rpm for 20 seconds), (2) drying (in the atmosphere at 50° C. for 2 minutes), and (3) calcination (in the atmosphere at 400° C. for 5 minuets), to make a thickness of 100 nm. It was confirmed that the film thus obtained was in the state where only BSO was crystallized as shown in FIG. 5(a), and the crystallized BSO was surrounded by amorphous BIT.

Subsequently, (4) baking (crystallization) was carried out (at 600° C. for 15 minutes, RTA in oxygen of 1 kg/cm$^2$), and an upper platinum electrode was formed on the resulting oxide material thin film.

Thereafter, (5) post-annealing was carried out (at 500° C. for 5 minutes, RTA in oxygen of 2 kg/cm$^2$).

Figure 5:
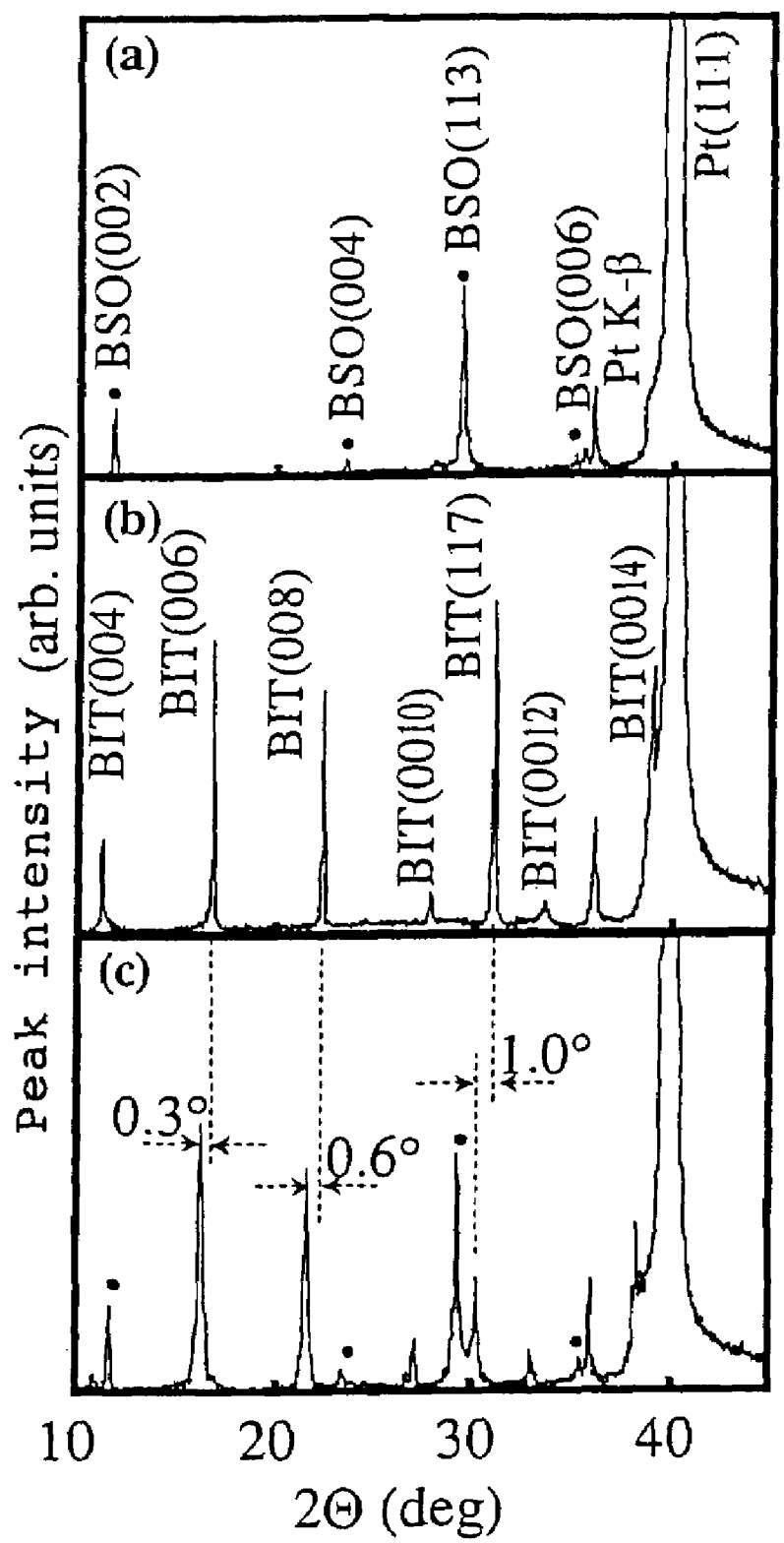
FIG. 5 is a diagram showing (a) the XRD pattern of the oxide material film after calcination in the case where the film is formed by using a BIT—BSO mixed solution, (b) the XRD pattern of the oxide material film after crystallization, and (c) the XRD pattern of the oxide material film after calcination in the case where the film is formed by alternately coating a BSO solution and a BIT solution.

As a result of XRD measurement of the oxide material film after the crystallization, a reflection peak of the BSO crystal was completely diminished as shown in FIG. 5(b).

Figure 7:
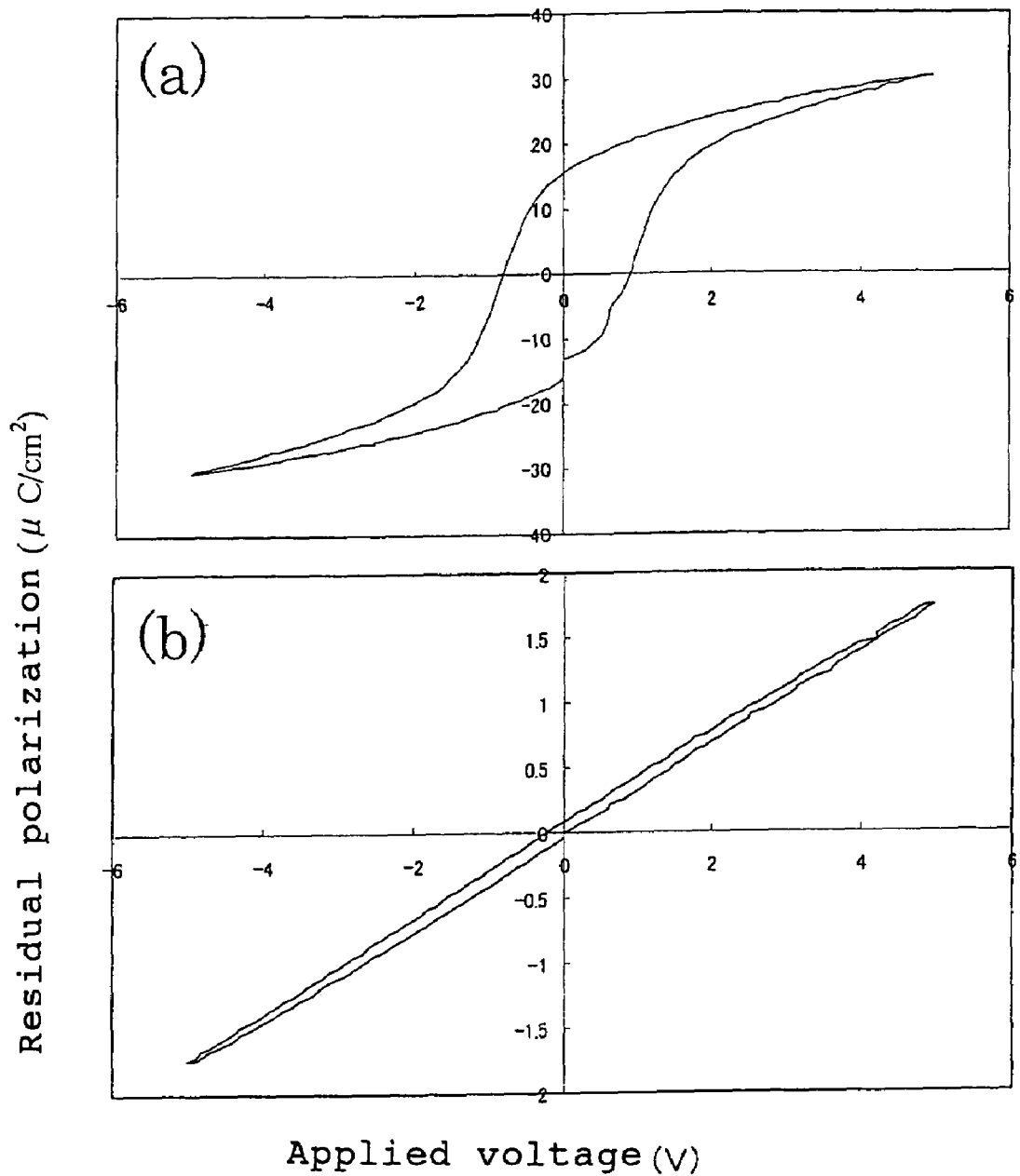
FIG. 7 is (a) a diagram showing the hysteresis characteristics of the oxide material film obtained in FIGS. 6(a), and (b) a diagram showing the hysteresis characteristics of the oxide material film obtained in FIG. 6(b).
Figure 8:
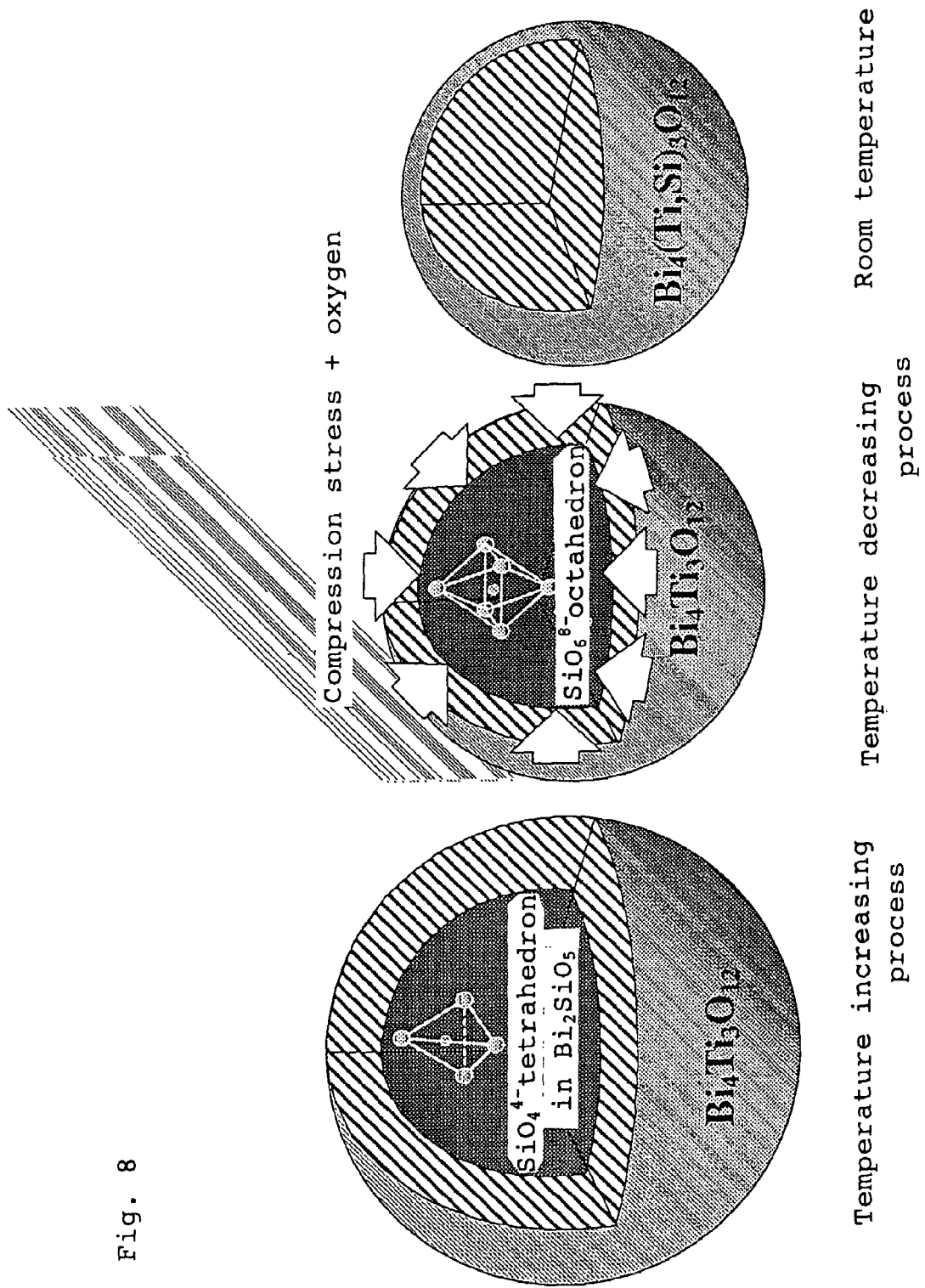
FIG. 8 is a diagram for describing the state in the crystallization process of the oxide material film.

The measurement of hysteresis characteristics of the resulting oxide material film revealed good hysteresis characteristics as shown in FIG. 7(a).

For comparison, a 5% by weight BIT sol-gel solution and a 1% by weight BSO sol-gel solution were respectively prepared, film were formed in the same manner as in the operations (1) to (3) except that 14 nm per one layer for BIT and 7 nm per one layer for BSO were accumulated by 9 layers, respectively, to make a total thickness of about 100 nm. The total composition of the film was adjusted to R=0.4.

The operations (4) and (5) were carried out to attain crystallization, and thus it was confirmed that the resulting oxide material film had crystallized BIT layers at 500° C., which was different from the conventional BIT film. This was because the decrease in crystallization temperature range was ascribed to a sort of catalytic function of BSO crystals. However, the result of XRD measurement reveals that crystallization peaks of BSO and BIT were mixedly present to fail to form a single layer as shown in FIG. 5(c).

The measurement of hysteresis characteristics of the resulting oxide material film revealed that there are no hysteresis characteristics as shown in FIG. 7(b).

The foregoing results show that the lamellar perovskite structure of BSO changes in crystalline structure in the BIT—BSO thin film.

In other words, the foregoing results mean that the $SiO_4^{4-}$ tetrahedron is changed in structure to the $SiO_6^{8-}$ octahedron, and finally changed into $Bi_4(Ti,Si)_3O_{12}$ containing Si as B site ions in 30% or more. In the case where the structure is established, the coordination number of Si is changed from 4 to 6, and at the same time, the ionic radius is changed from 0.04 nm to 0.054 nm. It is considered that this is a result of formation of a large compression stress in the BIT—BSO thin film because Si under the atmospheric environment has a too small ionic radius and does not form a perovskite structure, but a perovskite structure oxide is present under a compression stress of 20 GPa in the underearth mantle (Irifune, T. & Ringwood A. E., "Phase transformation in subducted oceanic crust and buoyancy relationship at depth of 600–800 km in the mantle", Earth Planet. Sci. Lett. vol. 117, p. 101–110 (1993), Surendra K. S., et al., "Stability of Perovskite (MgSiO3) in the Earth's Mantle", Science, vol. 274, p. 1357–1359 (1996), and Dubrovinsky, L. S., et al., "Experimental and theoretical identification of a new high-pressure phase of silica", Nature, vol. 388, p. 362–365 (1997)).

The difference in thermal expansion coefficient between BSO and BIT plays an important role on the formation of the large compression stress. That is, owing to the use of the solution having BSO gel and BIT gel, which are present as a mixture, the BSO crystals are surrounded by the BIT crystals, and upon decreasing the temperature for cooling after crystallization annealing from a high temperature to room temperature, such a compression stress is applied that crushes (changes crystalline structure) BSO by BIT. Under consideration that BSO contains $SiO_2$ as a main constitutional substance and has the similar thermal expansion coefficient as quartz (Si), the thermal expansion coefficient of BSO is as small as it can be ignored. The linear thermal expansion coefficient of BIT is calculated (Subbarao, E. C, "Ferroelectric in $Bi_4Ti_3O_{12}$ and Its Solid Solutions", Phys. Rev., vol. 122, p. 804–807 (1961)), and the compression stress generated by compression of the BIT crystals (Ishikawa, H., Sato, T. and Sawaoka, "Epitaxial growth of strain-free Ge films on Si substrates by solid phase epitaxy at ultrahigh pressure", Appl. Phys. Lett., vol. 61, p. 1951–1953 (1992)) by using the Young's modulus in the literature (Nagatsuma, K., Ito, Y., Jyomura, S. Takeuchi, H. and Ashida, S., Piezoelectricity, in FERROELECTRICITY AND RELATED PHENOMENA. 4, p. 167–176 (Gordon and Breach Science Publications, London (1985)), and Jaffe, B., Cook, W. R. and Jaffe, H., Non-Perovskite Oxide Piezoelectrics and Ferroelectrics, in PIEZOELECTRIC CERAMICS, p. 70–74 (ACADEMIC PRESS, New York (1971)), and thus the BSO crystals receive a compression stress as large as 12 GPa although the stress caused by contraction of the platinum electrode is not considered.

In the case where the sandwich structure shown in FIG. 6(b), on the other hand, the compression stress is released by slipping effect at interfaces therebetween, and the structural change in the BIT—BSO film does not occur.

In the XRD pattern of the BSO—BIT crystals shown in FIG. 5(b), a large peak shift of from 0.3° to 1° can be confirmed in comparison to the BIT crystals having an accumulated structure shown in FIG. 5(c). It is understood from the peak shift amount that the BIT—BSO crystals suffer volume contraction of about 8% in comparison to BIT. It has been known that it is necessary to apply a compression stress of from 20 to 30 GPa is applied to form such volume compression (J. Haines, et al., Physical Review B, vol. 58, p. 2909–2912 (1998), J. Haines and J. M. Leger, Physical Review B, vol. 55, p. 11144–11154 (1997), and B. B. Karki, et al., Physical Review B, vol. 55, p. 3465–3471 (1997)).

That is, in the BIT—BSO structure in the crystallization process, BIT is crystallized by BSO at a low temperature upon heating, and upon cooling, the $Bi_4(Ti,Si)_3O_{12}$ (BSO—BIT) solid solution is formed owing to the difference in thermal expansion between BSO and BIT. When Si atoms form a perovskite structure, it becomes a perovskite crystal having large covalency owing to the high covalency of Si, so as to form high resistance to hydrogen that has not been owned by the conventional ferroelectric materials.

Sol-Gel Solution

As the liquid used for forming the oxide material thin film by the sol-gel process, those obtained by dissolving a metallic alkoxide, an organic salt or an organic base in an organic solvent, such as an alcohol, are preferably used. Among these, a metallic alkoxide is preferably used because it has a constant vapor pressure, can be obtained as a high purity material through a heating and reflux (distillation) process, can be easily dissolved in an organic solvent, forms hydroxide gel or precipitate through reaction with water, and forms a metallic oxide through a baking process in an oxidation atmosphere. The organic solvent for preparing the sol solution is preferably an alcohol, such as n-butanol, n-propanol and 2-methoxyethanol, because they can be well mixed and do not promote further polycondensation because they are anhydrous solvents.

The metallic element constituting the metallic alkoxide may be any element as far as it is such an element that constitutes the IV Group element-containing catalytic substance or the perovskite or lamellar perovskite structure oxide, and examples thereof include an alkali metal, such as K, Li and Na, an alkaline earth metal, such as Ba, Ca, Mg and Sr, the III Group, such as Al, B and In, the IV Group, such as Si, Ge and Sn, the V Group, such as P, Sb and Bi, a transition element, such as Y, Ti, Zr, Nb, Ta, V and W, a lanthanoid, such as La, Ce and Nd, and the like.

In the case where a metallic alkoxide is used as a starting material, it is advantageous because the "n=molecular length (size)" can be controlled by controlling the polycondensation through partial hydrolysis as described below. That is, the polycondensation reaction itself of the metallic alkoxide can be controlled by adding a known amount of water.

Hydrolysis

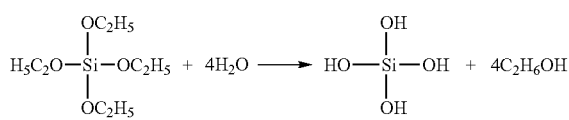

Bimolecular Polycondensation

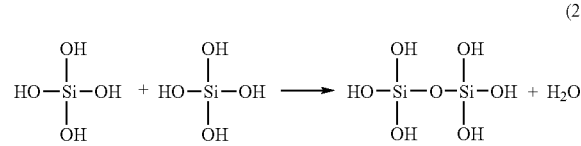

Linear Polycondensation

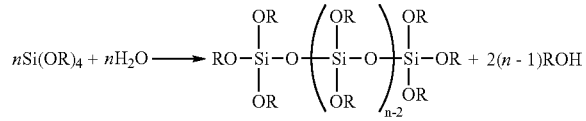

The gel solution containing the polycondensation product thus obtained is coated on a substrate by such a method as a spin coating method, a doctor blade method and a spraying method to obtain a thin film.

In this example, for the system of a metallic alkoxide and a metallic salt of a carboxylic acid for forming PZT, descriptions will be made by using lead acetate (($CH_3CO_2$)$_2Pb.H_2O$) as a starting material of Pb (lead), titanium tetraisopropoxide ((($CH_3$)$_2CHO$)$_4Ti$) as a starting material of Ti (titanium), zirconium tetra-n-butoxide (($CH_3(CH_2)_3O$)$_4Zr$) as a starting material of Zr (zirconium), and 2-methoxyethanol ($CH_3O(CH_2)_2OH$) as a solvent.

Figure 9:
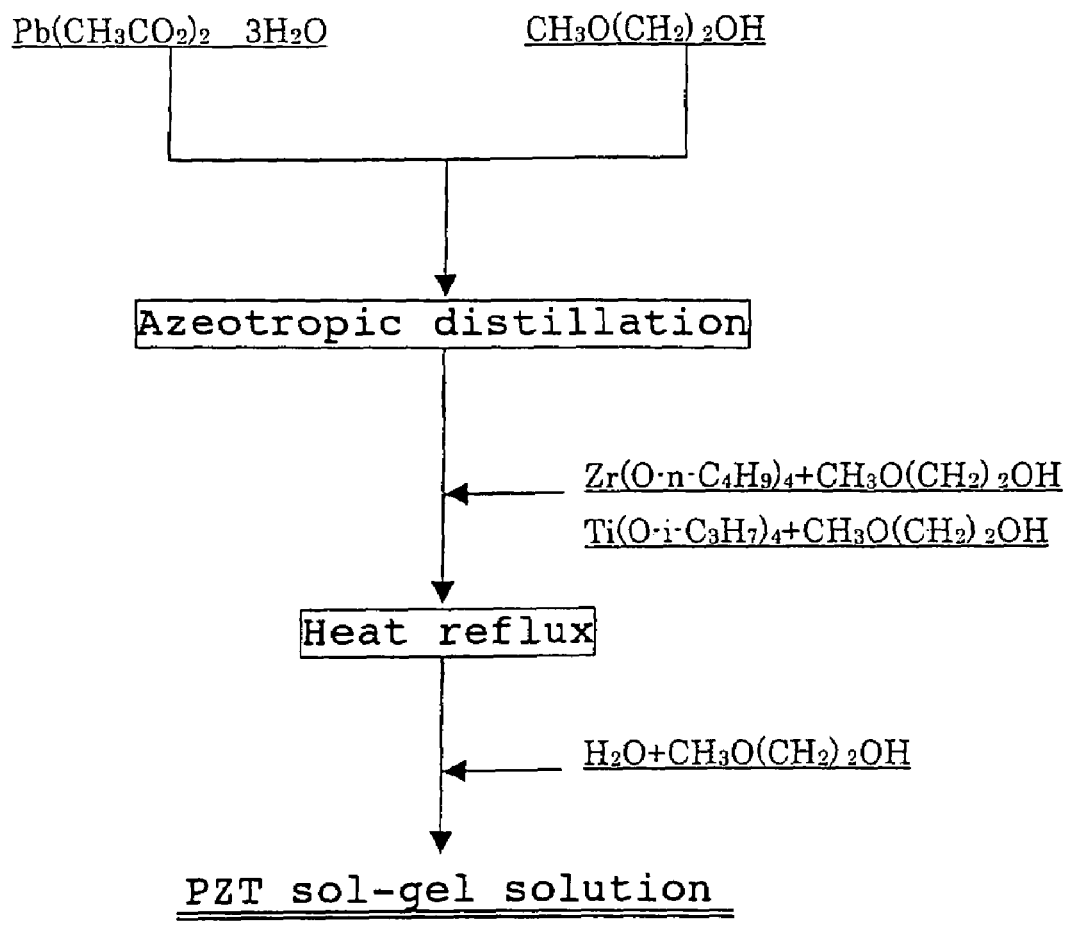
FIG. 9 is a flowchart for preparing a PZT sol-gel solution.

FIG. 9 is a flow chart of synthesis of a sol-gel solution for forming a PZT ferroelectric thin film. By subjecting alkoxides of Pb, Zr and Ti instead of that of Si to mixed polycondensation (partial hydrolysis) in the foregoing chemical formulae, a so-called PZT ferroelectric material forming sol-gel solution is obtained, in which the respective elements are bonded through oxygen atoms.

The polymerization degree of the hydrolysis polycondensation product can be controlled by adjusting the amount of water added as described in the foregoing, and therefore, $3H_2O$ present as crystallization water in ($CH_3CO_2$)$_2Pb.3H_2O$ is removed, i.e., it is heated along with $CH_3O(CH_2)_2OH$ as the solvent, whereby water is distillated through azeotropy with the solvent. A viscous liquid obtained through distillation has such a chemical structure $CH_3CO_2PbO(CH_2)_2OCH_3.XH_2O$ (X<0.5) that is obtained by substituting one of the acetate groups ($CH_3CO_2$—) of ($CH_3CO_2$)$_2Pb.3H_2O$ with a 2-methoxyethoxy group ($CH_3O(CH_2)_2O$—). Upon the substitution reaction, acetic acid ($CH_3CO_2H$) and an ester of acetic acid and $CH_3O(CH_2)_2OH$ ($CH_3CO_2(CH_2)_2OCH_3$ and water ($H_2O$)) are formed.

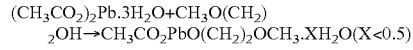

(($CH_3$)$_2CHO$)$_4Ti$ is then dissolved in $CH_3O(CH_2)_2OH$ to cause the following alcohol exchange reaction, and all or part of the isopropoxy group (($CH_3$)$_2CHO$—) of (($CH_3$)$_2CHO$)$_4Ti$ present as a 1.4-molecular body in the absence of the solvent is substituted by a 2-methoxyethoxy group.

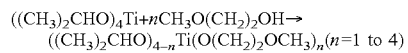

The similar alcohol exchange reaction occurs in the case where ($CH_3(CH_2)_3O$)$_4Zr$ is dissolved in $CH_3O(CH_2)_2OH$.

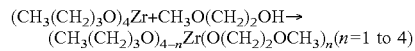

These three liquids are mixed, and water in a measured amount is added to the molecules to control hydrolysis, whereby a sol-gel solution for forming a PZT ferroelectric thin film is obtained. The mixing ratios of the alkoxides of the respective elements and the like may be appropriately adjusted under consideration of the composition of the ferroelectric material to be obtained.

The following polymer is present in the solution.

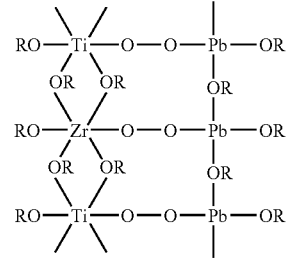

Figure 10:
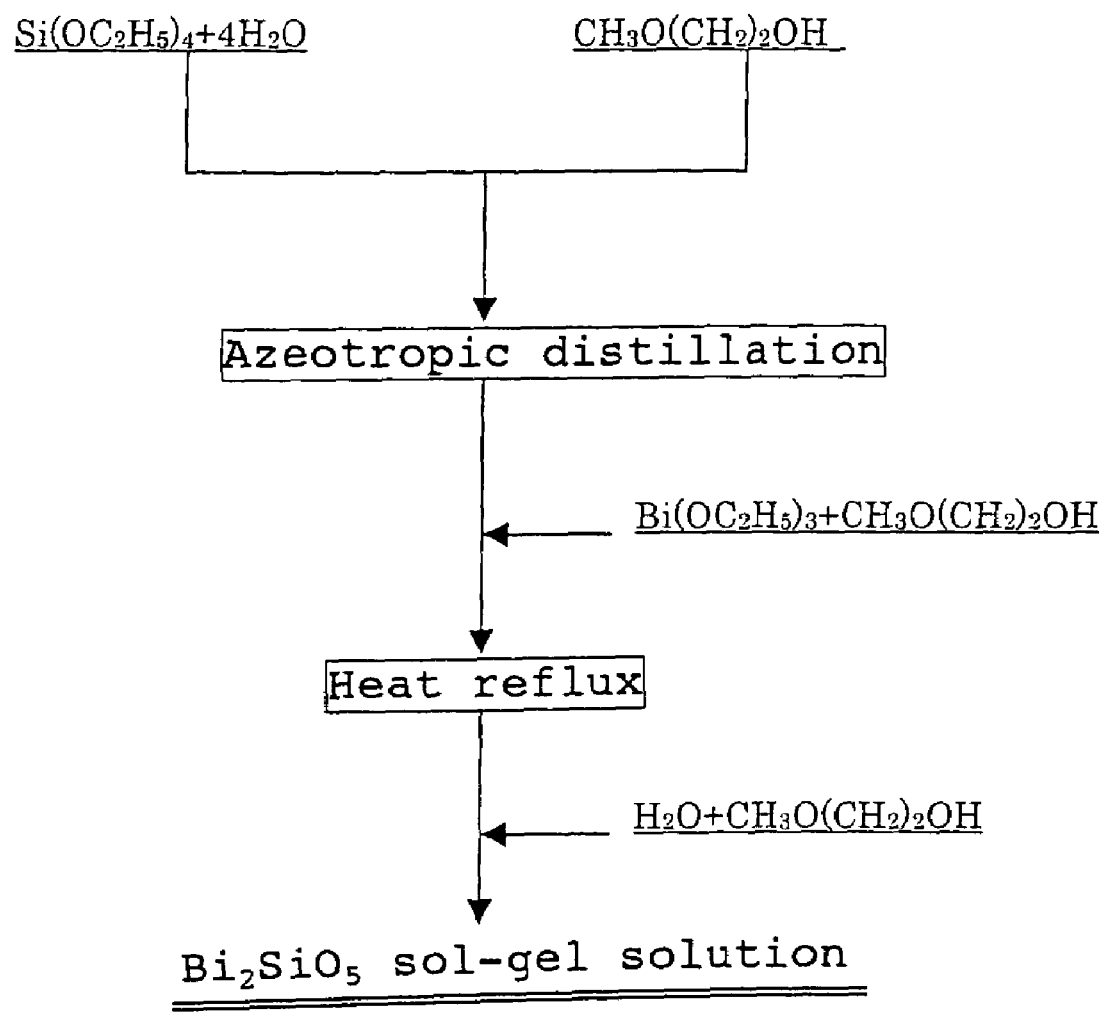
FIG. 10 is a flow chart for preparing a BSO sol-gel solution.

BSO gel shown in FIG. 10 is formed by using the hydrolysis and polycondensation processes that are similar to the gel for forming a PZT ferroelectric thin film.

There is an organic metal decomposition process as a counterpart of the sol-gel process. In this process, a metallic alkoxide and an organic acid salt are dissolved in an organic solvent, such as toluene ($C_6H_5CH_3$) and xylene ($C_6H_4(CH_3)_2$), and the liquid is coated on a substrate, followed by subjecting to thermal decomposition, to obtain an oxide thin film. Because no water is added in this process, the metallic alkoxide and the organic acid salt thus added are present as they are in the solution, but do not suffer polycondensation. However, there are some ones, such as SBT, that are present as polycondensation products through occurrence of a ligand exchange reaction.

Figure 11:
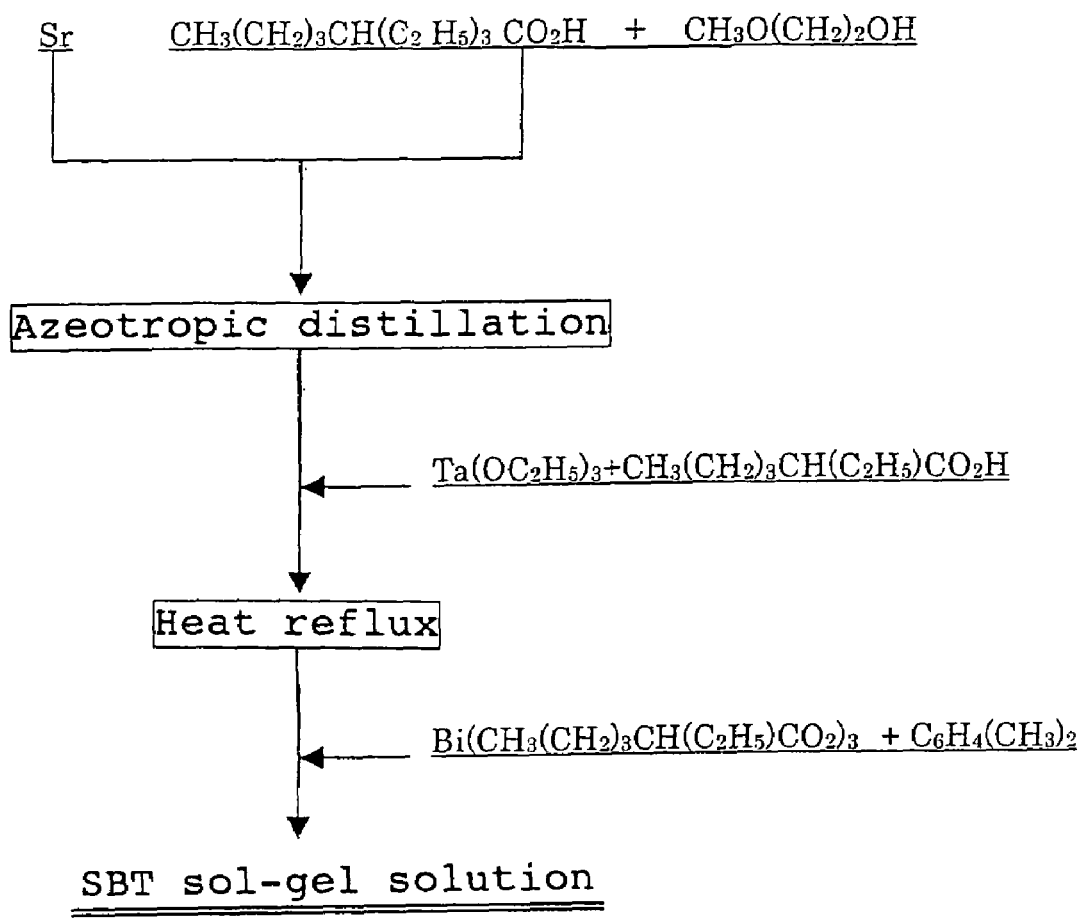
FIG. 11 is a flow chart for preparing a SBT sol-gel solution.

For example, a solution for forming an SBT ferroelectric thin film is a so-called MOD solution prepared according to FIG. 11. It is considered that a gel structure of a Bi element and a Ta element being interdigitated with each other through the carbonyl group (—CO—) of the carboxylic acid salt, and Sr is present in the spaces thereof, i.e., it suffers polycondensation. Therefore, it falls within the scope of the polycondensation gel (sol-gel solution) according to the invention.

As described in the foregoing, the BIT, SBT or PZT solution for forming a ferroelectric thin film obtained by polycondensation with controlled hydrolysis and the BSO solution for forming the IV Group element-containing catalytic substance obtained by polycondensation with controlled hydrolysis are mixed at room temperature. The mixing ratio of the gel solution for forming the ferroelectric material and the gel solution for forming the catalytic substance can be appropriately adjusted depending on the compositions of the solutions, the characteristics of the oxide material to be finally obtained, the baking temperature, and the like.

For example, in the case where a $Bi_2SiO_5$ (BSO) sol-gel solution using n-butanol (specific gravity: 0.813) as a solvent is mixed with a $Bi_4Ti_3O_{12}$ (BIT) sol-gel solution using n-propanol (specific gravity: 0.79) as a solvent at a ratio of R=0.4 to form a raw material solution, assuming that all the concentrations are 10% by weight, the gram numbers of BSO and BIT contained in the solvents are 1,000×0.813=813 g for BSO and 1,000×0.79=790 g for BIT. The molecular weights of BSO and BIT per one mole except for oxygen are 446.0455 for BSO and 979.56 for BIT, and thus, the molar concentrations thereof are 1.8 mole/L for BSO and 0.81 mole/L for BIT. Therefore, in the case where they are mixed to a mixed sol-gel solution of R=0.4, BSO is mixed at a ratio of 0.4, and thus it is sufficient that 850 ml of the BIT sol-gel solution is added to 150 ml of the BSO sol-gel solution.

The solutions are preferably those after completing the polycondensation. The solutions are in an anhydrous state, and thus, no further hydrolysis proceeds even upon mixing, whereby considerably stable raw material solutions are obtained.

State of Water in Sol-Gel Solution

An airtight container containing a BLT sol-gel solution of 5% by weight and a BSO sol-gel solution of 1% by weight, which have been prepared in the same manner as in the foregoing was opened in a draft chamber in a clean room for about one hour, and 24 hours after closing the container, a thin film of FIG. 6(*a*) was formed under the same conditions as in the foregoing.

Figure 12:
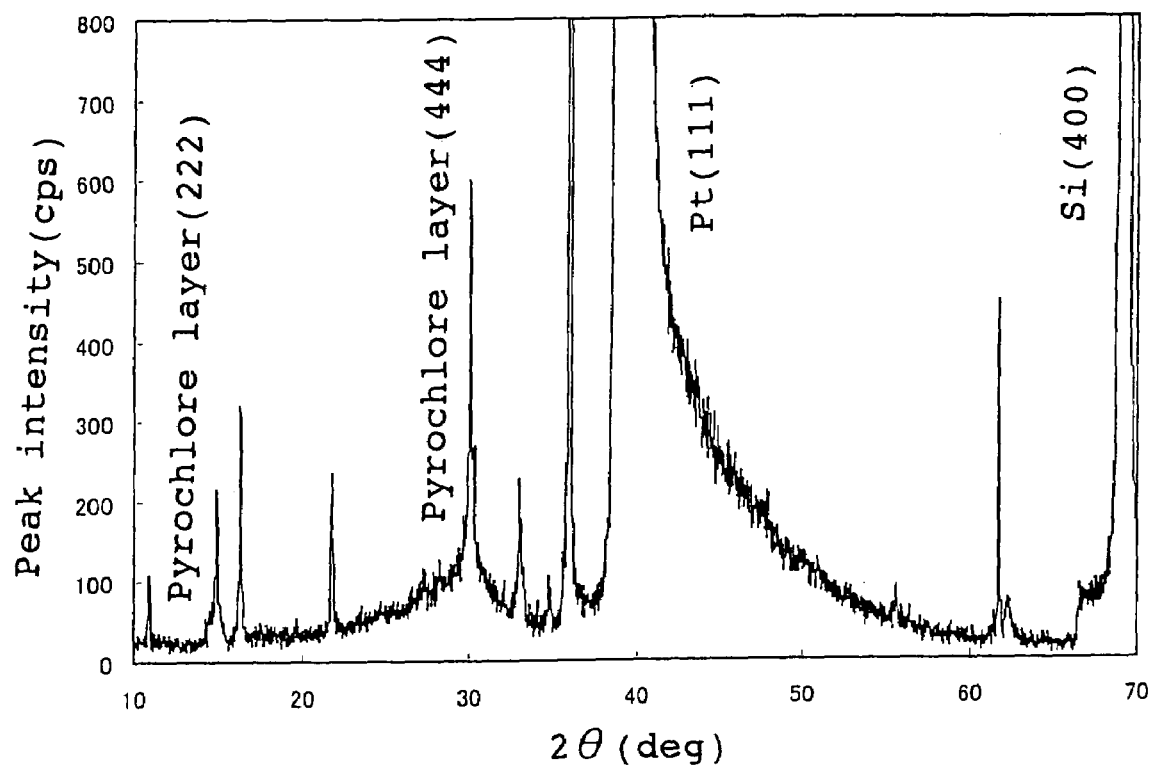
FIG. 12 is a diagram showing the XRD pattern of an oxide material film in the case where crystallization is carried out by using a raw material solution having a water content introduced therein.
Figure 13:
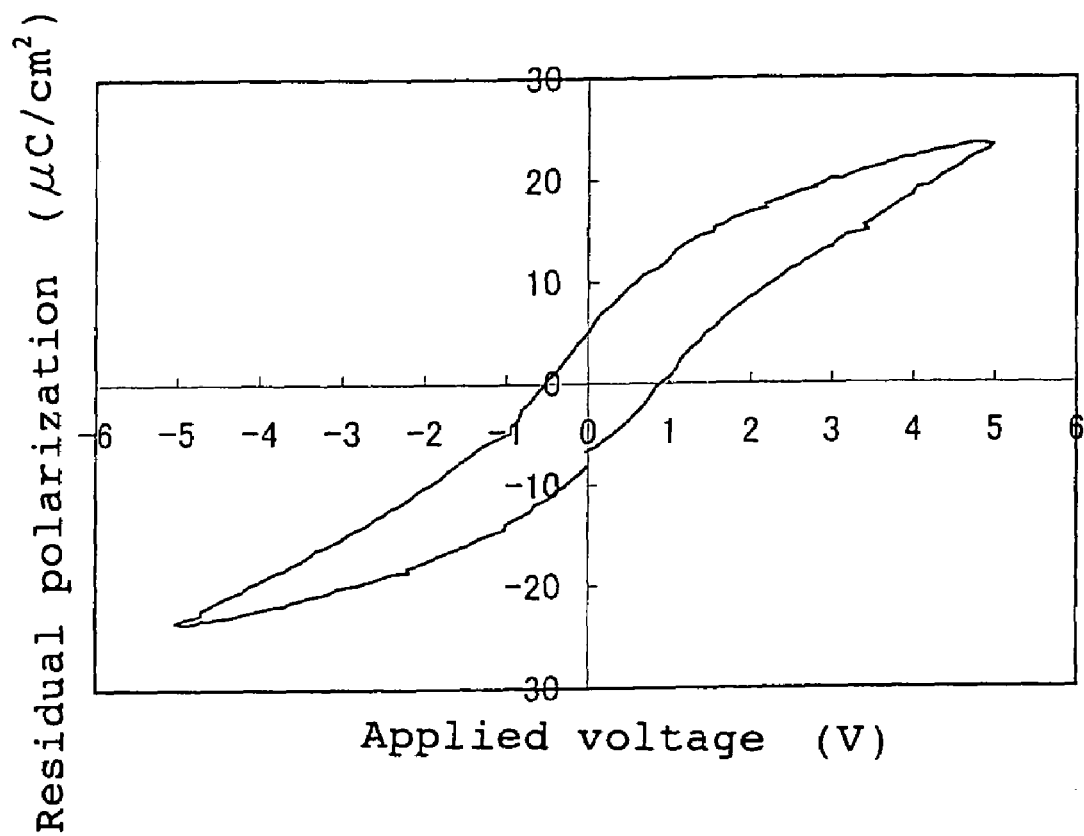
FIG. 13 is a graph showing the hysteresis characteristics of the oxide material film of FIG. 12.

In the case as described in the foregoing where water content in the air is intentionally introduced into the mixed sol-gel solution, and then it is used for forming a thin film, it is understood as shown in FIG. 12 that a paraelectric pyrochlore layer grows, and the function of BSO is failed. As a result, the ferroelectric characteristics are significantly poor as shown in FIG. 13.

This is because hydrolysis proceeds with water content in the air to fail to retain independent networks of BSO and BIT in the mixed sol-gel solution, and thus the structure shown in FIG. 4 cannot be maintained. Accordingly, it is important that the sol-gel solution for forming the IV Group element-containing catalytic substance and the sol-gel solution for forming the ferroelectric material are mixed in an anhydrous state, i.e., such a solution is used as a raw material solution in that the gel containing the IV Group element connected through oxygen and the gel containing the element constituting the ferroelectric material connected through oxygen are dispersed in the same solution and are present independently.

EXAMPLE 3

Characteristics of Solid Solution Thin Film of BSO—$Bi_4Ti_3O_{12}$ (BIT), BSO—$SrBi_2Ta_2O_9$ (SBT) and BSO—$PbZr_{0.52}Ti_{0.48}O_3$ (PZT)

A BIT, SBT or PZT solution for forming a ferroelectric thin film, the polycondensation of which has been completed with controlled hydrolysis, and a BSO solution for forming a dielectric material thin film, the polycondensation of which has been completed with controlled hydrolysis, are mixed at room temperature according to Example 2. The BSO gel content in the mixed gel for forming a ferroelectric material was a molar ratio R=0.4, 0.33 and 0.1 for BIT, SBT and PZT, respectively. The raw material gel is one having the stoichiometric composition.

The sol-gel mixed solution was coated on a Pt/Ti/$SiO_2$/Si substrate by a spin coating method, and a film was formed under the following film forming conditions. The thickness was 100 nm in all the cases.

(Conditions for Forming Ferroelectric Thin Film)

(1) Spin coating (at 500 rpm for 5 seconds and 4,000 rpm for 20 seconds), (2) drying (in the atmosphere at 50° C. for 2 minutes), (3) calcination (in the atmosphere at 400° C. for 5 minuets), and subsequently (4) baking (crystallization) (at 450 to 700° C. for 10 minutes, RTA in oxygen) were carried out.

Figure 14:
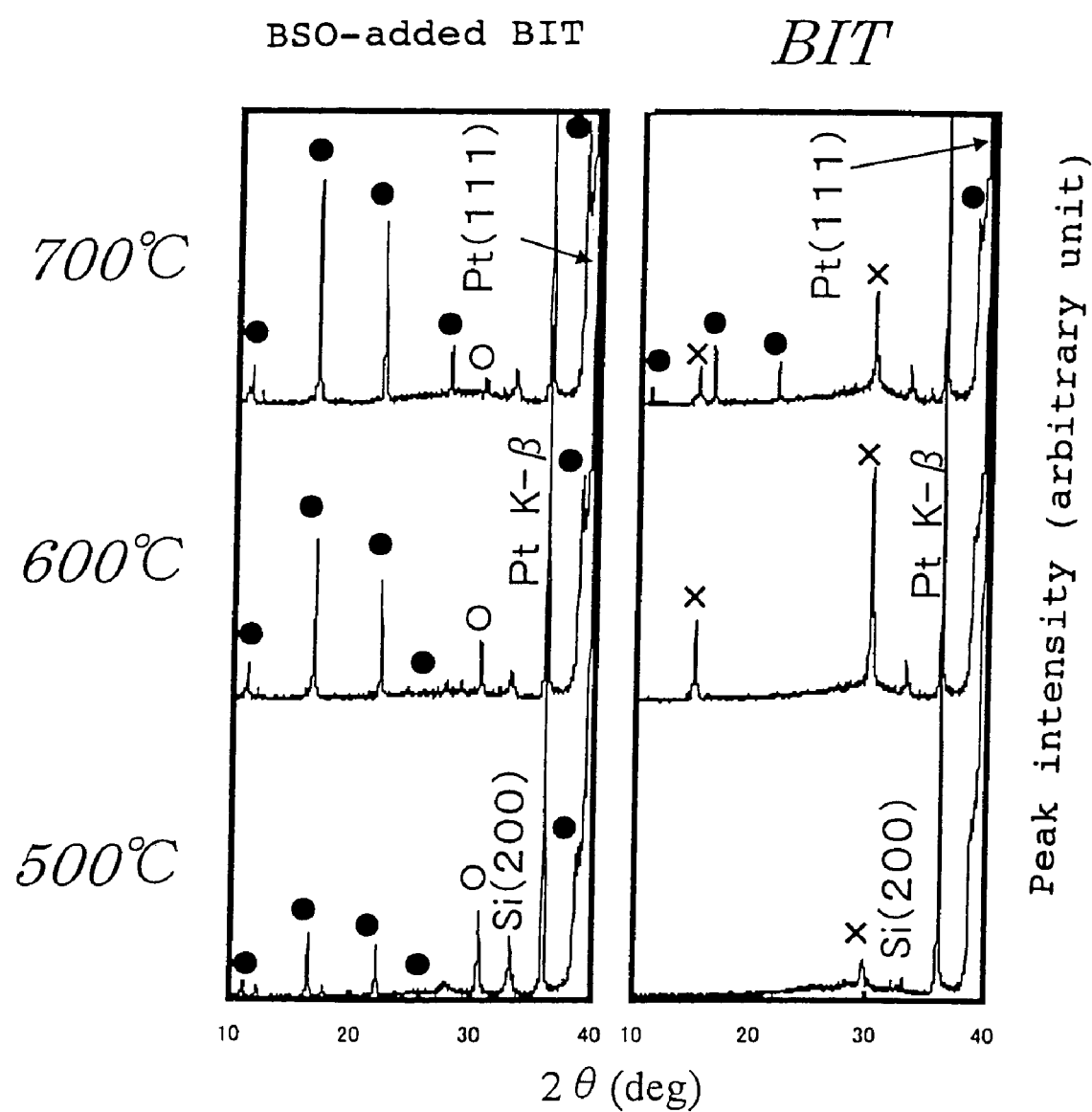
FIG. 14 is the XRD patterns of BIT and BSO—BIT (R=0.4) according to the invention.

FIG. 14 shows the XRD patterns of the conventional BIT and the BSO—BIT (R=0.4) according to the invention, having a thickness of 100 nm and being produced by the foregoing process.

The BIT having BSO added thereto according to the invention exhibits good crystallinity at 500° C. On the other hand, BIT containing no BSO cannot provide a single layer at 700° C., and it is understood that a dielectric pyrochlore layer ($Bi_2Ti_2O_7$) and BIT are present as a mixture.

It is understood from the foregoing that the crystallization temperature of the BSO-added BIT according to the invention is lowered by about 200° C. in comparison to the conventional BIT.

The surface observation of the conventional BIT and the BSO-added BIT according to the invention reveals that the conventional BIT has a considerably coarse surface state although substantially no crystallization peak is found at 600° C., whereas the BSO-added BIT according to the invention has a dense and smooth film surface.

The observation of the interface between platinum and the ferroelectric material with TEM cross sectional images thereof reveals that the presence of an amorphous layer having a thickness of about 5 nm is confirmed in the conventional BIT, whereas the interface in the BSO-added BIT according to the invention has no presence of an amorphous layer to provide an interface in good conditions.

These results show that the crystalline growth mechanisms of the two cases are completely different from each other.

That is, in the case of the conventional BIT, BIT crystalline initial nuclei are formed only at the interface to the platinum electrode, and they grow upward and along the platinum interface as shown in FIG. 15(*a*), so as to provide a film surface after growth having convex upward coarse surface morphology.

On the other hand, in the case of the BSO-added BIT according to the invention, BIT crystalline initial nuclei form on all the five interfaces upon forming the amorphous state before crystallization (since four-layer coating is carried out on the Pt substrate as shown as the forming conditions, there are five interfaces including an interface to the Pt electrode and those among the respective layers) as shown in FIG. 15(*b*). In particular, there is no amorphous layer at the interface to the Pt electrode. It is considered that the smooth surface morphology is obtained as a result. This phenomenon is largely contributed by BSO, crystallization of which starts at a low temperature of 450° C. (Kijima, T. and Matsunaga, H., "Preparation of $Bi_4Ti_3O_{12}$ Thin Film on Si (100) Substrate Using $Bi_2SiO_5$ Buffer Layer and Its Electric Characterization", Jpn. J. Appl. Phys., vol. 37, p. 5171–5173 (1998)).

Figure 16:
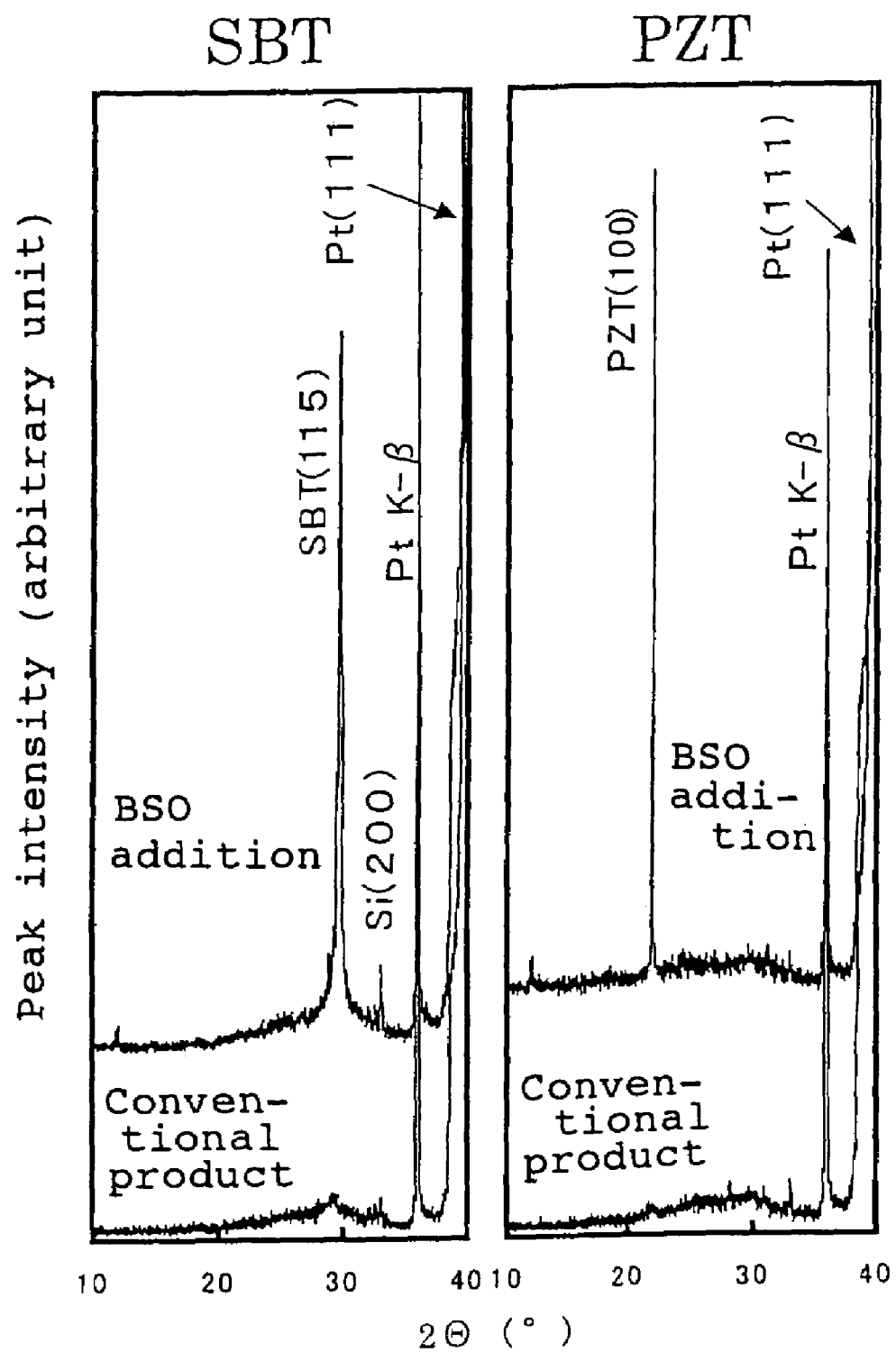
FIG. 16 is the XRD patterns of $SrBi_2Ta_2O_9$ and $Bi_2SiO_5$-added SBT (R=0.33) thin films and $PbZr_{0.52}Ti_{0.48}O_3$ and $Bi_2SiO_5$-added $PbZr_{0.52}Ti_{0.48}O_3$ (R=0.1) thin films.

As shown in the XRD patterns of FIG. 16, the decrease in crystallization temperature and the considerable improvement in surface morphology are found in BSO-added SBR (R=0.33) having been baked at 550° C. for 10 minutes and BSO-added PZT (R=0.1) having been baked at 450° C. for 10 minutes, as similar to BIT. In the case of the conventional PZT, an amorphous layer having a low dielectric constant is formed at the interface to the platinum electrode.

The resulting ferroelectric thin films were measured for P-V hysteresis characteristics by forming a platinum upper electrode having a diameter of 100 μm thereon.

Figure 17:
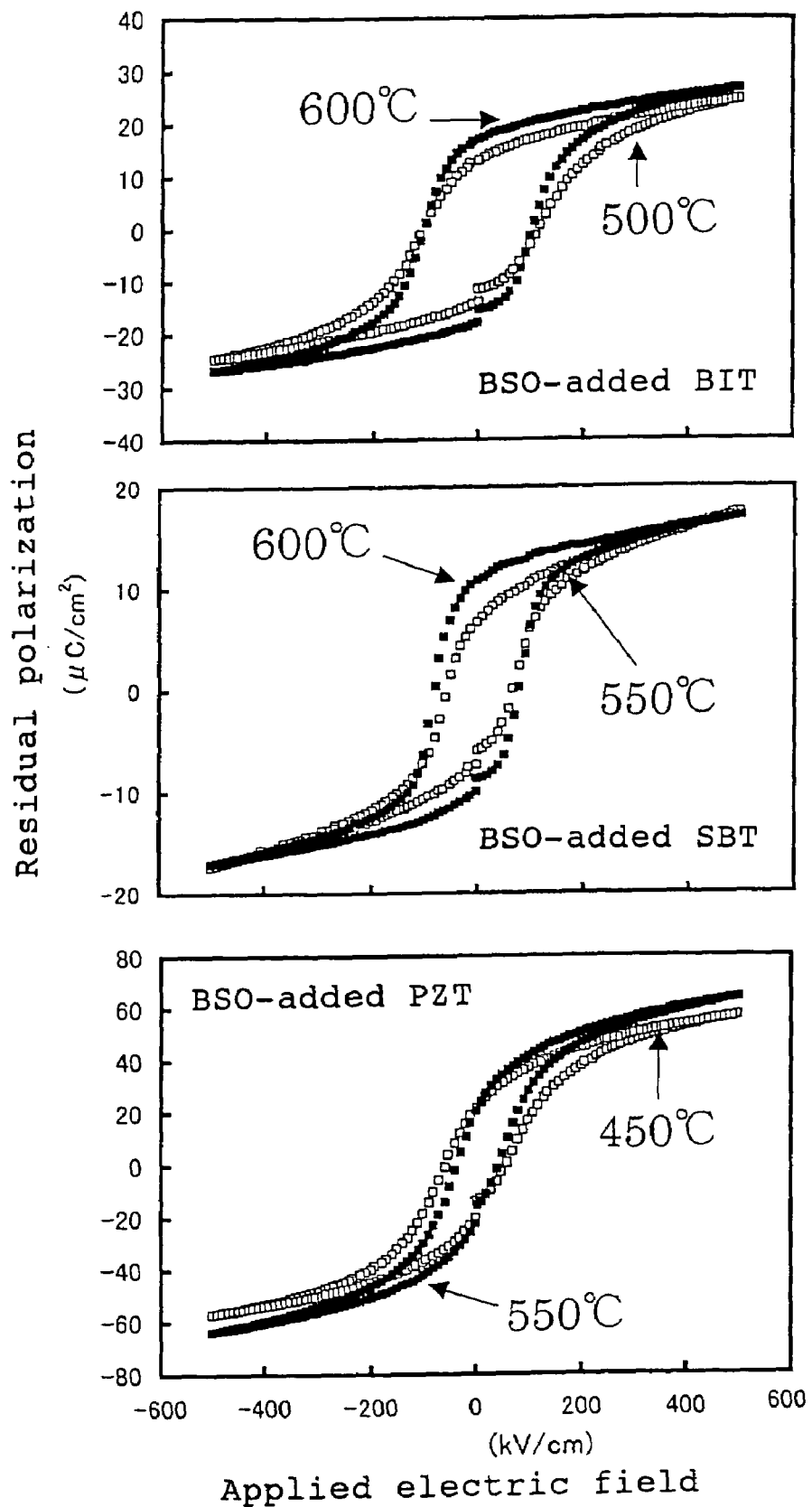
FIG. 17 is the D-E hysteresis characteristics of a $Bi_2SiO_5$-added $Bi_4Ti_3O_{12}$ (R=0.4), $Bi_2SiO_5$-added $SrBi_2Ta_2O_9$ (R=0.33) and $Bi_2SiO_5$-added $PbZr_{0.52}Ti_{0.48}O_3$ (R=0.1) thin films.

As a result, the BSO-added BIT, SBT or PZT ferroelectric thin film according to the invention exhibits good hysteresis characteristics shown in FIG. 17 although the baking temperature is lower by about from 150 to 200° C. than the conventional BIT, SBT or PZT ferroelectric thin film. The conventional BIT, SBT or PZT ferroelectric thin film, on the other hand, does not exhibit hysteresis characteristics with a thickness of 100 nm due to deteriorated leakage characteristics, which is considered to be ascribed to the coarse surface morphology thereof.

The resulting ferroelectric characteristics are as follows. The BSO-added BIT at 500° C. exhibits a residual polarization Pr=17 μC/cm² and a coercive electric field Ec=95 kV/cm, and the BSO-added BIT at 600° C. exhibits a residual polarization Pr=21 μC/cm² and a coercive electric field Ec=95 kV/cm. The BSO-added SBT at 550° C. exhibits Pr=7 μC/cm² and Ec=50 kV/cm, and the BSO-added SBT at 600° C. exhibits Pr=11 μC/cm² and Ec=60 kV/cm. BSO-added PZT at 450° C. exhibits Pr=20 μC/cm² and Ec=45 kV/cm, and the BSO-added PZT at 550° C. exhibits Pr=25° C./cm² and Ec=38 kV/cm.

As understood from the foregoing results, the ferroelectric material having BSO added thereto according to the invention has such an effect that the characteristics of the original ferroelectric material can be utilized as much as possible without any modification thereof through the decrease in crystallization temperature and the significant improvement in surface morphology.

Figure 18:
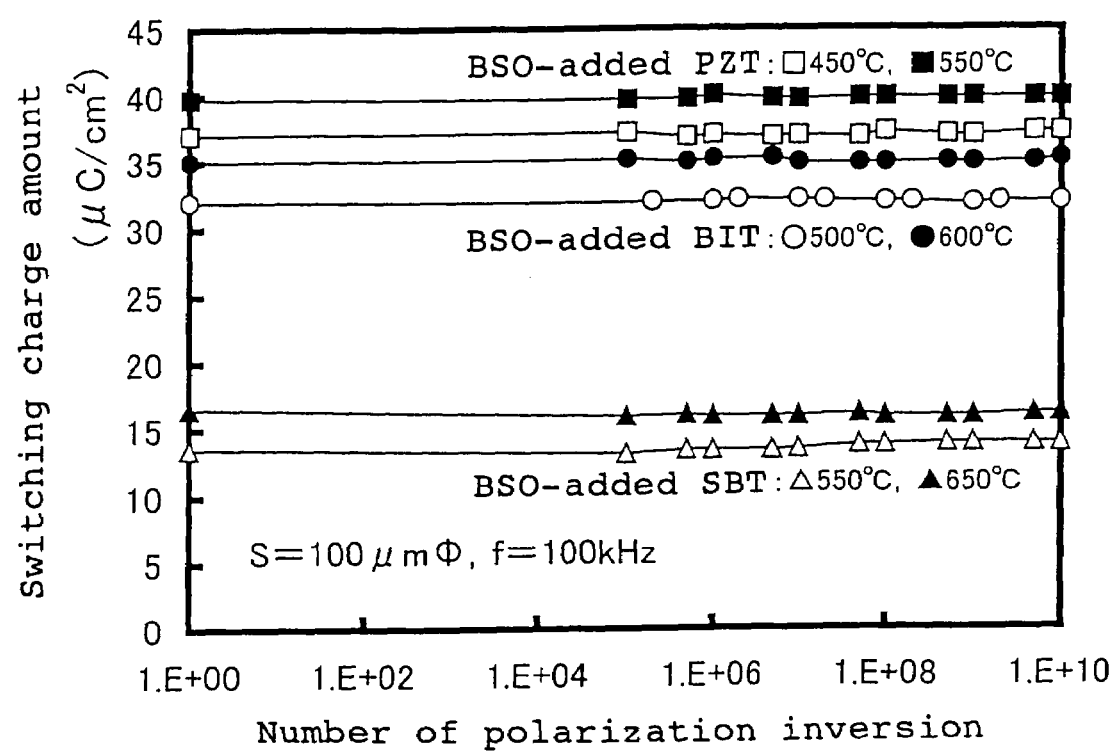
FIG. 18 is a graph showing the film fatigue characteristics of a $Bi_2SiO_5$-added $Bi_4Ti_3O_{12}$ (R=0.4), $Bi_2SiO_5$-added $SrBi_2Ta_2O_9$ . (R=0.33) and $Bi_2SiO_5$-added $PbZr_{0.52}Ti_{0.48}O_3$ (R=0.1) thin films.

Evaluation results of fatigue characteristics are then shown in FIG. 18. When a pulse electric field of an application voltage of 3 V and a frequency of 100 kHz is applied to carry out $10^{10}$ times polarization inversions, such considerably good fatigue characteristics are obtained for all the ferroelectric capacitors that the decrease in polarization value is 3% or less. It is considered that this is because of the good crystallinity, the smooth film surface, the good interface containing no hetero-phase, and the like. In particular, while it has been known that PZT suffers fatigue on a Pt electrode, the BSO-added PZT according to the invention provides good fatigue characteristics as similar to BIT.

Upon further consideration of the difference between the invention and the conventional art, it has been found that not only the mechanisms of crystal growth are different, but also there is a difference in crystalline structure itself.

It is apparent from observation of the TEM cross sectional images of the BSO-added BIT according to the invention and the conventional BIT that other differences than the B site ion replacement occurs between them.

Figure 19:
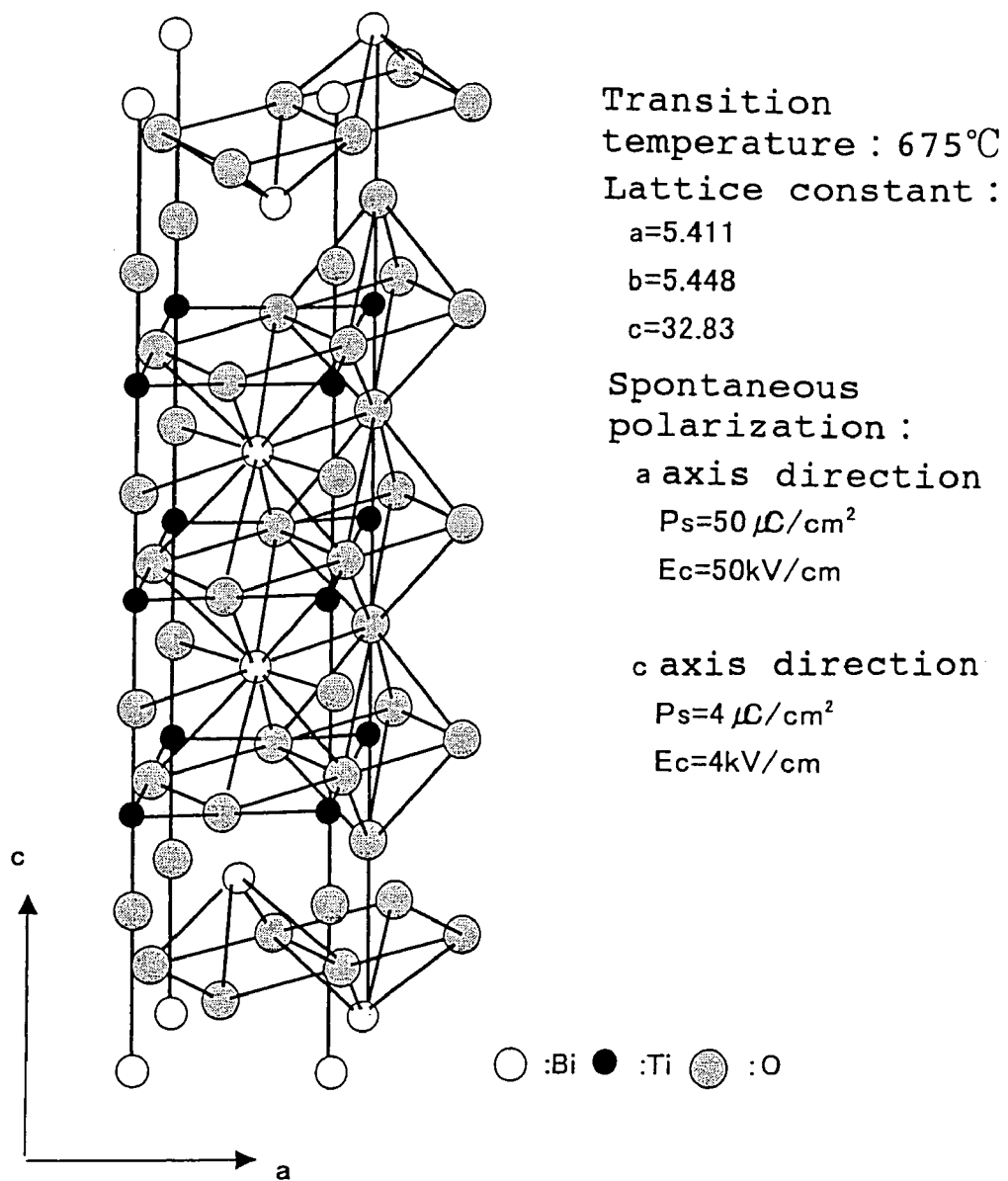
FIG. 19 is a diagram showing the crystalline structure of BIT.

In the conventional BIT, the c axis length of BIT is 32 Å or less, which well agrees with the bulk value in FIG. 19. It is understood that there is such a structure that has BIT regularly arranged in the transversal direction in the figure.

In the BSO-added BIT according to the invention, on the other hand, it is understood that the c axis length of BIT is as short as 31 Å. Furthermore, as different from the conventional BIT, such a complex structure is confirmed in that it is not arranged in the transversal direction in the figure to form partial vertical deviations, and BSO is introduced into the deviated parts. The c axis length of BSO is 15 Å or less, which substantially agree with the bulk data in FIG. 20.

Figure 21:
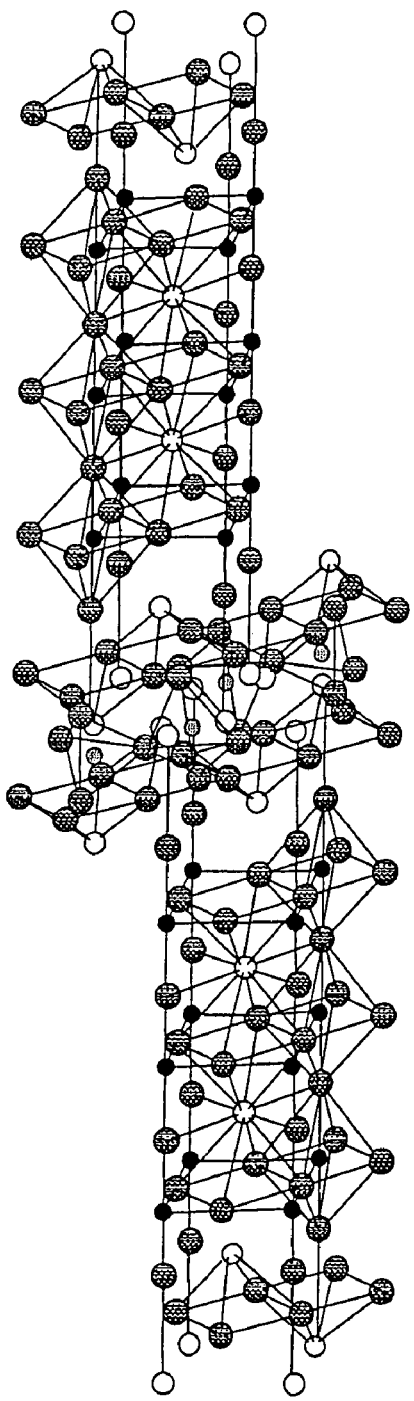
FIG. 21 is a diagram showing the superlattice structure of BSO and BIT.

It is understood from the foregoing that the BSO-added BIT according to the invention has the structure shown in FIG. 21. This evidences that BSO accelerates crystallization of BIT. Furthermore, the deviation in crystallization reflects the growing mechanism of silicate, and the surface area of silicate is increased owing to the structure to exert good functions.

There is no practically used polycrystalline Pt substrate having a completely flat surface without unevenness, and thus a large amount of unevenness is present on the ferroelectric thin film formed thereon. Therefore, when the BIT initial nuclei formed at arbitrarily positions are grown, there is substantially no case where adjacent ones are conformably grown as connected to each other, and the crystal growth is inhibited at the part where the crystals are not connected to each other. According to the structure of the invention, on the other hand, even when certain bumps are present, such an effect can also be obtained that the ferroelectric crystals are grown as connected to each other to absorb the bumps.

Figure 20:
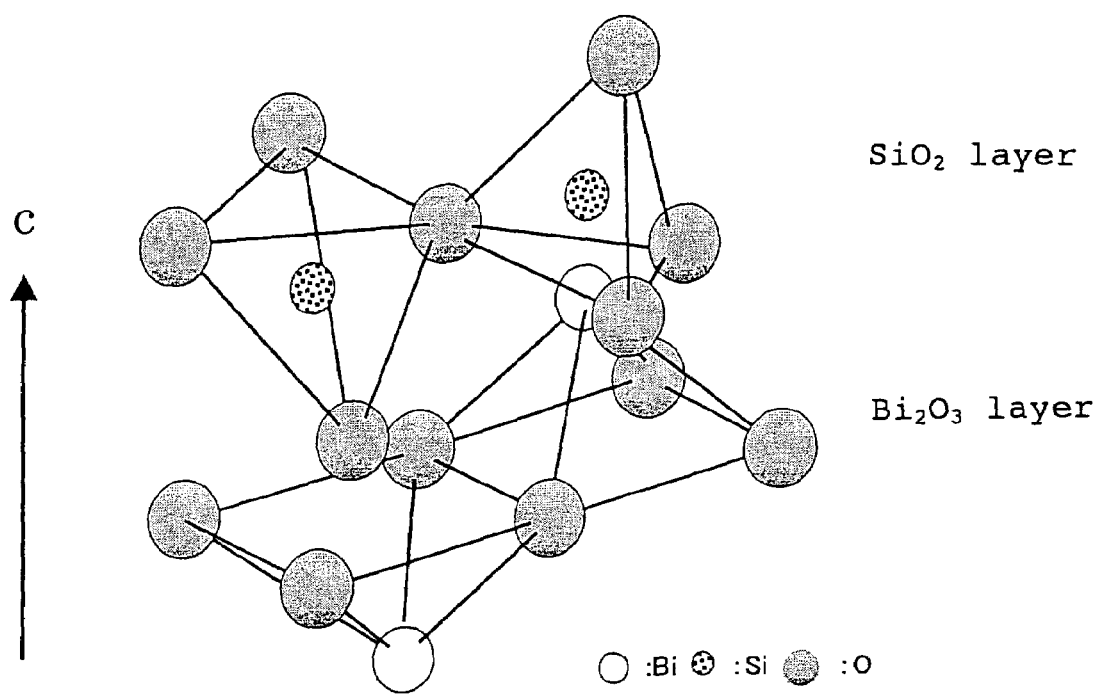
FIG. 20 is a diagram showing the crystalline structure of BSO.

Furthermore, the fact that the crystalline structure shown in FIG. 20 provides good ferroelectric characteristics even when dielectric BSO is contained can be explained as follows.

In general, there is substantially no case where the used substrate and the thin film thereon are completely agree with each other in lattice matching, and there are lattice deformation and stress in the thin film. Further, the ferroelectric material used in the invention is such a ferroelectric material that is referred to as a displacement type, which suffers displacement upon polarization to form stress.

On the other hand, BSO has the accumulated structure of $Bi_2O_3$ layers and $SiO_2$ layers as shown in FIG. 20. That is, the silicon oxide layer has such a structure that the tetrahedral structure of silicon oxide is horizontally aligned with the bismuth oxide layers. Silicon oxide is a good piezoelectric material and causes polarization by external pressure. When the silicon oxide is polarized (BSO is polarized) due to the stress in the film caused by the lattice inconformity and the like, good characteristics can be obtained without deterioration of the ferroelectric characteristics of BIT due to BSO.

Figure 22:
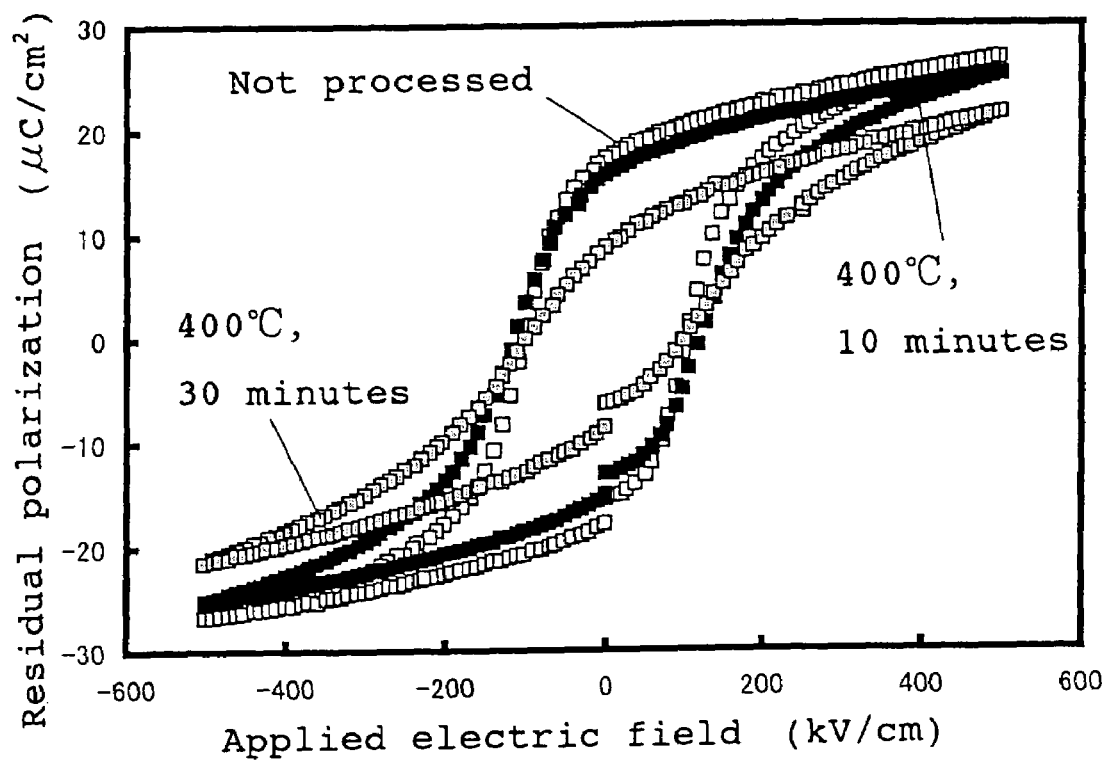
FIG. 22 is a diagram showing the reduction resistance upon annealing a Pt/BIT/Pt capacitor according to the invention in $N_2$ containing 3% of $H_2$ at 400° C.

Furthermore, when a Pt/BIT/Pt capacitor according to the invention is annealed in $N_2$ containing 3% of $H_2$ at 400° C., good reduction resistance as shown in FIG. 22 is exhibited. It is considered that this is because a part of B site Ti in BIT is replaced by Si in BSO to increase the covalency of BIT, and it is considered that the c axis length of BIT is changed as a result of the B site replacement and the formation of the solid solution with BSO.

The fact that the solid solution thin film of BSO and BIT according to the invention contains a large amount of Si has been revealed as a clear difference. It has generally known that in the case where a large amount of Si element is mixed in a ferroelectric film by diffusing from an Si substrate, the diffused Si causes increase of a leakage electric current density even though a not large amount thereof is mixed therein. In the case of an Si substrate having a metallic electrode, such as Pt, covered thereon, it is covered with a thermal oxidation $SiO_2$ film having a thickness of about 200 nm to improve the adhesion between Pt and the Si substrate, and thus the $SiO_2$ film is considerably stable. Therefore, it is difficult that Si is diffused into the ferroelectric film unless the baking temperature upon producing the ferroelectric thin film is too high. In the case of the conventional BIT, actually, Si is not diffused into the ferroelectric thin film at a baking temperature of 700° C.

Although the solid solution thin film of BSO and BIT according to the invention contains a large amount of Si in the film, considerably excellent ferroelectric characteristics are confirmed. Thus, the Si in the film is not one diffused from the substrate, but Si in BSO appears upon analysis. The fact can easily distinguish the conventional art and the invention through a great difference.

Comparison in Characteristics Between BIT—BSO Solid Solution Thin Film and BIT—$Bi_4Si_3O_{12}$ Solid Solution Thin Film A mixed solution formed by mixing a $Bi_4Si_3O_{12}$ sol-gel solution having a concentration of 10% by weight with a BIT sol-gel solution having a concentration of 10% by weight at a ratio of R=0.33 was used as a raw material solution for forming a BIT—$B_4Si_3O_{12}$ solid solution.

The sol-gel solution was coated on a Pt/Ti/$SiO_2$/Ti substrate by a spin coating method, and a ferroelectric thin film having a thickness of 100 nm was formed under the following film formation conditions.

(Ferroelectric Thin Film Formation Conditions)

A series of operations, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated four times, and subsequently (4) baking (crystallization) (at 600° C. for 10 minutes, RTA in oxygen) was carried out.

Figure 23:
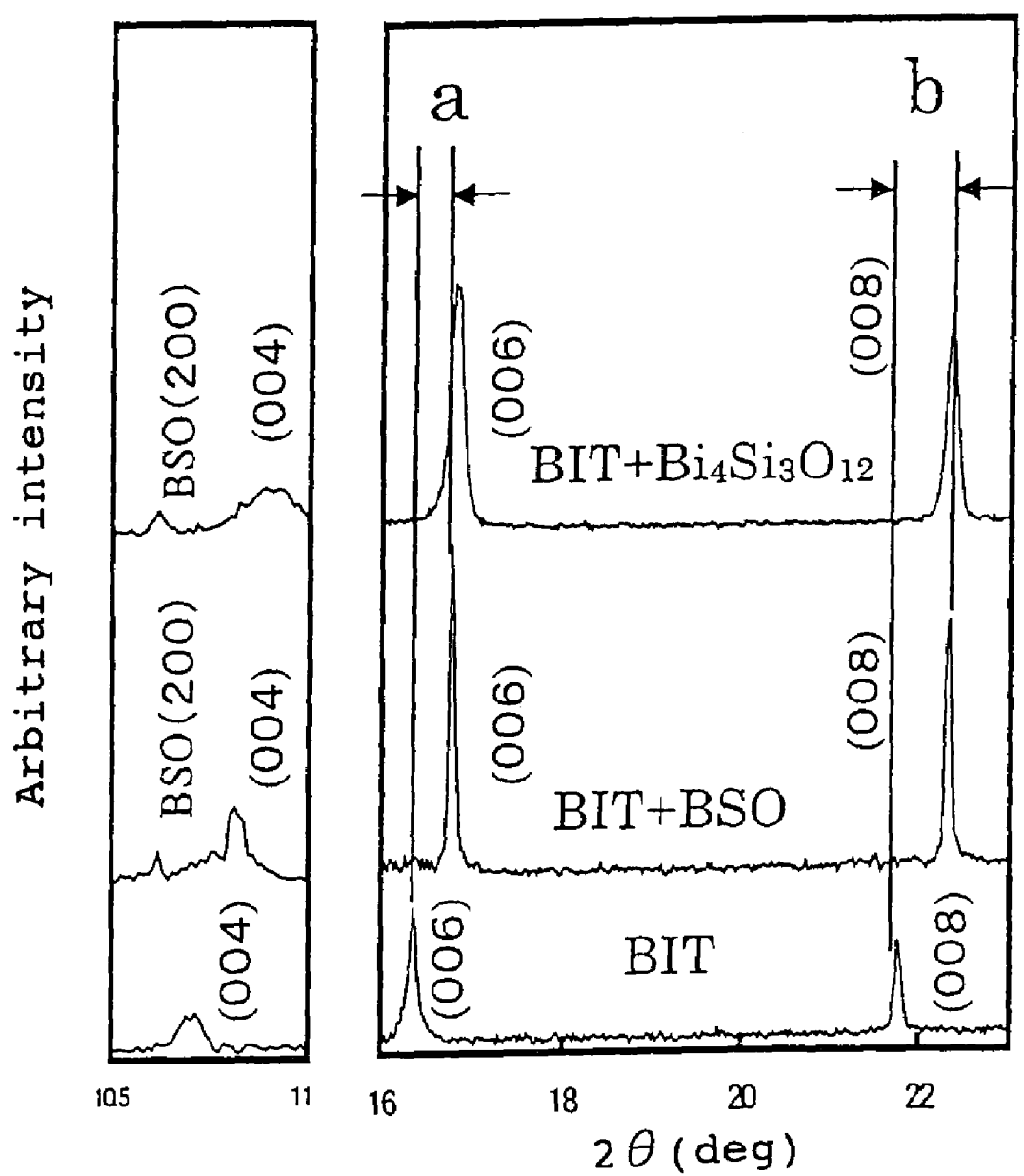
FIG. 23 is a diagram comparing the XRD patterns of a BIT+$Bi_4Si_3O_{12}$ and BIT+SBO thin films according to the invention and a BIT thin film.

XRD patterns at this time is shown in FIG. 23. Comparison was made by using XRD patterns of the BIT+BSO of R=0.4 produced in the foregoing example and the conventional BIT. The baking temperature for the $Bi_4Si_3O_{12}$-added BIT and the BIT+BSO according to the invention was 600° C., and that for the conventional BIT was 700° C.

In the case of the $Bi_4Si_3O_{12}$-added BIT and the BIT+BSO according to the invention, all the peaks are shifted to the side of large angles in comparison to the conventional BIT, and the crystals of the $Bi_4Si_3O_{12}$-added BIT and the BIT+BSO have a contracted structure by compressing by about 8% (2%×2%×2%) over the entire crystals in comparison to the BIT. This exhibits the presence of a considerable amount of stress in the film.

According to the results of the compression experiments of $SnO_2$, $GeO_2$ and the like at high temperatures (B. B. Karki, et al., Physical Review B, "Ab initio studies of high-pressure structural transformation in silica", vol. 55, p. 3465–3471 (1997); J. Haines, et al., Physical Review B, "Phase transition in ruthenium dioxide up to 40 GPa: Mechanisms for the rutile-to-fluorite phase transformation and a model for the high-pressure behavior of stishovite $SiO_2$", vol., 48, p. 13344–13350 (1993); and J. Haines, et al., Physical Review B, "X-ray diffraction study of the high-pressure: Relationships between structure types and implications for other rutile-type dioxides", vol.55, p.11144–11154 (1997)), it has been exhibited that a compression stress of from 25 to 30 GPa is necessarily applied to the entire film in order to compress the volume of the ferroelectric crystals by about 8%, and the equivalent compression stress is applied to the thin film of the invention.

The measurement of hysteresis characteristics of the $Bi_4Si_3O_{12}$-added BIT revealed that good square hysteresis characteristics were obtained although the hysteresis shape was somewhat deteriorated. The evaluation of film fatigue characteristics of the $Bi_4Si_3O_{12}$-added BIT revealed that no film fatigue was found upon $10^{10}$ times polarization inversions.

The crystallization temperature is decreased by about 200° C. in the foregoing example. This is because of such an effect that the crystallization temperature of $Bi_2SiO_5$ (BSO) is as low as 400° C., and the lattice matching is good between the Bi oxide layer in the BSO lattice and the perovskite layer and the pseudo-perovskite layer of the ferroelectric perovskite containing $ABO_3$ or $(Bi_2O_2)^{2+}(A_{m-1}B_mO_{3m+1})^{2-}$ and the bismuth lamellar structure ferroelectric material, whereby the ferroelectric perovskite and the bismuth lamellar structure ferroelectric material are crystallized with BSO as crystalline nuclei.

Not only Si—O has high covalency, and Si is not a metallic element, but also it has been known that for an atom for replacing the constitutional element of perovskite, one having an ionic radius that is closer thereto is used. $Si^{4+}$ is 0.26 Å, which is far smaller than $Ti^{4+}$ of 0.75 Å, and thus it is difficult to nominate $Si^{4+}$ as an ion for replacing the B site ion under normal consideration. However, the replacement of the B site ions in the ferroelectric material with $Si^{4+}$ ions solves the problems associated with the conventional ferroelectric thin film.

Use of Ge-Containing Catalytic Substance

In this example, a ferroelectric material having B site ions replaced not with Si but with Ge, which is a related element of Si, i.e., the ferroelectric material having B site ions replaced with $G^{4+}$ but not $Si^{4+}$, was evaluated.

An Si substrate having Pt coated to a thickness of 100 nm was used as the substrate, a solution obtained by mixing a $Bi_4Ti_3O_{12}$ sol-gel solution containing 16% of $Bi_4Ge_3O_{12}$ is coated on the substrate to form a thin film having a thickness of 100 nm under the following film formation conditions.

(Ferroelectric Thin Film Formation Conditions)

A series of operations, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated four times, and subsequently (4) baking (crystallization) (at 550° C. for 30 minutes, RTA in oxygen) was carried out.

At this time, AFM observation of the film surface revealed that it had significantly good surface smoothness, i.e., Rmax, which indicated the most coarse part, was 2.001 nm, and Ra, which indicated smoothness over the entire film, was 1.5022 nm.

Figure 24:
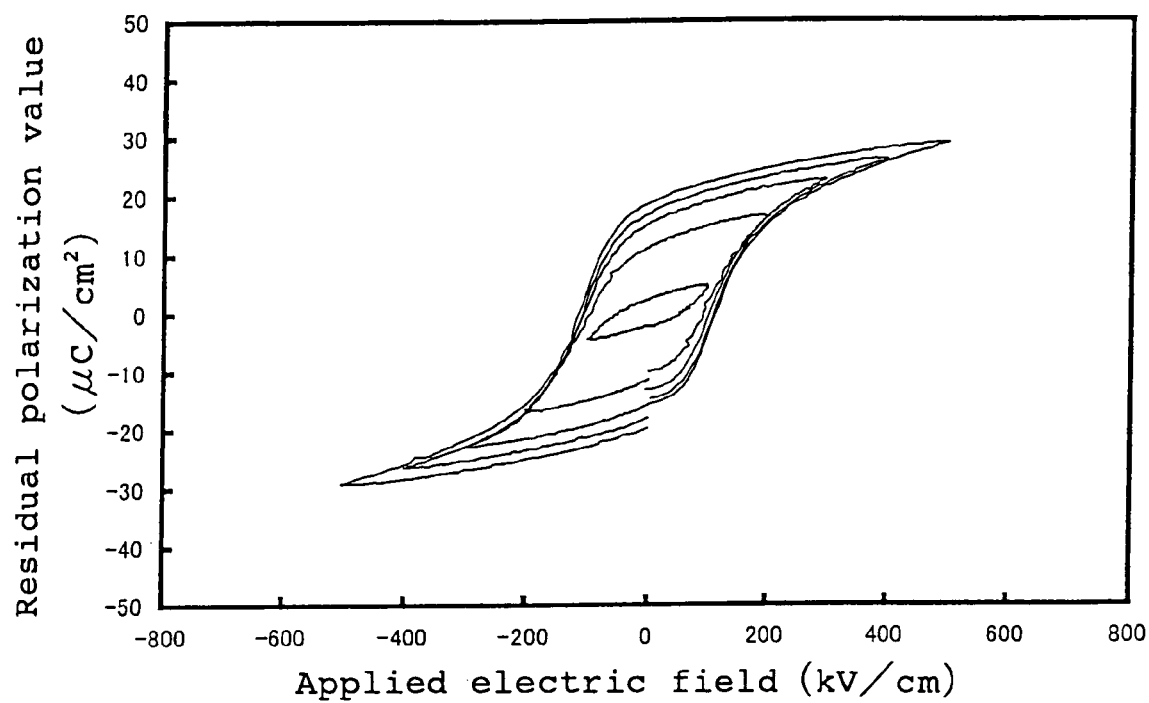
FIG. 24 is a diagram showing the D-E hysteresis characteristics of a $Bi_4Ge_3O_{12}$—$Bi_4Ti_3O_{12}$ ferroelectric thin film having a thickness of 100 nm according to the invention.

A Pt upper electrode is formed, and evaluation of the $Bi_4Ge_3O_{12}$—$Bi_4Ti_3O_{12}$ ferroelectric thin film having a thickness of 100 nm according to the invention was carried out for ferroelectric characteristics by using the upper Pt and the lower Pt. The results are shown in FIG. 24. The D-E hysteresis characteristics was as good as Pr=19 μC/cm$^2$.

Figure 25:
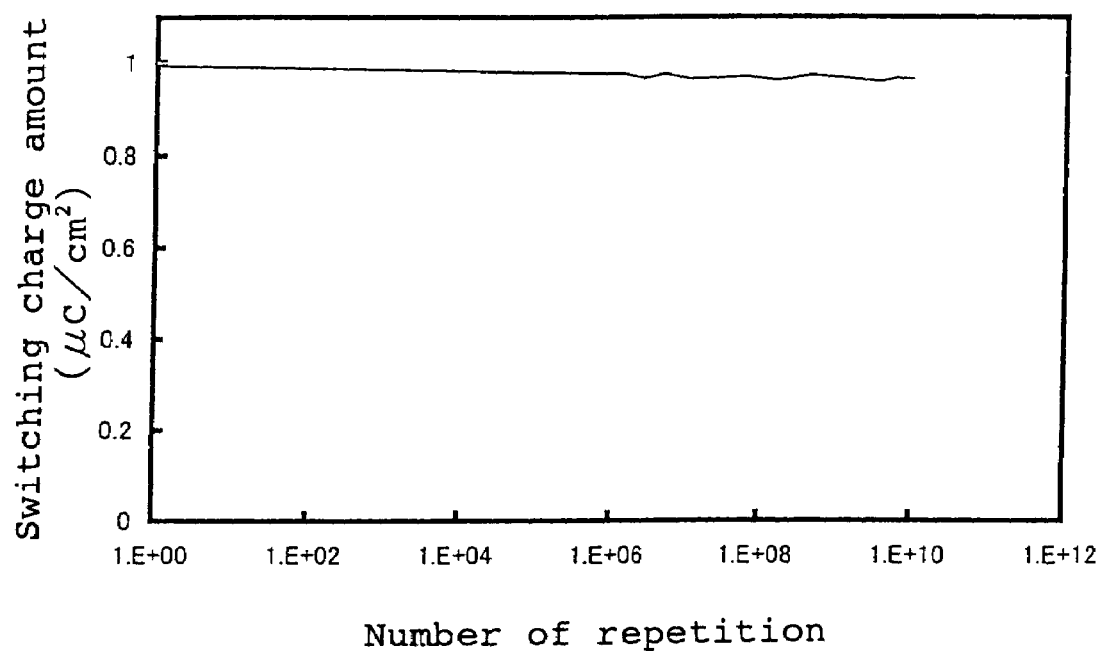
FIG. 25 is a diagram showing the film fatigue characteristics after $10^{10}$ times polarization inversions of the $Bi_4Ge_3O_{12}$—$Bi_4Ti_3O_{12}$ ferroelectric thin film having a thickness of 100 nm according to the invention.

The fatigue characteristics were also evaluated. The results thereof are shown in FIG. 25. Substantially no film fatigue was found after $10^{10}$ times repeated polarization inversions, and it was found that good fatigue characteristics were exhibited.

As described in the foregoing, it was found that $Ge^{4+}$ exhibits the effect of replacement of the B site ions as similar to $Si^{4+}$. Therefore, $Bi_2GeO_5$ can be used as similar to $Bi_2SiO_5$. Solid Solutions of $Bi_2SiO_5$ (BSO) and $Bi_4Ti_3O_{12}$ (BIT), and $Bi_2SiO_5$ (BSO) and $SrBi_2Ta_2O_9$ (SBT)

BIT having an LSO sol-gel solution using n-propanol as a solvent added thereto at R=0.4, and SBT having the same added thereto at R=0.33 were coated by a spin coating method to a thickness of 25, 50 or 100 nm.

An ultrathin film having a thickness of 10 nm was simultaneously formed by using a $Bi_{3.25}La_{0.75}Ti_3O_{12}$ (BLT) sol-gel solution having BSO at R=0.4.

(Ferroelectric Thin Film Formation Conditions)

A series of operations, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated four times, and subsequently (4) baking (crystallization) (BIT: at 550° C., SBT: at 600° C., for 10 minutes, RTA in oxygen) was carried out.

In the case of a thickness of 25 nm, coating was once carried out. In the case of a thickness of 50 nm, coating was twice carried out. In the case of a thickness of 100 nm, coating was four times carried out. In the case of the 10 nm BLT thin film, coating was once carried out, and the rotation number upon coating was increased to 7,000.

Subsequently, an upper Pt electrode (100 μm) was formed as similar to the foregoing example, and P-E hysteresis characteristics were evaluated. As shown in FIGS. 26 and 27, good hysteresis characteristics were obtained.

As shown in FIG. 26, the hysteresis characteristics upon applying the common applied electric field of 500 kV/cm were Pr=15 to 18 $\mu C/cm^2$ and Ec=100 kV/cm or less for BIT, and Pr=11 $\mu C/cm^2$ or less and Ec=60 to 70 kV/cm for SBT, which showed good agreements.

As shown in FIG. 27, in the case where the applied voltage was scaled on the abscissa axis, the coercive voltage for a thickness of 100 nm, 50 nm and 25 nm was 1 V, 0.5 V and 0.25 V for BIT and 0.7 V, 0.35 V and 0.2 V for SBT, which changed in substantial proportion.

Figure 28:
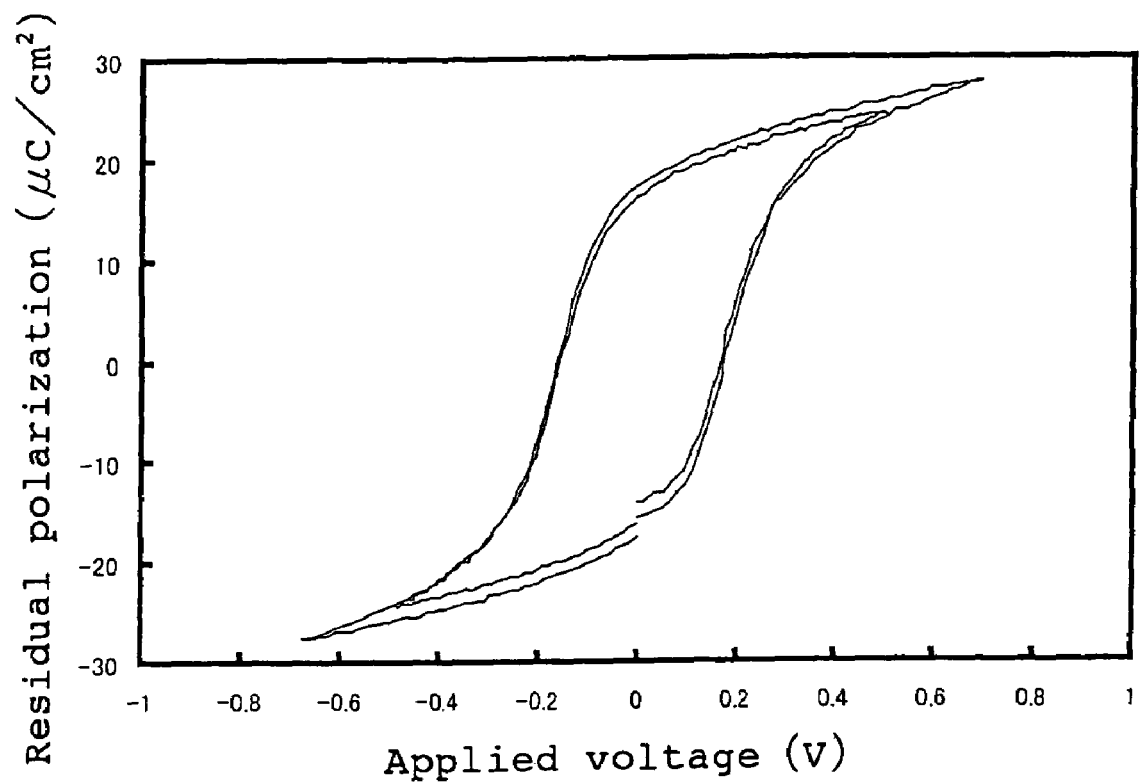
FIG. 28 is a diagram showing the P-E hysteresis characteristics of BSO-added BLT having a thickness of 10 nm according to the invention, and showing an applied voltage at an axis of abscissa.

The hysteresis characteristics of the 10 nm BSO-BLT are shown in FIG. 28. It was saturated at an applied voltage of 0.5 V and was Pr=16 $\mu C/cm^2$ and Ec=100 kV/cm, and Pr=17 $\mu C/cm^2$ and Ec=120 kV/cm at an applied voltage of 0.7 V. In other words, it shows that a memory element that can be used at a driving voltage of 0.5 V can be provided by using BSO-BLT having a thickness of 10 nm.

It is understood from the foregoing that reduction in thickness is effective to lower the driving voltage of the ferroelectric memory. That is, such an extent of reduction in thickness of a ferroelectric material can be realized that has not yet been attained, and a ferroelectric ultrathin film for a highly integrated memory of a Mbit level can be obtained.

This is an effect of forming crystalline nuclei on all the interfaces present in the film until the calcination step by using the invention, and because the uppermost interface among these can be effectively used for crystallization of the ferroelectric thin film, dense and flat surface morphology, which is most important for reducing the thickness, can be provided.

Ferroelectric Characteristics Under Change of Amount of IV Group Element-containing Catalytic Substance in Solid Solution A sol-gel solution formed by adding LSO to a BIT sol-gel solution at R=0.2 was used as a base, and BSO gel was further added thereto to produce five kinds of mixed sol-gel solutions of R=0.2 (BSO=0), R=0.4 (BSO=0.2), R=0.8 (BSO=0.6) R=1.6 (BSO=1.4) and R=3.2 (BSO=3.0).

The mixed sol-gel solution was coated on a $Pt/Ti/SiO_2/Si$ substrate by a spin coating method to form a ferroelectric thin film under the following film forming conditions.

The backing conditions were at 500° C. for 10 minutes, and the thickness was 100 nm in all the cases.

(Ferroelectric Thin Film Formation Conditions)

A series of operations, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated four times, and subsequently (4) baking (crystallization) (at 500° C. for 15 minutes, RTA in oxygen) was carried out.

Figure 29:
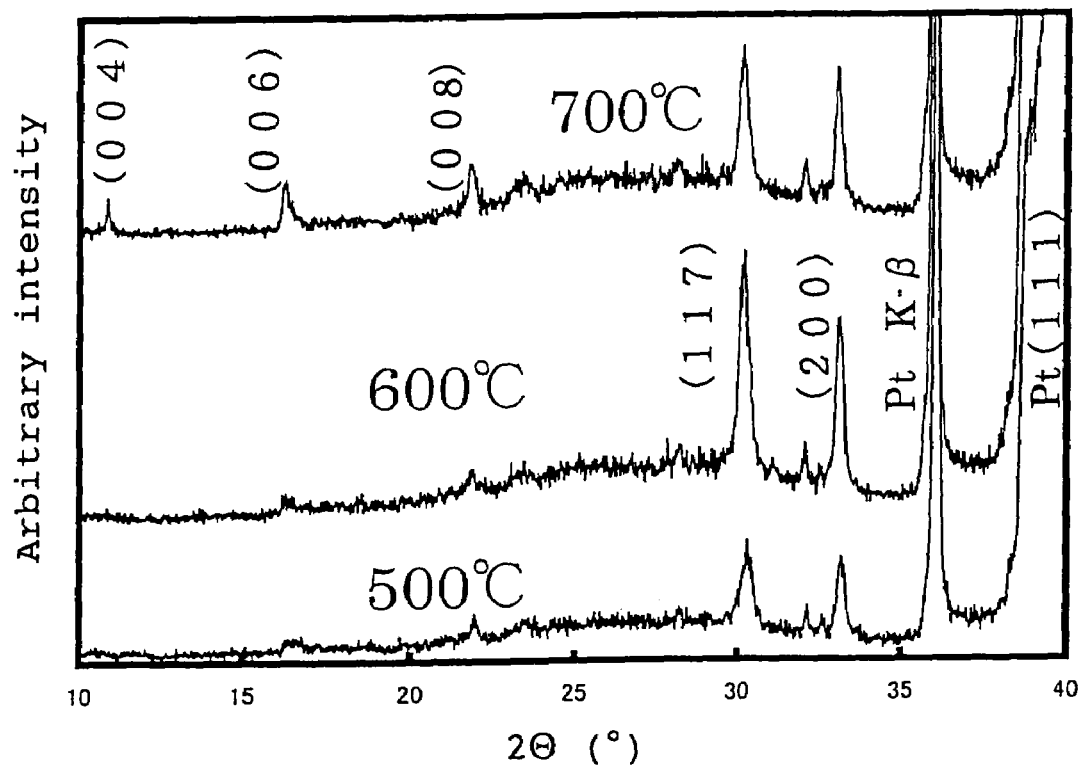
FIG. 29 is a diagram showing the XRD patterns of a BIT film of R=0.4 (BSO=0.2), which is an LSO-added BIT thin film.

The XRD pattern of the BIT film of R=0.4 (BSO=0.2) revealed good crystallinity at a substrate temperature of 500° C. as shown in FIG. 29.

Figure 30:
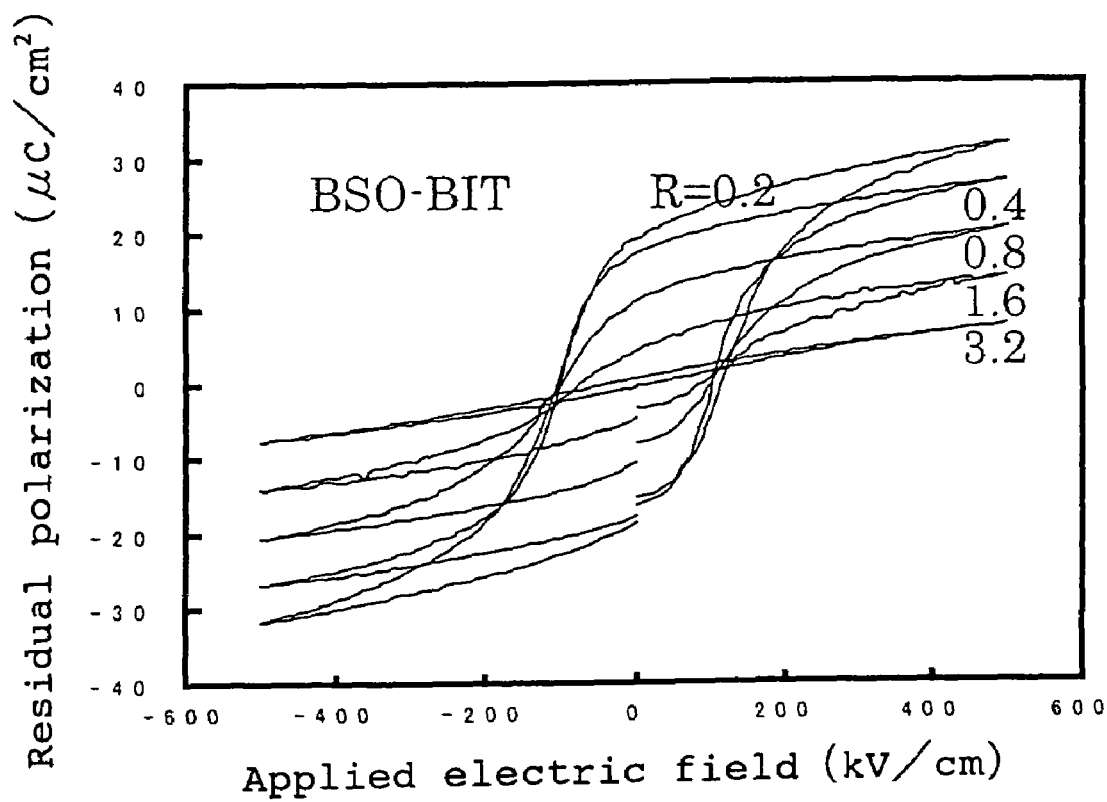
FIG. 30 is a diagram showing change of hysteresis characteristics of an LSO-added BIT thin film according to the invention upon changing R=0.2 (BSO=0), R=0.4 (BSO=0.2), R=0.8 (BSO=0.6), R=1.6 (BSO=1.4) and R=3.2 (BSO=3.0).

The hysteresis characteristics of five kinds of BIT capacitors crystallized at 500° C. show such a change that Pr was decreased inversely proportional to decrease of R as shown in FIG. 30.

In the case where a dielectric material is added to a ferroelectric material, conventionally, it often adversely affects only with an addition of several percents. This is because many of dielectric materials have a smaller dielectric constant than a ferroelectric material, and thus almost the applied voltage is applied to the dielectric layer added in an amount of several percents, whereby good ferroelectric characteristics cannot be obtained.

In the invention, however, in the case where BSO or LSO is added to a ferroelectric material, the characteristics of the ferroelectric material used as a base can be obtained to the maximum extent, and most of the problems associated with the conventional ferroelectric materials can be removed.

When BSO or LSO is added to R=1.6 beyond the molar concentration of the ferroelectric material as a base, various kinds of ferroelectric characteristics with different Ec and Pr can be obtained.

Furthermore, in the case of R=3.2 where almost the entire body is constituted with a dielectric material, it is found that a high dielectric film having a dielectric constant of about 200 is obtained although ferroelectricity is not exhibited.

In addition to the effect of realization of the ultrathin film in the foregoing example, the invention can provide such a thin film that has arbitrary dielectric characteristics depending on purposes, i.e., from a good dielectric material to a capacitor material for DRAM and a high dielectric gate oxide film material for a ultrafine transistor.

That is, as described in the foregoing example, the values of Ec and Pr can be arbitrarily controlled in the case where BSO or LSO is added in an amount beyond the molar concentration of the ferroelectric material as a base, which evidences the formation of a solid solution.

The ferroelectric characteristics of PZT (Zr/Ti=52/48) having BSO added in a ratio R=0.025, 0.05, 0.1 and 0.2 were measured.

The film formation was carried out under the following conditions.

A series of operations, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated four times to obtain a thickness of 100 nm, and subsequently (4) baking (crystallization) (at 500° C. for 10 minutes, RTA in oxygen at 1 $kg/cm^2$) was carried out. Furthermore, an upper platinum electrode is formed, and (5) post annealing (at 500° C. for 5 minutes, RTA in oxygen at 1 $kg/cm^2$ or 2 $kg/cm^2$) was carried out.

Figure 31:
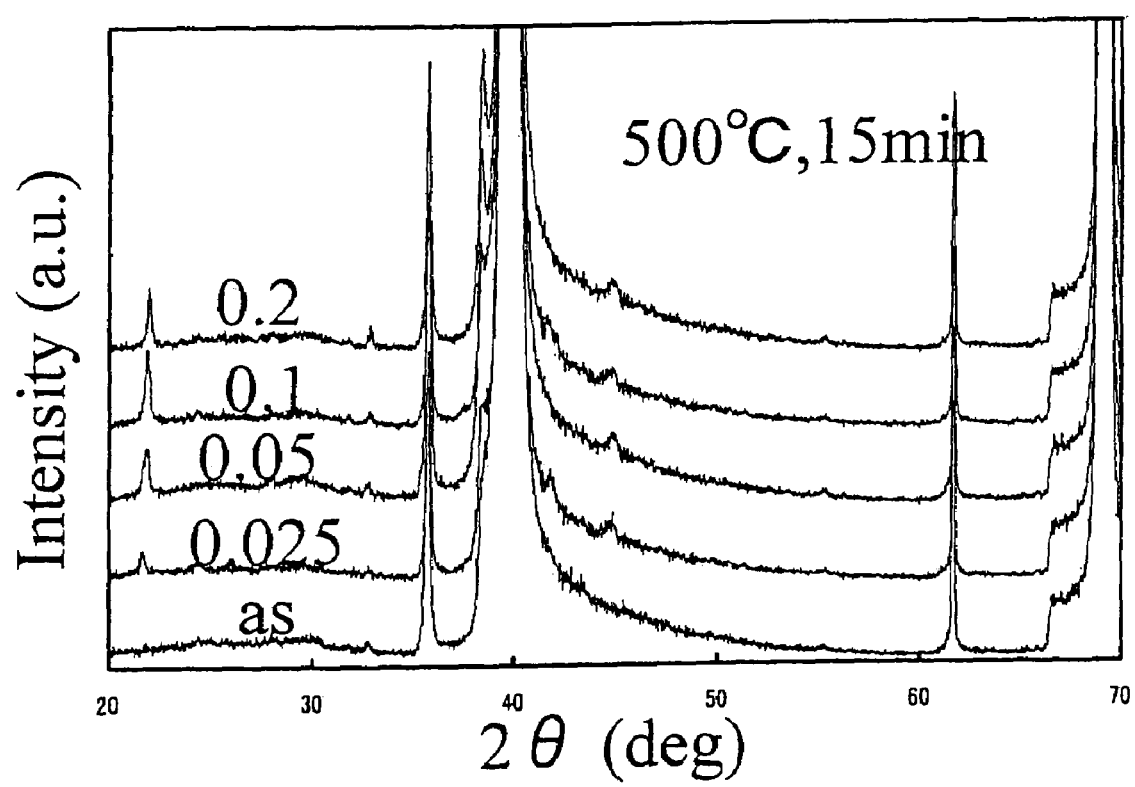
FIG. 31 is a diagram showing the XRD patterns of a PZT film of R=0.025 to 0.2 in a BSO-added PZT thin film according to the invention.

As seen by the XRD pattern shown in FIG. 31, the addition of a small amount, R=0.025, of BSO exhibited good crystallinity.

Good surface morphology was confirmed in all the cases, which revealed that PZT crystalline nuclei were formed at a high density over the entire film.

Figure 32:
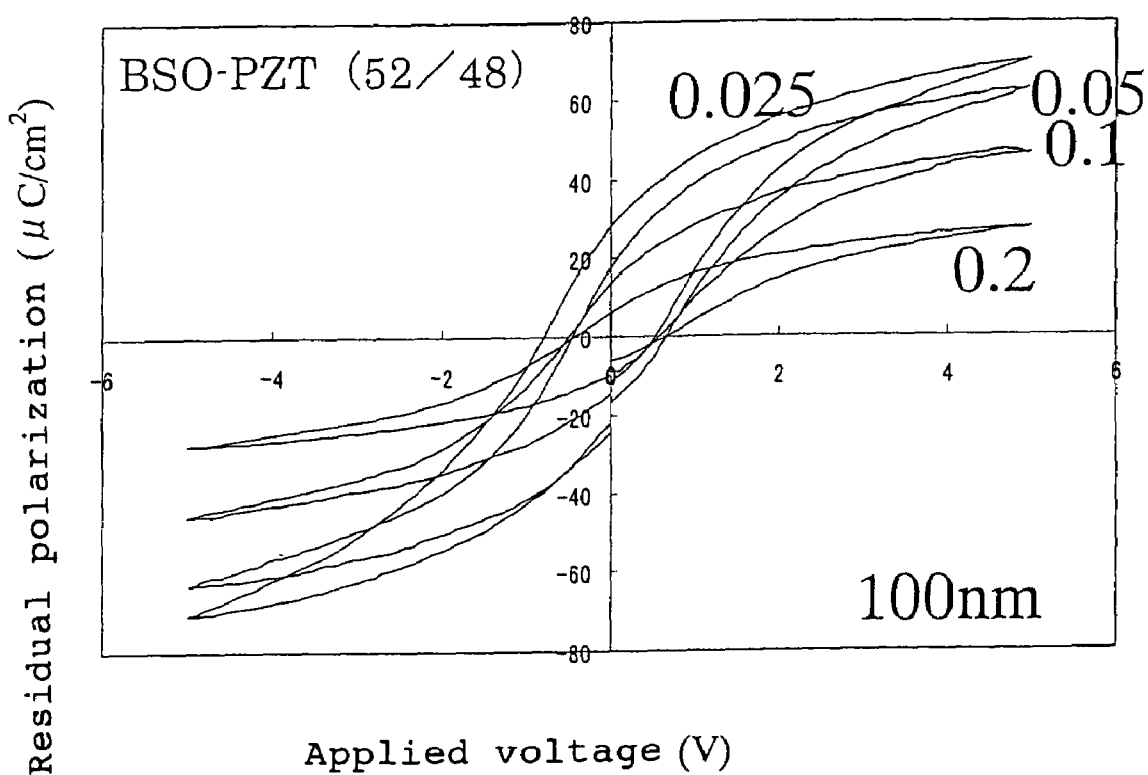
FIG. 32 is a diagram showing the hysteresis characteristics of the thin film shown in FIG. 31.

Upon measurement of hysteresis characteristics, various kinds of hysteresis characteristics as similar to BIT were confirmed depending on the addition amounts as shown in FIG. 32. This evidences that PZT and BSO form a solid solution.

Finally, in the case where the calcination temperature is 300° C., BSO is not crystallized, but amorphous BSO, from which only the organic components are removed, can be utilized.

In the case of a bismuth ferroelectric material, the $Bi_2O_3$ layer in BSO can be utilized as a part of the $Bi_2O_3$ layer of the bismuth lamellar structure ferroelectric material, but in the case of PZT, which is a perovskite ferroelectric material, it is necessary that Bi is introduced into A sites.

Introduction of Bi into A sites of a crystallographic system from an amorphous phase is easier than transformation of a certain crystallographic system to a different crystallographic system. An amorphous phase has regularity among constitutional atoms, and it sufficiently exerts such a function that selectively crystallizes PZT. Furthermore, upon comparison of crystals, the amorphous phase has a larger surface area, and thus it has been exhibited that the amorphous phase sufficiently has a catalytic effect.

EXAMPLE 4

In this example, solid solution thin films of various kinds of catalytic substances with BIT, SBT and PZT were formed.

All the sol-gel solutions for forming a ferroelectric thin film had a concentration of 5% by weight, and all the sol-gel solutions for forming a catalytic substance had a concentration of 0.3% by weight. Both the solutions were mixed to form a raw material solution. The sol-gel solution was applied on a Pt/Ti/SiO$_2$/Si substrate by a spin coating method to form a thin film having a thickness of 20 nm under the following film formation conditions. The mixing molar ratios were R=0.4 for BIT, R=0.33 for SBT, and R=0.2 for PZT.

(Thin Film Formation Conditions)

A series of operations, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated four times to obtain a thickness of 100 nm, and subsequently (4) baking (crystallization) (at 600° C. for 15 minutes, RTA in oxygen at 1 kg/cm$^2$) was carried out. An upper platinum electrode is formed, and (5) post annealing (at 500° C. for 5 minutes, RTA in oxygen at 1 kg/cm$^2$ or 2 kg/cm$^2$) was carried out.

Figure 33:
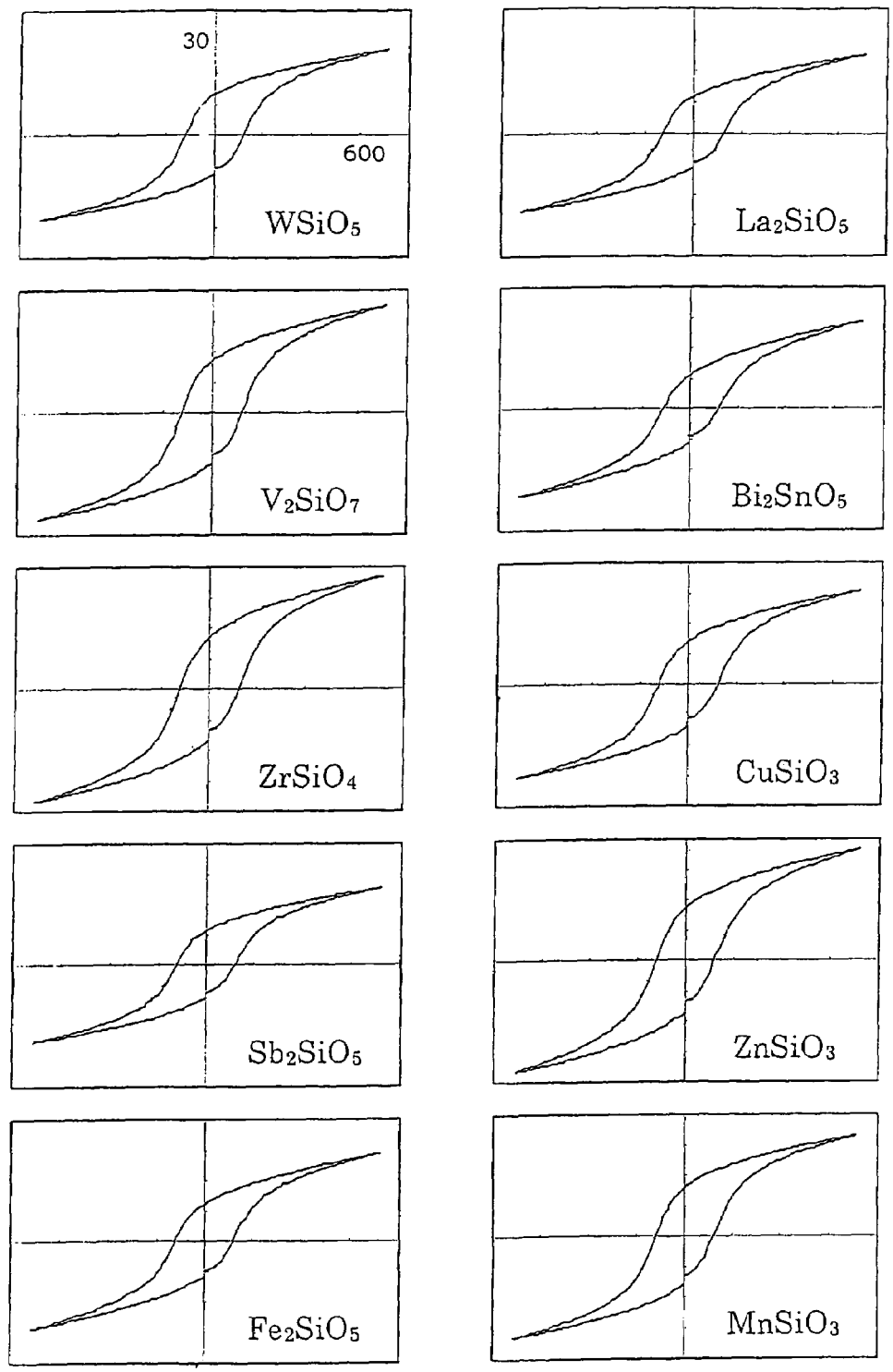
FIG. 33 is a diagram showing the ferroelectric characteristics of solid solution thin films of various kinds of catalytic substances with BIT.
Figure 34:
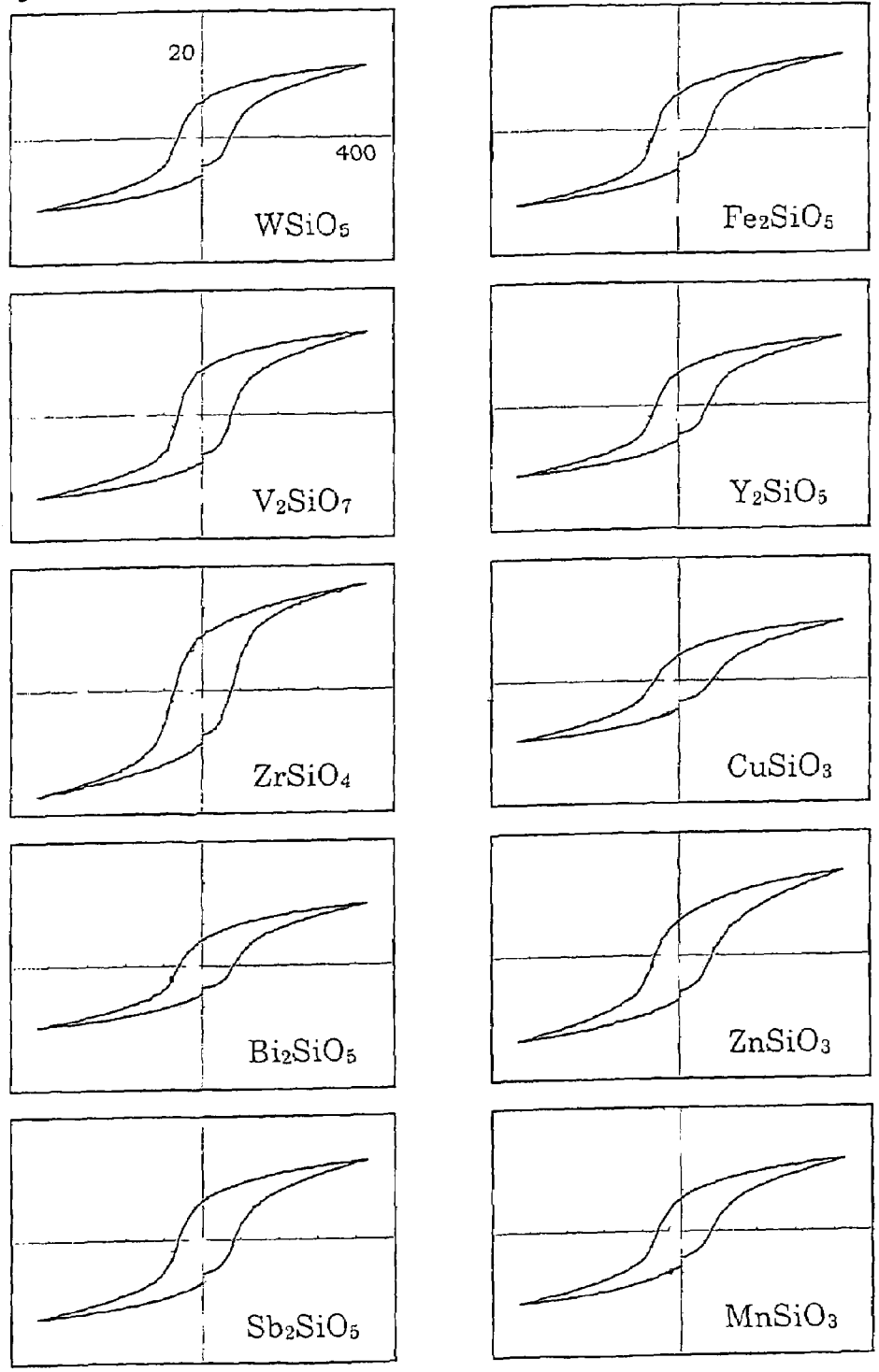
FIG. 34 is a diagram showing the ferroelectric characteristics of solid solution thin films of various kinds of catalytic substances with SBT.
Figure 35:
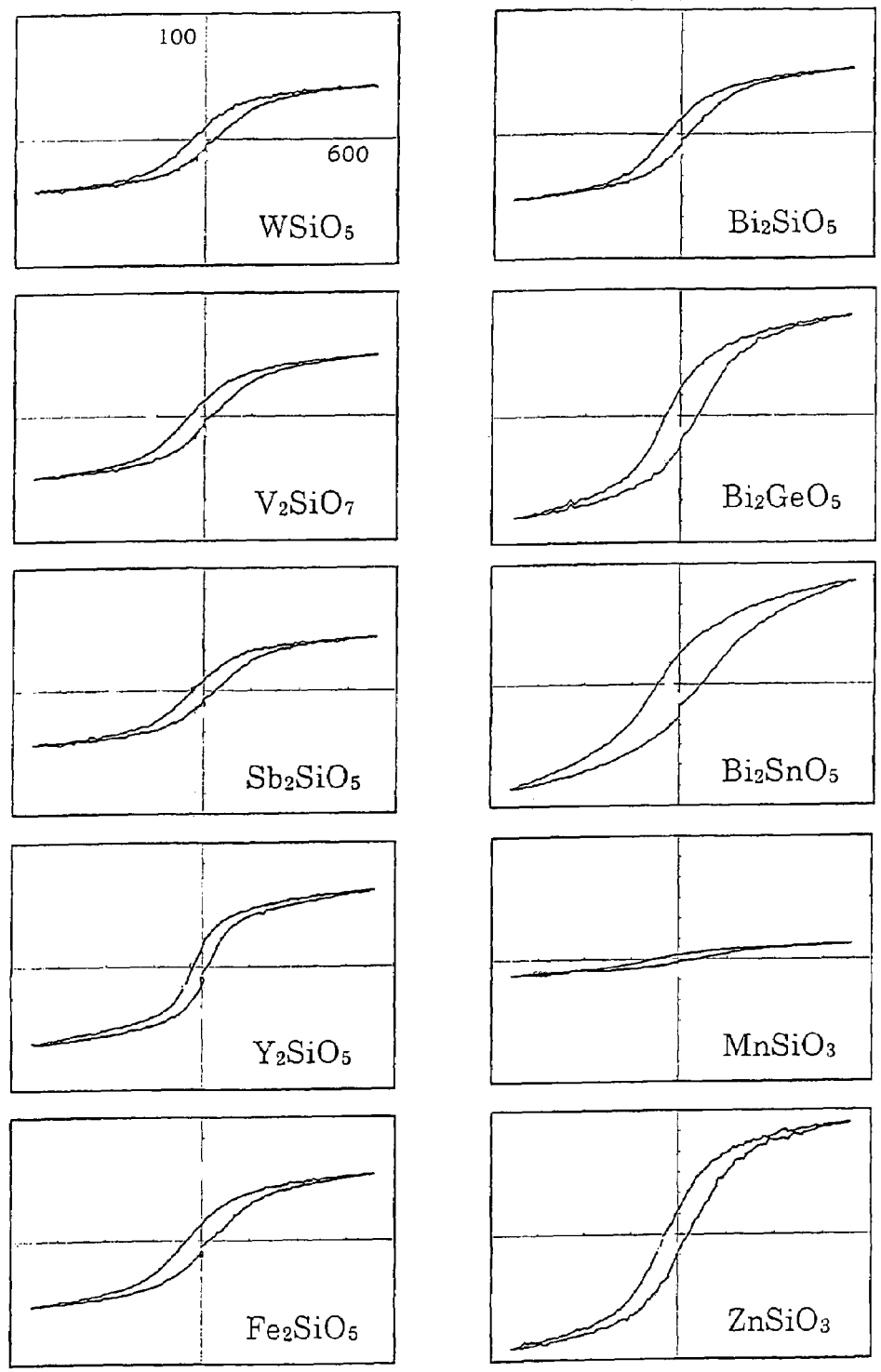
FIG. 35 is a diagram showing the ferroelectric characteristics of solid solution thin films of various kinds of catalytic substances with PZT.

All the thin films obtained herein were crystalline films having a thickness of 70 nm and exhibited good ferroelectric characteristics as shown in FIGS. 33 to 35.

EXAMPLE 5

A BSO sol-gel solution having a concentration of 0.1% by weight was mixed with a BST sol-gel solution having a concentration of 5% by weight at a ratio R=0.2 to form a raw material solution. The sol-gel solution was applied to a Pt/Ti/SiO$_2$/Si substrate by a spin coating method to form a thin film having a thickness of 20 nm under the following film formation conditions.

(High Dielectric Thin Film Formation Conditions)

(1) Spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were carried out, and subsequently (4) baking (crystallization) (at 600° C. for 15 minutes, RTA in oxygen at 1 kg/cm$^2$) was carried out. An upper platinum electrode is formed, and (5) post annealing (at 500° C. for 5 minutes, RTA in oxygen at 1 kg/cm$^2$) was carried out.

Figure 36:
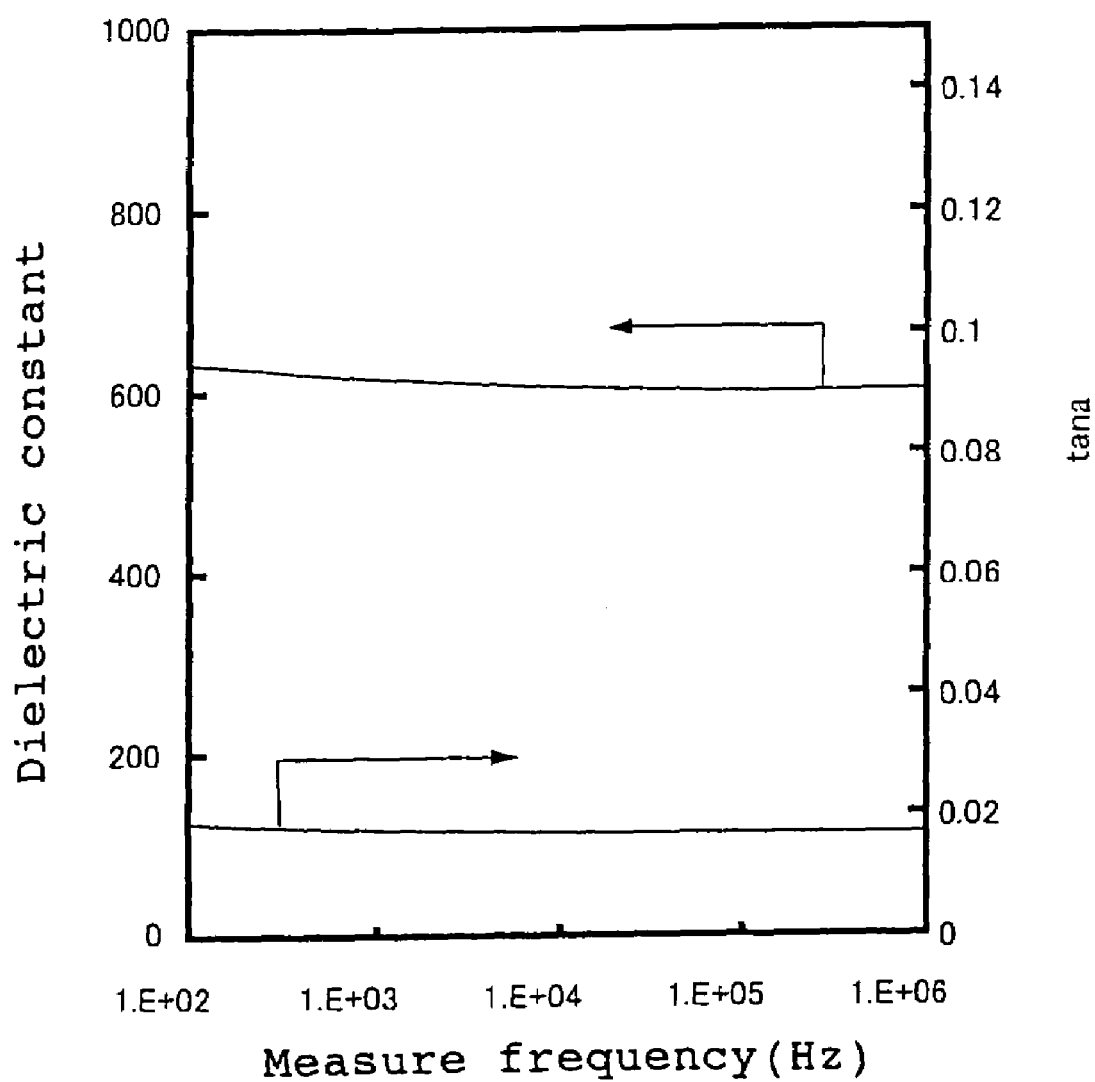
FIG. 36 is a diagram showing the electric characteristics of a BSO—BST (R=0.2) thin film.

The thin film obtained herein was a crystalline film having a thickness of 20 nm in good conditions and had electric characteristics as shown in FIG. 36. A dielectric constant of about 600 was obtained, which was equivalent to that of a bulk material.

A BSO sol-gel solution having a concentration of 0.3% by weight was mixed with a Bi2223 sol-gel solution having a concentration of 2% by weight at a ratio R=0.4 to form a raw material solution.

The sol-gel solution was applied to an Si (100) substrate, a spontaneous oxide film of which had been removed, by a spin coating method to form a thin film having a thickness of 20 nm under the following film formation conditions.

(Superconductive Thin Film Formation Conditions)

(1) Spin coating (at 500 rpm for 5 seconds and 4,000 rpm for 20 seconds), (2) drying (in the atmosphere at 150° C. for 2 minutes) and (3) calcination (in the atmosphere at 400° C. for minutes) were carried out, and subsequently (4) baking (crystallization) (at 700° C. for 1 minute, RTA in oxygen at 1 kg/cm$^2$) was carried out. An upper platinum electrode is formed, and (5) post annealing (at 500° C. for 5 minutes, RTA in oxygen at 1 kg/cm$^2$) was carried out.

Figure 37:
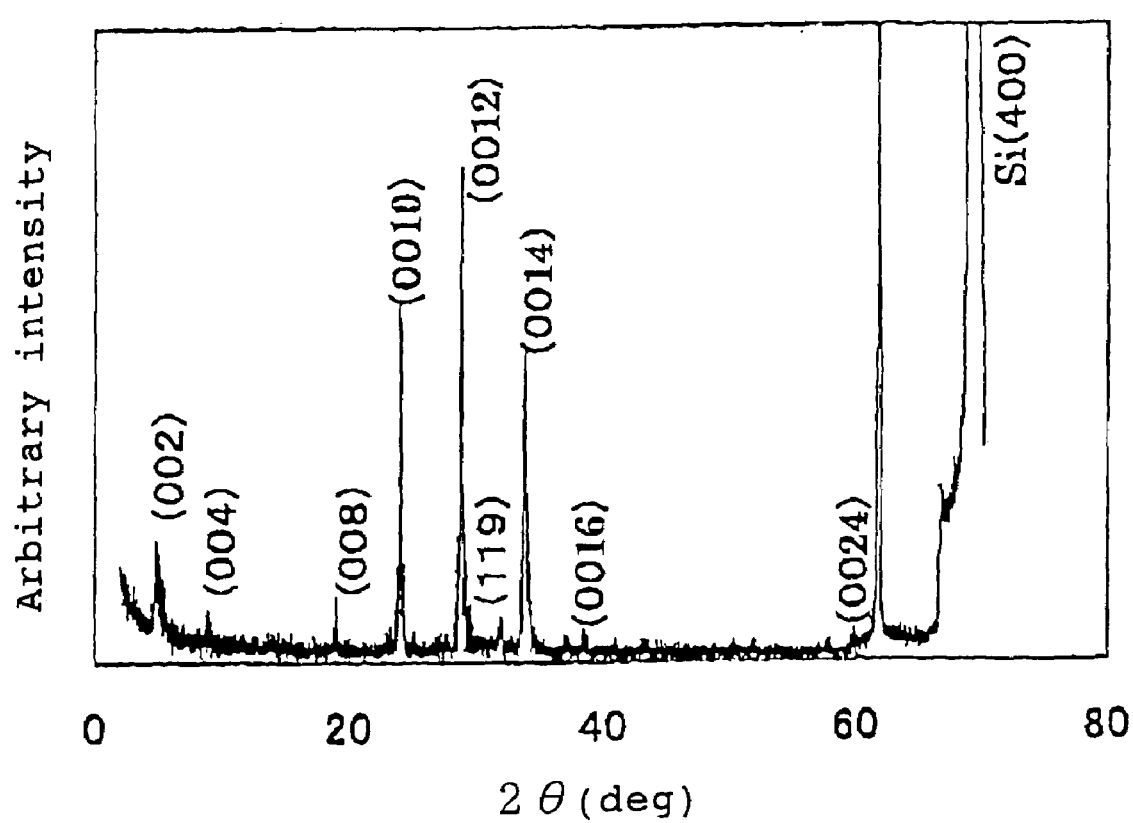
FIG. 37 is a diagram showing the XRD pattern of a BSO—$Bi_2Sr_2Ca_2Cu_3O_x$ (Bi2223) crystal.

The thin film obtained herein was a crystalline film having a thickness of 15 nm in good conditions and was constituted with a Bi2223 single phase as shown in FIG. 37.

BST is expected as a gate oxide film material as an alternative of $SiO_2$ for a next-generation DRAM, and has been continuously studied in recent 10 years or more (Kazuhide Abe and Shuichi Komatsu, Jpn. J. Appl. Phys., vol. 33, p. 5297–5300 (1994)). In a $Ba_{0.5}Sr_{0.5}TiO_3$ (BST) perovskite high dielectric material and a $Bi_2Sr_2Ca_2Cu_3O_x$ (Bi2223) superconductive oxide material, they can be used as a thin film having good characteristics by using a solid acid catalytic substance.

EXAMPLE 6

As shown in FIG. 38(a), a BSO—BIT thin film was formed by a sol-gel process on a Si substrate having an amorphous $Si_3N_4$ coating having a thickness of 1.8 nm. The ferroelectric thin film had a thickness of 150 nm.

As similar to the foregoing, a series of operation, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated three times. Subsequently (4) baking (crystallization) (at 500° C. for 30 minutes, RTA in oxygen at 1 kg/cm$^2$) was carried out, and an upper platinum electrode was formed.

Figure 39:
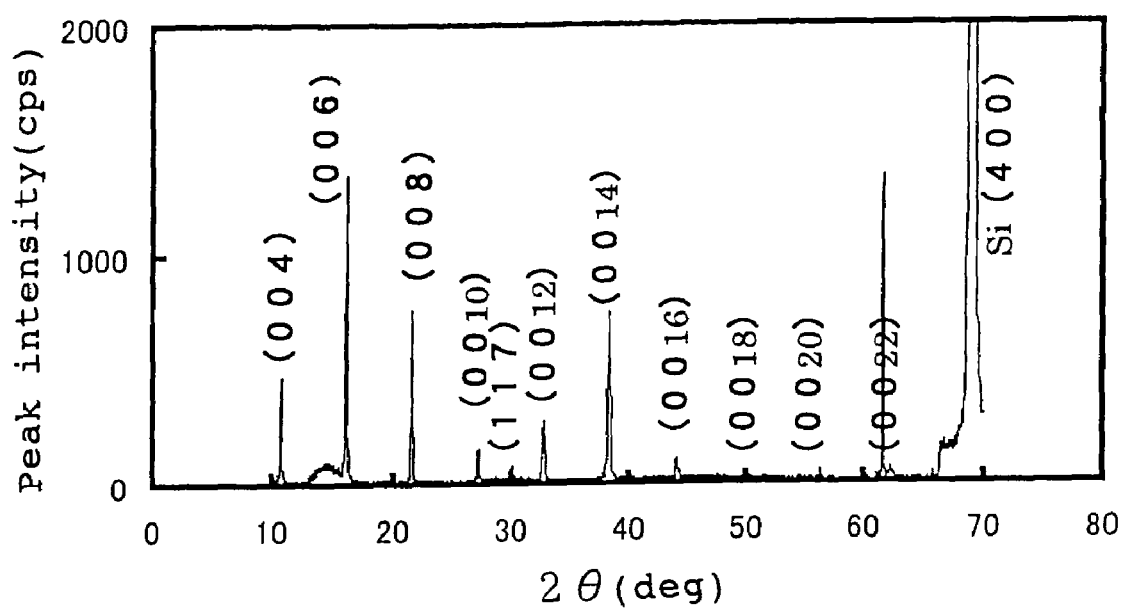
FIG. 39 is a diagram showing the XRD pattern of a BIT—BSO crystal.
Figure 40:
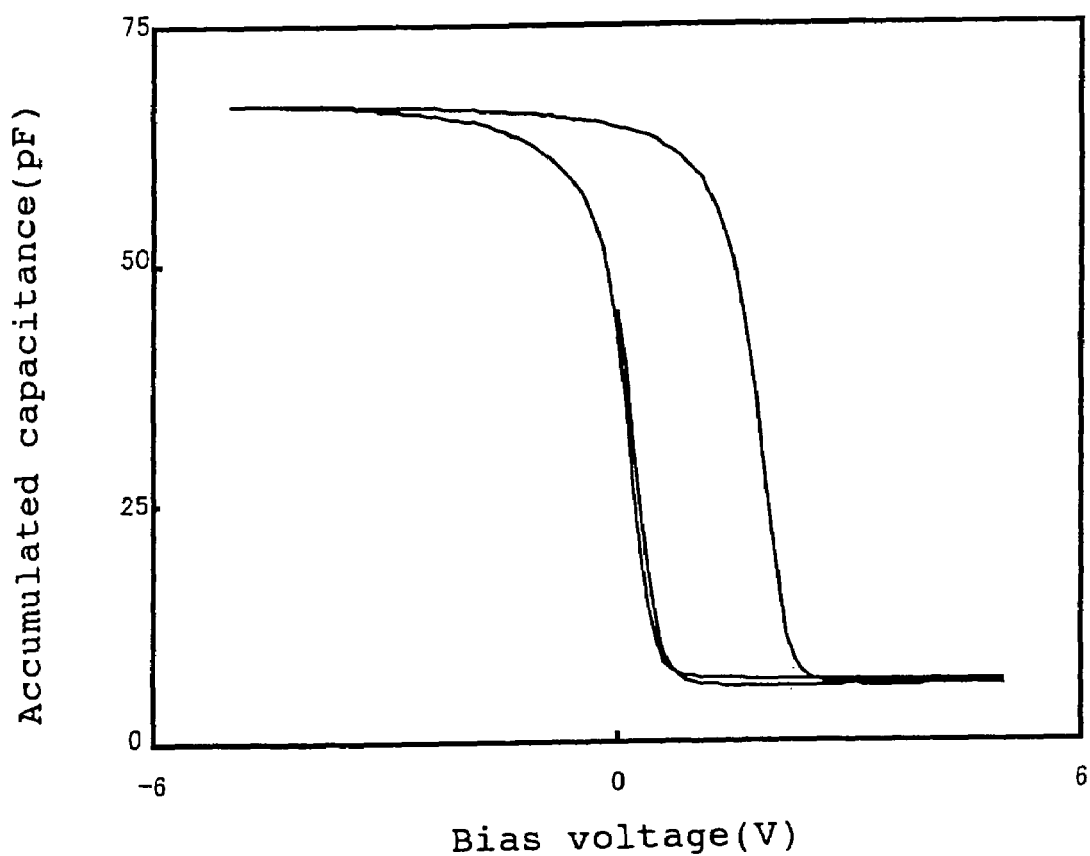
FIG. 40 is a diagram showing the diode characteristics of an element using the oxide material thin film of FIG. 39.

The resulting BIT—BSO thin film exhibited good crystallinity as shown in FIG. 39, and good diode characteristics were obtained as shown in FIG. 40.

On a single crystal Si(100) substrate, a mixed solution of a SBT sol-gel solution and a BSO sol-gel solution (R=0.33) was subjected to the following operations, i.e., a series of operation, (1) spin coating (at 500 rpm for 5 seconds and 4,000 rpm for 20 seconds), (2) drying (in the atmosphere at 150° C. for 2 minutes) and (3) calcination (in the atmosphere at 400° C. for 5 minutes) were repeated three times, and subsequently (4) baking (crystallization) (at 600° C. for 30 minutes, RTA in oxygen at 1 kg/cm$^2$) was carried out.

Figure 41:
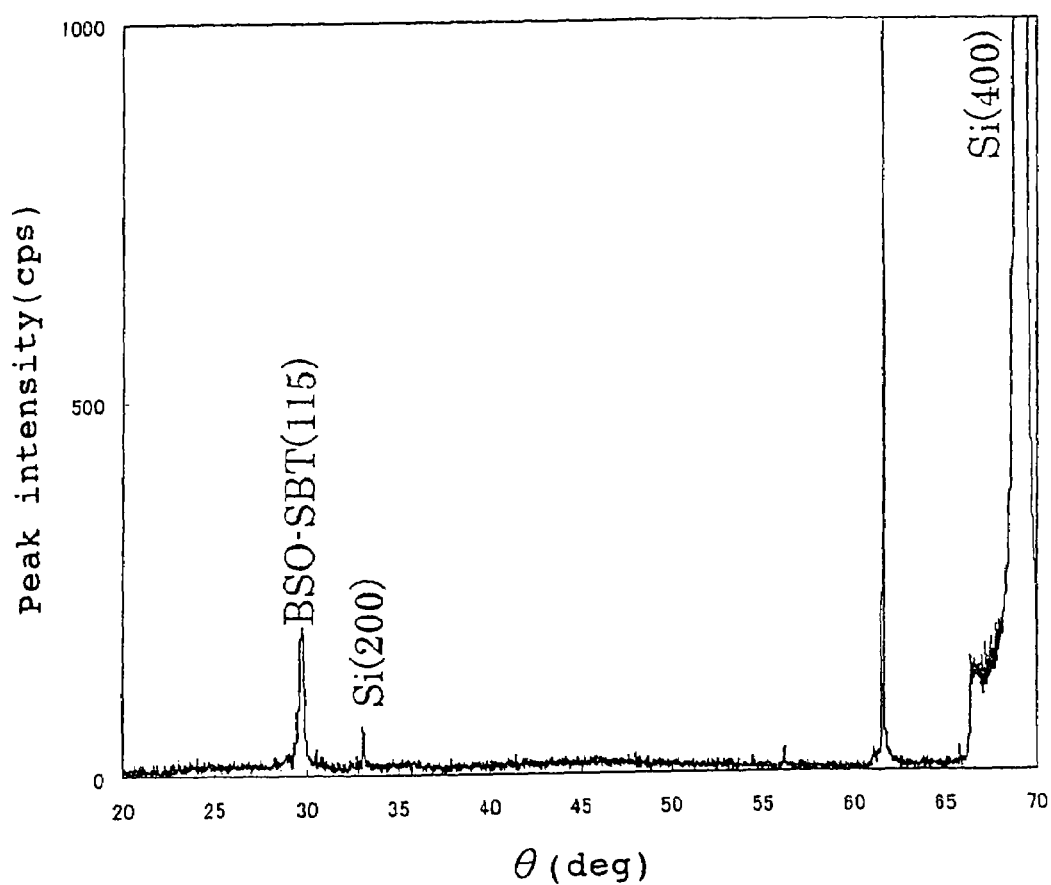
FIG. 41 is a diagram showing the XRD pattern of an SBT—BSO crystal.

Good crystallinity was exhibited at this time as shown in FIG. 41.

Figure 42:
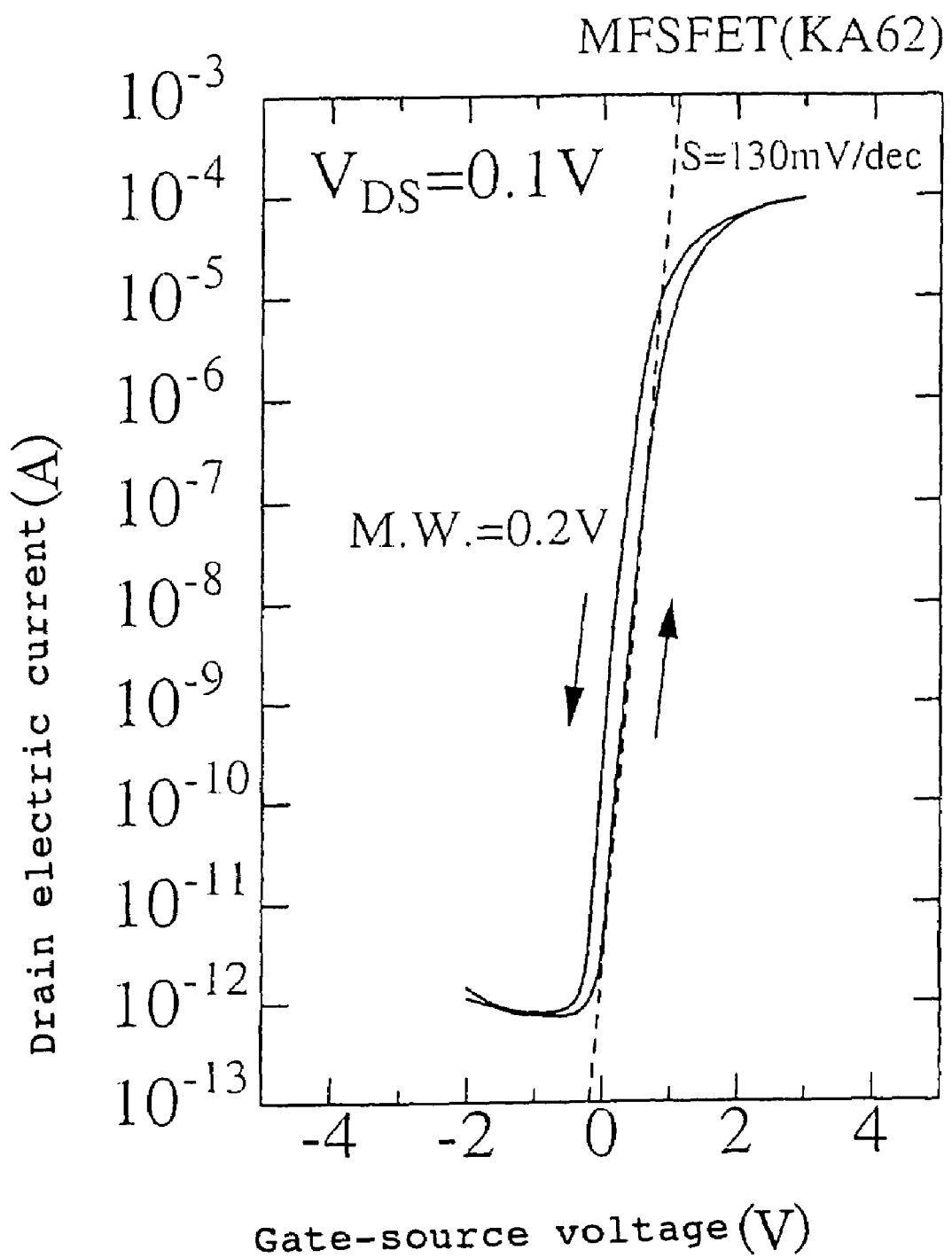
FIGS. 42 and 43 are diagrams showing the transistor characteristics of a transistor using the oxide material film of FIG. 41.
Figure 43:
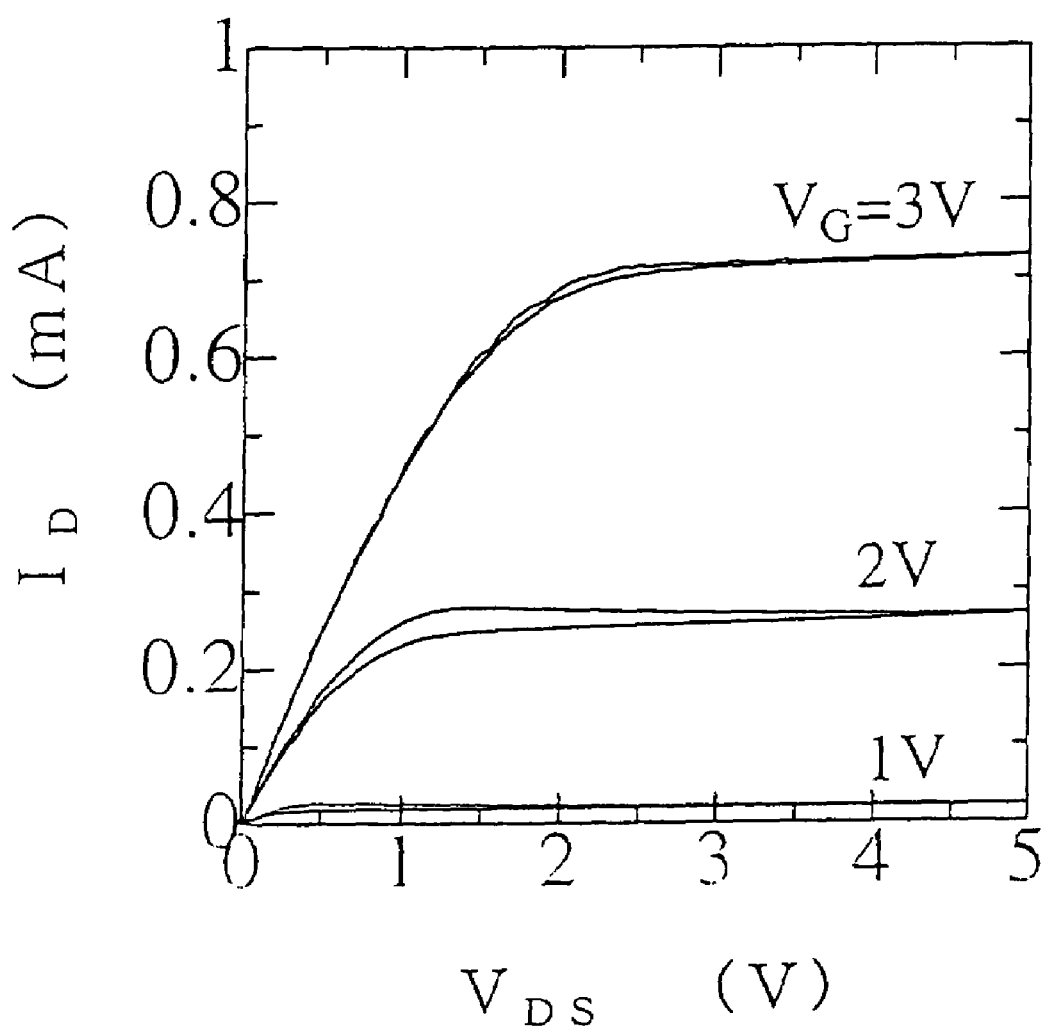

An Al/BSO—SBT/Si transistor shown in FIG. 38(b) was then produced, and thus good transistor characteristics were obtained as shown in FIGS. 42 and 43.

The oxide material of the invention can be used in an integrated circuit as a part of constitution of an optical modulator, an ultrasonic sensor, an infrared linear sensor, a capacitor for DRAM and MMIC, a ferroelectric device or a semiconductor device. For example, it is possible that a ferroelectric element is applied to a capacitor part of a nonvolatile memory, or a ferroelectric element is applied to a gate of an FET, and a gate dielectric film, a source/drain region and the like are formed in combination, so as to form an MFMIS-FET, an MFS-FET or the like.

In the case where the oxide material of the invention is utilized in a substrate or an element by using a thin film production technique, a thin film of the oxide material is generally formed on a substrate with or without an electroconductive film intervening therebetween. Examples of the substrate used herein include a semiconductor substrate, such as an element semiconductor, e.g., silicon and germanium, and a compound semiconductor, such as GaAs and ZnSe, a metallic substrate, such as Pt, and an insulating substrate, such as a sapphire substrate, an MgO substrate, $SrTiO_3$, $BaTiO_3$ and a glass substrate. Among these, a silicon substrate is preferred, and a silicon single crystal substrate is more preferred.

An electroconductive film that may be formed on the substrate is not particularly limited as far as it is an electroconductive material that is generally used as an electrode and wiring, and examples thereof include a single layer film or a multilayer film of a metal and an alloy, such as Pt, Ir, Au, Al and Ru, an oxide electroconductive material, such as $IrO_2$ and $RuO_2$, a nitride electroconductive material, such as TiN and TaN, and the like. The thickness of the electroconductive film may be, for example, about from 100 to 200 nm.

An intermediate layer, such as a dielectric layer and an adhesion layer, may be formed between the electroconductive film and the substrate. The dielectric layer may be formed, for example, with $SiO_2$, $Si_3N_4$ or the like. The material for the adhesion layer is not particularly limited as far as it can ensure the adhesion strength between the substrate and the electroconductive film or between the dielectric film and the electroconductive film, and examples thereof include a high melting point metal, such as tantalum and titanium. The intermediate layer can be formed by various methods, such as a thermal oxidation method, a CVD method, a sputtering method, a vapor deposition method and an MOCVD method.

While the oxide material of the invention is preferably formed by the sol-gel process, it may be formed by various methods, such as an MOCVD method, a laser abrasion method and a sputtering method.

INDUSTRIAL APPLICABILITY

According to the invention, because a solid solution of a solid acid catalytic substance and a perovskite or lamellar perovskite structure oxide material as a catalytically active substance is provided, the strongest covalency can be introduced into the perovskite or lamellar perovskite structure oxide material, and the reactivity in a process concerning ions, such as active hydrogen ($H^+$) and an applied electric field ($e^-$) can be prevented. According thereto, hydrogen deterioration of the perovskite or lamellar perovskite structure oxide material can be prevented, and the scattering in compositional distribution in the perovskite or lamellar perovskite structure oxide material can be prevented, whereby application to a memory element becomes possible.

The perovskite or lamellar perovskite structure oxide material can be effectively crystallized at a low temperature owing to the function of the solid catalytic substance. Furthermore, inconsistency of lattices of crystal grains can be suppressed by the formation of the solid solution, so as to obtain dense and smooth interface and surface morphology, and thus the characteristics of the perovskite or lamellar perovskite structure oxide material can be utilized as much as possible without any change thereof. In other words, in the case where the perovskite or lamellar perovskite structure oxide material film is utilized as an element, the leakage characteristics of the element can be improved to obtain good hysteresis. Moreover, good fatigue characteristics can also be obtained owing to the good crystallinity, the smooth film surface, and the good interface without hetero-phase.

In particular, the foregoing effect becomes conspicuous in the case where $Si^{4+}$, $Ge^{4+}$ or $Sn^{4+}$ is contained at the position of cations in the crystalline lattice or the oxygen octahedrons of the perovskite or lamellar perovskite structure oxide material.

According to the invention, furthermore, the gel solution for forming the catalyst and the gel solution for forming the perovskite or lamellar perovskite structure oxide material are used by mixing, whereby the perovskite or lamellar perovskite structure oxide material having the low temperature crystallization property, the smooth interface and film surface and the like as described in the foregoing can be conveniently and effectively produced.

The invention claimed is:

1. An oxide material having a perovskite structure comprising an oxide represented by a formula selected from the group consisting of $ABO_3$, $(Bi_2O_2)^{2+}(A_{m-1}B_mO_{3m+1})^{2-}$, wherein A represents one kind or two or more kinds of ions selected from the group consisting of $Li^+$, $Na^+$, $K^+$, $Pb^{2+}$, $Ca^{2+}$, $Sr^{2+}$, $Bi^{3+}$, $Y^{3+}$, $Mn^{3+}$ and $La^{3+}$, B represents one kind or two or more kinds of ions selected from the group consisting of $Ru_{3+}$, $Fe^{3+}$, $Ti^{4+}$, $Zr^{4+}$, $Cu^{4+}$, $Nb^{5+}$, $Ta^{5+}$, $V^{5+}$, $W^{6+}$ and $Mo^{6+}$, and m represents a natural number of 1 or more, $LnBa_2Cu_3O_7$, $Z_2Ba_2Ca_{n-1}Cu_nO_{2n+4}$ and $ZBa_2Ca_{n-1}Cu_nO_{2n+3}$, wherein Ln represents one kind or two or more kinds of ions selected from the group consisting of Y, La, Ce, Pr, Nd, Pm, Sm, Eu, Gd, Tb, Dy, Ho, Er, Tm, Yb and Lu, Z represents one kind or two or more kinds of ions selected from the group consisting of Bi, Tl and Hg, and n represents a natural number of from 1 to 5;

wherein the oxide material is partially substituted with a catalytic substance containing Si.

2. A material as claimed in claim 1, wherein $Si^{4+}$ is contained at the position of cation in the crystalline lattice constituting the perovskite or lamellar perovskite structure oxide.

3. A material as claimed in claim 2, wherein $Si^{4+}$ is contained at the center of oxygen octahedron constituting the perovskite or lamellar perovskite structure oxide.

4. A material as claimed in claim 1, wherein
the catalytic substance is a complex oxide materials comprising one or more kinds of oxides selected from the group consisting of CaO, PbO, ZnO, SrO, MgO, FeO, $Fe_2O_3$, $B_2O_3$, $Al_2O_3$, $In_2O_3$, $Y_2O_3$, $Sc_2O_3$, $Sb_2O_3$, $Cr_2O_3$, $Bi_2O_3$, $Ga_2O_3$, $CuO_2$, $MnO_2$, $ZrO_2TiO_2$, $MoO_3$, $WO_3$, $V_2O_5$, and a lanthanoid oxide, and $SiO_2$.

5. A material as claimed in claim 4, which is a complex oxide material represented by the formula $X_2SiO_5$ or $X_4Si_3O_{12}$ (wherein X represents $Ca^{2+}$, $Pb^{2+}$, $Zn^{2+}$, $Sr^{2+}$, $Mg^{2+}$, $Fe^{2+}$, $Fe^{3+}$, $B^{3+}$, $Al^{3+}$, $In^{3+}$, $Y^{3+}$, $Sc^{3+}$, $Sb^{3+}$, $Cr^{3+}$, $Bi^{3+}$, $Ga^{3+}$, $Cu^{4+}$, $Mn^{4+}$, $Zr^{4+}$, $Ti^{4+}$, $Mo^{6+}$, $V^{5+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, or $Lu^{3+}$).

6. An oxide forming mixed solution of an anhydrous mixture comprising (i) a polycondensation product for forming a perovskite or perovskite lamellar structure oxide material represented by a formula selected from the group consisting of $ABO_3$, $(Bi_2O_2)^{2+}(A_{m-1}B_mO_{3m+1})^{2-}$, wherein A represents one kind or two or more kinds of ions selected from the group consisting of $Li^+$, $Na^+$, $K^+$, $Pb^{2+}$, $Ca^{2+}$, $Sr^{2+}$, $Bi^{3+}$, $Y^{3+}$, $Mn^{3+}$ and $La^{3+}$, B represents one kind or two or more kinds of ions selected from the group consisting of $Ru^{3+}$, $Fe^{3+}$, $Ti^{4+}$, $Zr^{4+}$, $Cu^{4+}$, $Nb^{5+}$, $Ta^{5+}$, $V^{5+}$, $W^{6+}$ and $Mo^{6+}$, and m represents a natural number of 1 or more, $LnBa_2Cu_3O_7$, $Z_2Ba_2Ca_{n-1}Cu_nO_{2n+4}$ or $ZBa_2Ca_{n-1}Cu_nO_{2n+3}$, wherein Ln represents one kind or two or more kinds of ions selected from the group consisting of Y, La, Ce, Pr, Nd, Pm, Sm, Eu, Gd, Tb, Dy, Ho, Er, Tm, Yb and Lu, Z represents one kind or two or more kinds of ions selected from the group consisting of Bi, Tl and Hg, and n represents a natural number of from 1 to 5, and (ii) a catalytic complex oxide material of one or more kinds of oxides selected from the group consisting of CaO, PbO, ZnO, SrO, MgO, FeO, $Fe_2O_3$, $B_2O_3$, $Al_2O_3$, $In_2O_3$, $Y_2O_3$, $Sc_2O_3$, $Sb_2O_3$, $Cr_2O_3$, $Bi_2O_3$, $Ga_2O_3$, $CuO_2$, $MnO_2$, $ZrO_2$, $TiO_2$, $MoO_3$, $WO_3$, $V_2O_5$ and a lantanoid oxide; and (iii) $SiO_2$.

7. A solution as claimed in claim 6, wherein the complex oxide is an oxide represented by formula $X_2SiO_5$ or $X_4Si_3O_{12}$ (wherein X represents $Ca^{2+}$, $Pb^{2+}$, $Zn^{2+}$, $Sr^{2+}$, $Mg^{2+}$, $Fe^{2+}$, $Fe^{3+}$, $B^{3+}$, $Al^{3+}$, $In^{3+}$, $Y^{3+}$, $Sc^{3+}$, $Sb^{3+}$, $Cr^{3+}$, $Bi^{3+}$, $Ga^{3+}$, $Cu^{4+}$, $Mn^{4+}$, $Zr^{4+}$, $Ti^{4+}$, $Mo^{6+}$, $V^{5+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, or $Lu^{3+}$).

8. An oxide material film coated substrate in which an electroconductive material film and a film of an oxide material as claimed in any one of claims 1 to 5 thereon are formed on a substrate.

9. An element in which a lower electrode, a film of an oxide material as claimed in any one of claims 1 to 5 and an upper electrode in this order are formed on a substrate.

10. A semiconductor element in which a film of an oxide material film as claimed in any one of claims 1 to 5 and an electroconductive material film are formed on a semiconductor substrate, and further a pair of impurity diffusion layers are located on both sides of the preceding electroconductive material film and on the preceding semiconductor substrate surface.

* * * * *